United States Patent
Sato et al.

(10) Patent No.: US 8,144,482 B2
(45) Date of Patent: Mar. 27, 2012

(54) CIRCUIT BOARD DEVICE, WIRING BOARD INTERCONNECTION METHOD, AND CIRCUIT BOARD MODULE DEVICE

(75) Inventors: Junya Sato, Tokyo (JP); Toru Taura, Tokyo (JP); Nobuhiro Mikami, Tokyo (JP); Shinji Watanabe, Tokyo (JP); Atsumasa Sawada, Tokyo (JP); Nozomu Nishimura, Tokyo (JP)

(73) Assignee: NEC Corporation, Tokyo (JP)

( * ) Notice: Subject to any disclaimer, the term of this patent is extended or adjusted under 35 U.S.C. 154(b) by 684 days.

(21) Appl. No.: 12/227,803

(22) PCT Filed: May 14, 2007

(86) PCT No.: PCT/JP2007/059831
§ 371 (c)(1),
(2), (4) Date: Nov. 26, 2008

(87) PCT Pub. No.: WO2007/138843
PCT Pub. Date: Dec. 6, 2007

(65) Prior Publication Data
US 2009/0135573 A1    May 28, 2009

(30) Foreign Application Priority Data

May 31, 2006   (JP) ................. 2006-152881

(51) Int. Cl.
H05K 1/11 (2006.01)
H05K 1/14 (2006.01)
(52) U.S. Cl. .................. 361/794; 361/807; 361/810
(58) Field of Classification Search .......... 361/794, 361/803, 813, 807, 810, 720, 767, 777, 748, 361/760
See application file for complete search history.

(56) References Cited

U.S. PATENT DOCUMENTS 3,745,509 A    7/1973 Woodward et al.
4,130,334 A *  12/1978 Anderson .......... 439/472
(Continued)

FOREIGN PATENT DOCUMENTS
JP          47-29885         7/1972
(Continued)

OTHER PUBLICATIONS

PCT/IB/338.
(Continued)

*Primary Examiner* — Hung S Bui
(74) *Attorney, Agent, or Firm* — McGinn IP Law Group, PLLC

(57) ABSTRACT

A circuit board device includes: plurality of wiring boards (101 and 102) in which terminals are provided on the front and back surfaces and vias are provided for connecting the terminals together, an anisotropic conductive member (103) arranged between wiring boards (101 and 102) for connecting the electrodes of one wiring board to the electrodes of another wiring board, a functional block (104) composed of a metal material and arranged between the wiring boards (101 and 102) to enclose anisotropic conductive member (103), and a pair of holding blocks (105 and 106) composed of a metal material arranged to clamp the plurality of wiring boards (101 and 102), wherein the plurality of wiring boards (101 and 102), while in a state of being clamped between the pair of holding blocks (105 and 106), is connected together by the anisotropic conductive member (103) and the terminals provided on each of the wiring boards (101 and 102), the functional block (104), and the holding blocks (105 and 106) are electrically connected.

20 Claims, 32 Drawing Sheets

U.S. PATENT DOCUMENTS

| | | | |
|---|---|---|---|
| 5,219,293 A * | 6/1993 | Imamura | 439/67 |
| 5,334,029 A * | 8/1994 | Akkapeddi et al. | 439/66 |
| 6,183,272 B1 * | 2/2001 | Muller et al. | 439/91 |
| 6,786,762 B2 * | 9/2004 | Buck et al. | 439/493 |
| 7,223,105 B2 * | 5/2007 | Weiss et al. | 439/66 |

FOREIGN PATENT DOCUMENTS

| | | |
|---|---|---|
| JP | 2-312174 | 12/1990 |
| JP | 4-76281 | 7/1992 |
| JP | 3007244 | 11/1994 |
| JP | 8-307030 | 11/1996 |
| JP | 8-96870 | 12/1996 |
| JP | 11-40227 | 2/1999 |
| JP | 2001-244592 | 9/2001 |
| JP | 2002-33358 | 1/2002 |
| JP | 2002-289277 | 10/2002 |
| JP | 2005-347558 | 12/2005 |

OTHER PUBLICATIONS

PCT/IB/373.

PCT/ISA/237 (English Translation).

* cited by examiner

CIRCUIT BOARD DEVICE, WIRING BOARD INTERCONNECTION METHOD, AND CIRCUIT BOARD MODULE DEVICE

TECHNICAL FIELD

The present invention relates to a circuit board device that is installed in an electronic apparatus chiefly used in electrical/communication fields and that has a structure in which a plurality of wiring boards such as flexible printed wiring boards and rigid printed wiring boards to which printed wiring has been applied are stacked together, connected and secured, to a wiring board interconnection method for connecting together these wiring boards, and to a circuit board module device.

BACKGROUND ART

In many electronic apparatuses such as portable telephone devices, PDA (Personal Digital Assistant) terminals in recent years, a plurality of printed wiring boards to which printed wiring has been applied and a multiplicity of electronic parts have been packaged are installed in a limited space. A variety of techniques have been developed as methods of stacking, connecting together, and securing such a plurality of printed wiring boards to realize miniaturization of the printed wiring boards that accompanies slimmer and more space-saving designs of electronic apparatuses.

FIG. 1 is a sectional view giving a schematic representation of the connection structure of flexible wiring boards that is disclosed in Utility Model Registration No. 3007244. In the technique disclosed in this document, electrode 1503 of flexible wiring board 1502 and electrode 1505 of substrate 1504 are compressed and secured by positioning pin 1506 to establish an electrical connection by way of electrical connection member 1501 that has a positioning hole.

FIG. 2 is a sectional view giving a schematic representation of the connection structure of a printed board disclosed in JP-A-08-096870. In the technique disclosed in this document, first printed board 1604, second printed board 1605, and third printed board 1606 are stacked on first elastic member 1603 that is provided embedded in substrate 1601 while being positioned by means of guide posts 1602 provided on substrate 1601. Intermediate member 1607 is then secured to substrate 1601 from above these components by means of screws. Fourth printed board 1608, fifth printed board 1609, and sixth printed board 1610 are then stacked from above this intermediate member 1607 while being positioned by guideposts 1602. Elastic member 1611 is arranged from above these components at a point corresponding to the portions of these printed boards that have conductive patterns, and by securing substrate pressure plate 1612 from above this elastic member 1611 against intermediate member 1607 by means of screws, the impact resilience of elastic member 1603 and elastic member 1611 connects first printed board 1604, second printed board 1605, and third printed board 1606 by the contact between the conductive patterns, and similarly, the impact resilience of elastic member 1603 and elastic member 1611 connects fourth printed board 1608, fifth printed board 1609, and sixth printed board 1610 by the contact between the conductive patterns.

FIG. 3 is a sectional view giving a schematic representation of the connection structure of printed boards disclosed in JP-A-08-307030. In the technique disclosed in this document, single-sided flexible printed circuit (FPC) 1701 having conductors 1702 formed on its front surface is mounted on substrate base board 1705 that is a rigid body, and double-sided FPC 1703 having conductors 1704 formed on its back surface and conductors 1709 formed on its front surface is then stacked on top. Anisotropic conductive rubber sheet 1706, which is an elastic member, is then arranged from above these components at a point that corresponds to the portions of these printed substrates that have conductive patterns. Single-sided hard substrate (Printed Wiring Board: PWB) 1707, which is a rigid body having conductors 1710 formed on its back surface, is stacked over these components. Clamping down from this single-sided PWB 1707 to substrate base board 1705 by screws 1708 applies a uniform pressure over the surfaces of these wiring boards to perform pressure-welding and sufficiently compress anisotropic conductive rubber sheet 1706 to produce conductivity. In this way, conductors 1702 formed on the surface of single-sided FPC 1701 and conductors 1704 formed on the back surface of double-sided FPC 1703 are placed in electrical contact, and moreover, conductors 1709 formed on the surface of double-sided FPC 1703 and conductors 1710 formed on the back surface of single-sided PWB 1707 are placed in electrical contact.

FIG. 4 is an exploded perspective view giving a schematic representation of the pressure-welding method of flexible circuit boards disclosed in JP-A-2001-244592. In the technique disclosed in this publication, mount 1801 is provided on a main base, protrusion 1801a being provided in the center of mount 1801. Pressure-welding rubber 1802 is inserted in this protrusion 1801a, and flexible circuit boards 1803, 1804, and 1805 as well as tab 1806 provided on flexible circuit board 1803 are stacked and positioned on the main base by way of pins 1807a and 1807b formed on mount 1801. Pressure-welding bracket 1808 on which a protrusion is formed is attached by means of screws 1809 such that the protrusion confronts pressure-welding rubber 1802, whereby the pressure between the elastic force of elastically deformed pressure-welding rubber 1802 and the protrusion of pressure-welding bracket 1808 causes contact and an electrically connected state between each of the contact patterns formed on stacked flexible circuit boards 1803, 1804, and 1805 as well as tab 1806.

However, none of the techniques of the related art described hereinabove offers countermeasures for the electromagnetic interference (EMI) of unnecessary electromagnetic waves generated in electrical connections upon other apparatuses or for the electromagnetic susceptibility (EMS) to noise that intrudes from the outside upon the electrical connections. Many electronic apparatuses such as portable telephone devices and PDA terminals are now processing large volumes of data at higher speeds and the signals for dealing with these data are on a trend to higher frequencies, and countermeasures for EMI and EMS can no longer be ignored.

As an example, a wafer in-batch contact board that is more resistant to noise for high frequency and that improves the high-frequency characteristic is proposed in JP-A-2002-033358. FIG. 5 is a sectional view giving a schematic representation of the wafer in-batch contact board disclosed in this publication. In the technique disclosed in this publication, the portions of anisotropic conductive rubber 1921c1 and 1921b1 that correspond to GND pad 1912c and signal pad 1912b on wiring board 1910 are insulated from frame 1922 by forming portions 1921c2 and 1921b2 in which conductive particles are pulled toward the center by a magnetic field. By not applying a magnetic field, the portion of anisotropic conductive rubber 1921a that corresponds to power-supply pad 1912a is connected to frame 1922, and connecting frame 1922 with power-supply wiring (not shown) in wiring board 1910 by way of power-supply pad 1912a reduces noise for high-frequencies and further improves the high-frequency characteristic.

An anisotropic conductive connector that can eliminate the adverse influence of static electricity and a product that applies this connector are proposed in JP-A-2002-289277. FIG. 6 is a sectional view giving a schematic representation of the anisotropic conductive connector disclosed in this publication. The anisotropic conductive connector shown in FIG. 6 is a component for, regarding a wafer on which a plurality of integrated circuits is formed, carrying out an electrical inspection of each of the integrated circuits while in the wafer state, and includes frame plate 2010 in which is formed a plurality of through-holes 2011 that each penetrate frame plate 2010 in the direction of thickness. Through-holes 2011 are formed that correspond to the pattern of electrode areas in which electrodes to be inspected are formed in integrated circuits on the wafer that is the object of inspection. Elastic anisotropic conductive film 2020 having conductivity in the direction of thickness is arranged in each through-hole 2011 of frame plate 2010 in a state of being supported by the peripheries of through-holes 2011 of frame plate 2010. The points of these through-holes 2011 in frame plate 2010 that are supported by the peripheries of through-holes 2011 are connected to ground by the formation of antistatic conductors 2026 that show conductivity in the direction of thickness by way of frame plate 2010. The adverse effects of static electricity are thus eliminated when carrying out an electrical inspection of a wafer on which integrated circuits are formed.

DISCLOSURE OF THE INVENTION

However, the above-described related art has the following problems. The technique disclosed in JP-A-2002-033358 improves the high-frequency characteristic by connecting the frame that is provided around the anisotropic conductive rubber to the power supply or GND of the wiring board in a wafer in-batch contact board. The technique disclosed in JP-A-2002-289277 eliminates the adverse effects of static electricity by connecting substrate to substrate by an anisotropic conductive member having a frame plate in the outer periphery and connecting the frame to ground. However, in these constructions, electrical open spaces are present in the electrical connections, and because the circumference of these open spaces is infinite, the effects of the shielding of high-frequency noise and reduction of high-frequency noise are reduced.

In addition, recent years have seen LSI (Large-Scale Integration) in which CPU (Central Processing Units), high-speed clock CMOS (Complementary Metal Oxide Semiconductors), and PA (Power Amplifiers) that require large currents are mounted on the wiring boards of portable telephone devices, PDA terminals and other electronic apparatuses. Nevertheless, no countermeasures have been implemented for the heat generation of the electrical connections resulting from such LSI having high current consumption in the methods for stacking, connecting together and securing a plurality of printed wiring boards disclosed in the related art. Normally, when electrically connecting wiring boards on which LSI having large current consumption is mounted, the generation of heat of the electrical connections is controlled by distributing the wiring of the power-supply system among several lines to reduce the amount of current per connection terminal, and this approach can also be applied to the constructions disclosed in the related art. However, in such cases, realizing miniaturization that accompanies a slimmer and more space-saving electronic apparatus becomes problematic.

It is an object of the present invention: to provide a circuit board device having a construction capable of both realizing a smaller circuit board device and further, realizing electromagnetic shielding in electrical connections that connect wiring boards together by an anisotropic conductive member and suppressing heat generation in the electrical connections, and further, to provide a wiring board interconnection method and a circuit board module device.

The circuit board device according to the present invention includes: a plurality of wiring boards in which terminals are provided on the front and back surfaces and vias are provided for connecting the terminals together; an anisotropic conductive member arranged between wiring boards for connecting electrodes of one wiring board to electrodes of another wiring board; a functional block composed of a metal material arranged between the wiring boards to enclose the anisotropic conductive member; and a pair of holding blocks composed of metal material arranged to sandwich the plurality of wiring boards; wherein the plurality of wiring boards are connected to each other by means of the anisotropic conductive member when in a state clamped between the pair of holding blocks, and the terminals provided on each of the wiring boards, the functional blocks, and the holding blocks are electrically connected.

The functional block and the holding blocks are connected to GND and can be made the common GND wiring of the plurality of wiring boards.

The functional block composed of a metal material is arranged to enclose the electrical connections in which the electrodes of wiring boards are connected together by an anisotropic conductive member, and as a result, these electrical connections are completely shielded from electromagnetic waves in directions parallel to the front and back surfaces of the wiring boards. This configuration can suppress the occurrence of electromagnetic wave interference that is applied to other apparatuses by unnecessary electromagnetic waves that are typically generated and can improve the electromagnetic susceptibility to noise that intrudes from the outside in these electrical connections. In addition, the arrangement of a pair of holding blocks composed of metal material on the outermost surface of the circuit board device and the electrical connection of the plurality of wiring boards, functional blocks, and holding blocks enable complete shielding against electromagnetic waves in directions perpendicular to the front and back surfaces of the wiring boards.

The functional blocks and the holding blocks are connected to the power supply and can serve as the power-supply wiring of the plurality of wiring boards.

As the power-supply wiring, the functional block and holding blocks have an extremely large cross-sectional area, and the amount of current per unit of cross-sectional area of the power-supply lines can therefore be decreased. As a result, the generation of heat of electrical connections can be suppressed, and in addition, the need to distribute power-supply lines among a plurality of lines to reduce the amount of current per connection terminal can be eliminated, thus enabling the miniaturization that accompanies a slimmer and more compact electronic apparatus.

The functional block can be divided between one or a plurality of first blocks and one or a plurality of second blocks, the first block being connected to GND and serving as the common GND wiring of the plurality of wiring boards, and the second block being connected to the power supply and serving as the power-supply wiring of the plurality of wiring boards.

Alternatively, the functional block can be divided between one or a plurality of first blocks and one or a plurality of second blocks, the first block being connected to GND and serving as an analog-system common GND wiring of the plurality of wiring boards, and the second block similarly being connected to GND and serving as a digital-system common GND wiring of the plurality of wiring boards.

The first and second blocks of the functional block may be isolated and separated by an insulating resin.

A plurality of the terminals and the vias is preferably provided.

A conductive material selected from the group composed of: a conductive paste in which metal particles or metal-plated particles obtained by subjecting resin particles to metal plating are scattered in a resin, tin-lead solder, lead-free solder, ACF (Anisotropic Conductive Film), and ACP (Anisotropic Conductive Paste) is provided on at least the surfaces of the terminals.

The plurality of wiring boards is preferably selected from the group composed of: multilayered flexible printed wiring boards, multilayered rigid printed wiring boards, double-sided flexible printed wiring boards, double-sided rigid printed wiring boards, single-sided flexible printed wiring boards, and single-sided rigid printed wiring boards.

Regarding the anisotropic conductive member, the conductive material is preferably metal fine lines selected from the group composed of gold lines, copper lines, brass lines, phosphor bronze lines, nickel lines and stainless steel lines or conductive particles selected from the group composed of metal particles, gold-plated particles, silver-plated particles, and copper-plated particles, and the insulating portion is preferably composed of an insulating elastic resin material.

The circuit board module device according to the present invention is a device in which at least one package part is mounted on a wiring board of the above-described circuit board device.

In the wiring board interconnection method according to the present invention, a first wiring board on which terminals are provided on the front and back surfaces and vias are provided for connecting the terminals together is arranged on a first holding block composed of a metal material; an anisotropic conductive member and a functional block composed of a metal material are arranged on the first wiring board; a second wiring board on which terminals are provided on the front and back surfaces and vias are provided for connecting the terminals together is arranged on the anisotropic conductive member and the functional block; any number of wiring boards with anisotropic conductive members and functional blocks interposed are similarly arranged; a second holding block is arranged on the uppermost wiring board; and the plurality of wiring board, anisotropic conductive members, and functional blocks is clamped between the first holding block and the second holding block; whereby the plurality of wiring boards are connected to each other and the terminals provided on each of the wiring boards, the functional blocks, and the holding blocks are electrically connected.

According to the present invention, when functional blocks and holding blocks are taken as the common GND of a circuit board device, a plurality of wiring boards are stacked and functional blocks composed of metal material are arranged to enclose electrical connections in which the wiring boards are interconnected by anisotropic conductive members, whereby complete shielding against electromagnetic waves is realized in directions parallel to the front and back surfaces of the wiring boards. This configuration can therefore suppress the occurrence of electromagnetic interference exerted upon other apparatuses by unnecessary electromagnetic waves that are typically generated and can improve electromagnetic susceptibility to noise that intrudes from the outside in the electrical connections. This configuration can also realize complete shielding against electromagnetic waves in directions perpendicular to the front and back surfaces of the wiring boards because a pair of holding blocks composed of a metal material are arranged on the outermost surfaces of the circuit board device, and the terminals that are provided on each wiring board, functional blocks, and holding blocks are electrically connected.

Still further, when the functional blocks and holding blocks are made the power-supply wiring of a plurality of wiring boards as in the scope 4 of the claims, the cross-sectional area of the power-supply wiring is extremely large and the amount of current per unit of cross-sectional area can therefore be decreased. As a result, heat generation of electrical connections can be suppressed, and the need to distribute the power-supply line among a plurality of lines to decrease the amount of current per connection terminal can be eliminated. This enables the miniaturization that accompanies a slimmer and more compact electronic apparatus.

Finally, in the circuit board device according to the present invention, the front and back surfaces of wiring boards contact functional blocks or holding blocks due to the compression and securing in a state of being sandwiched between a pair of holding blocks, whereby the distance between functional block and functional block or the distance between functional block and holding block can be made a minimum, i.e., can be made the thickness of the wiring boards. When pluralities of terminals and vias are provided as in scope 7 of the claims, minimizing the circumference of non-conductive portions that are enclosed by conductors can suppress the occurrence of electromagnetic wave interference that is applied to other apparatuses by unnecessary electromagnetic waves that are typically generated even when a higher-frequency signal is applied, and can improve electromagnetic susceptibility in electrical connections to noise that intrudes from the outside.

BEST MODE FOR CARRYING OUT THE INVENTION

The present application claims the priority based on Japanese Application JP-A-2006-152881, for which application was submitted on May 31, 2006, and incorporates all of the disclosures of that application.

Figure 1:
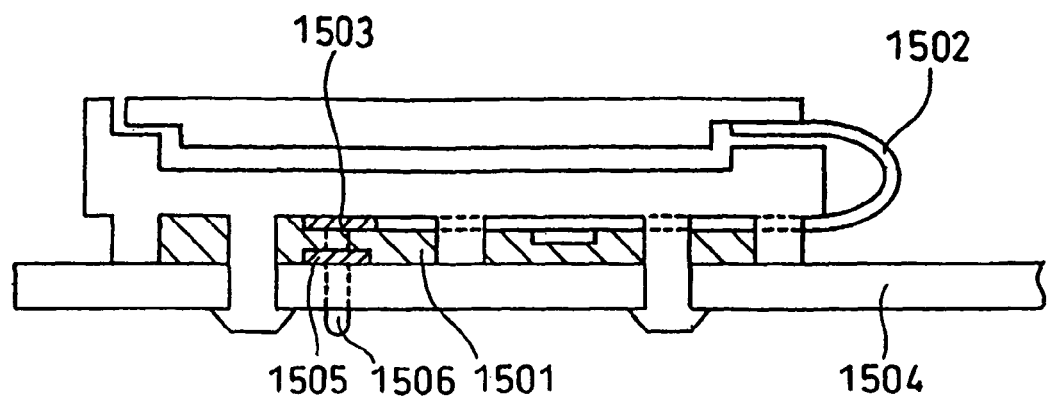
FIG. 1 is a schematic sectional view showing the connection structure of flexible wiring boards of the related art.
Figure 2:
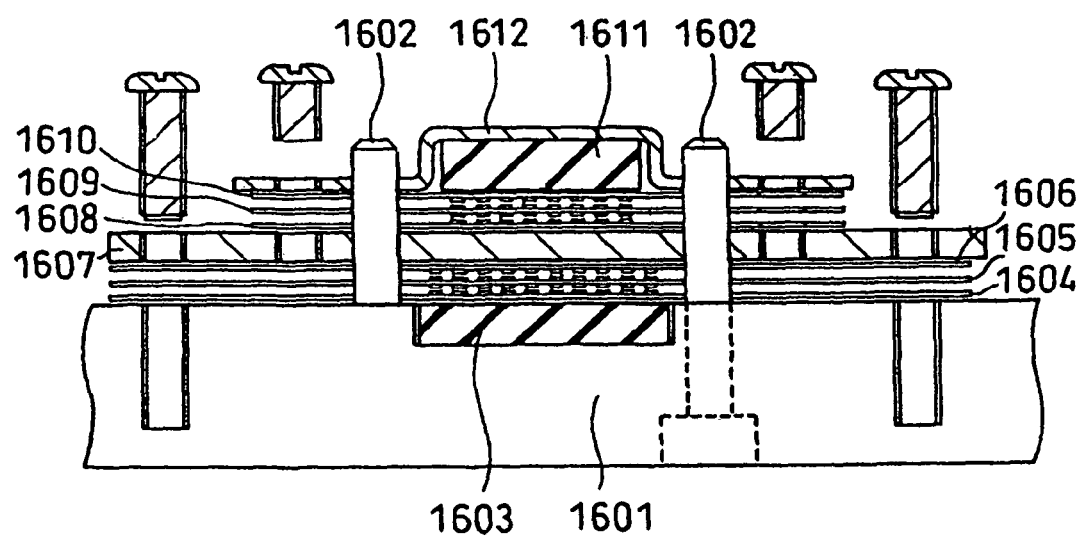
FIG. 2 is a schematic sectional view showing the connection structure of printed boards of the related art.
Figure 3:
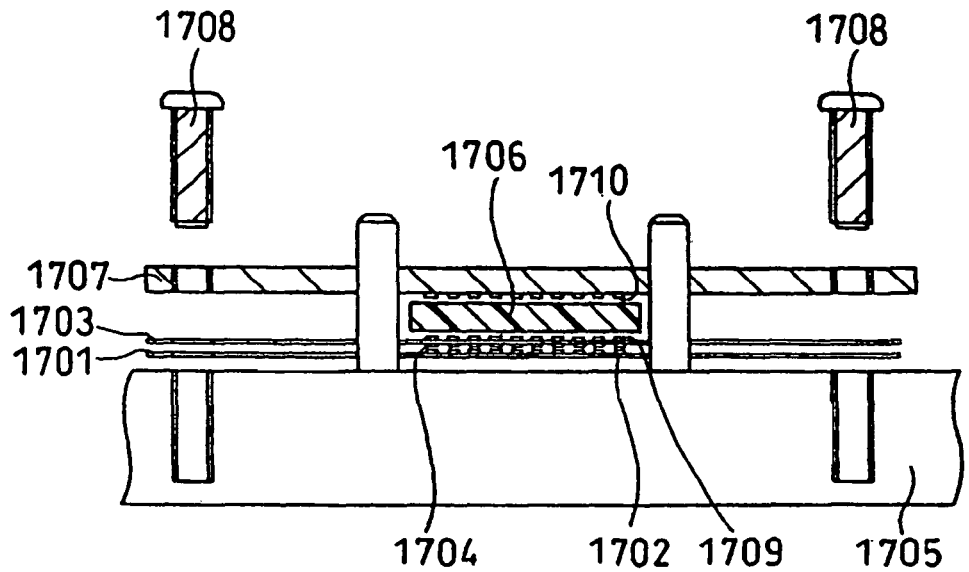
FIG. 3 is a schematic sectional view showing the connection structure of printed boards of the related art.
Figure 4:
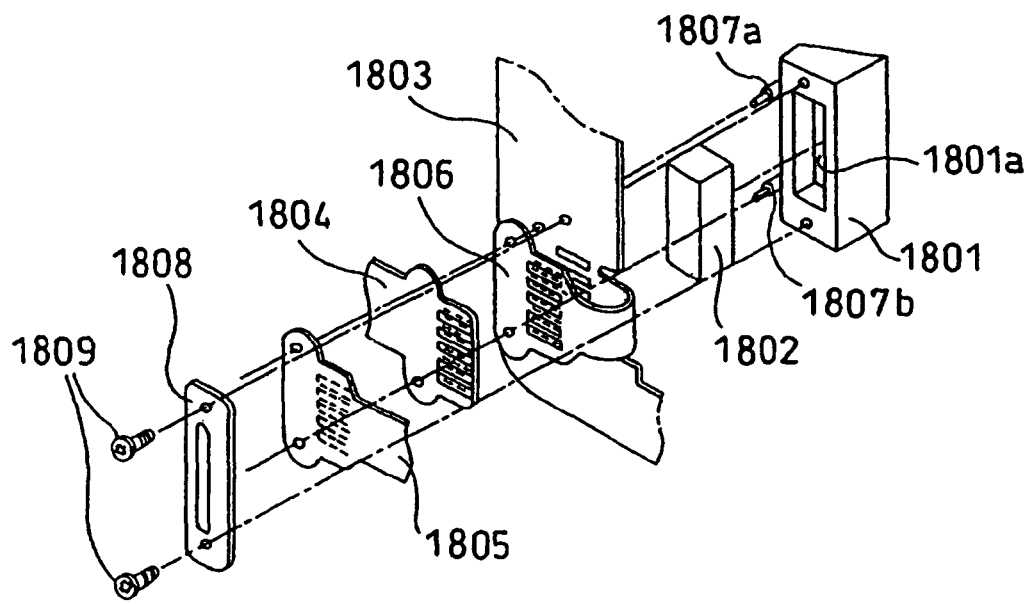
FIG. 4 is a schematic exploded perspective view showing the pressure-welding method of flexible circuit boards of the related art.
Figure 5:
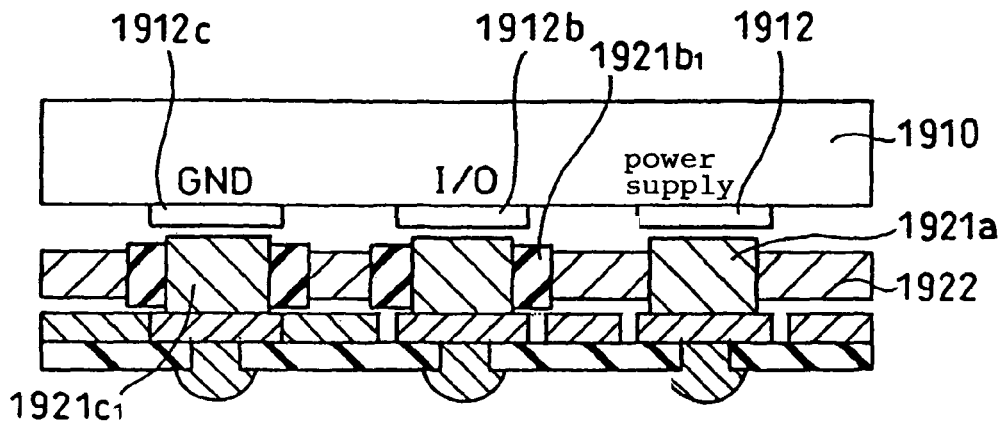
FIG. 5 is a schematic sectional view showing the wafer in-batch contact board of the related art.
Figure 6:
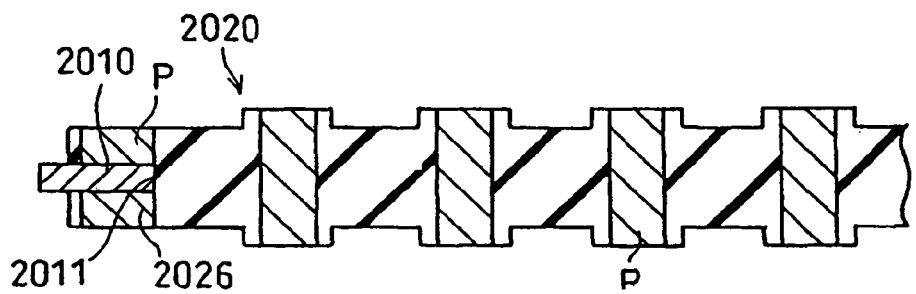
FIG. 6 is a schematic sectional view showing an anisotropic conductive connector of the related art.
Figure 7A:
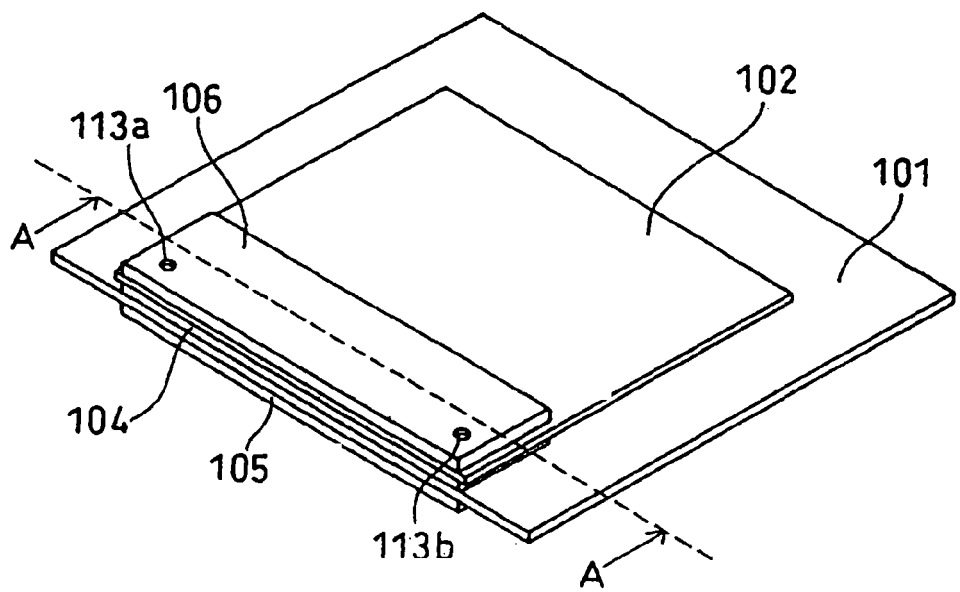
FIG. 7A is a schematic perspective view showing the circuit board device according to the first embodiment.
Figure 7B:
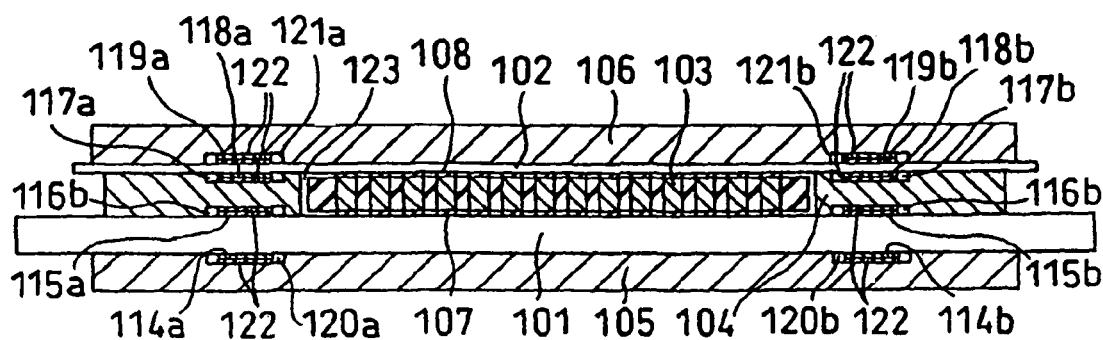
FIG. 7B is a sectional view taken at line A-A in FIG. 7A.
Figure 8:
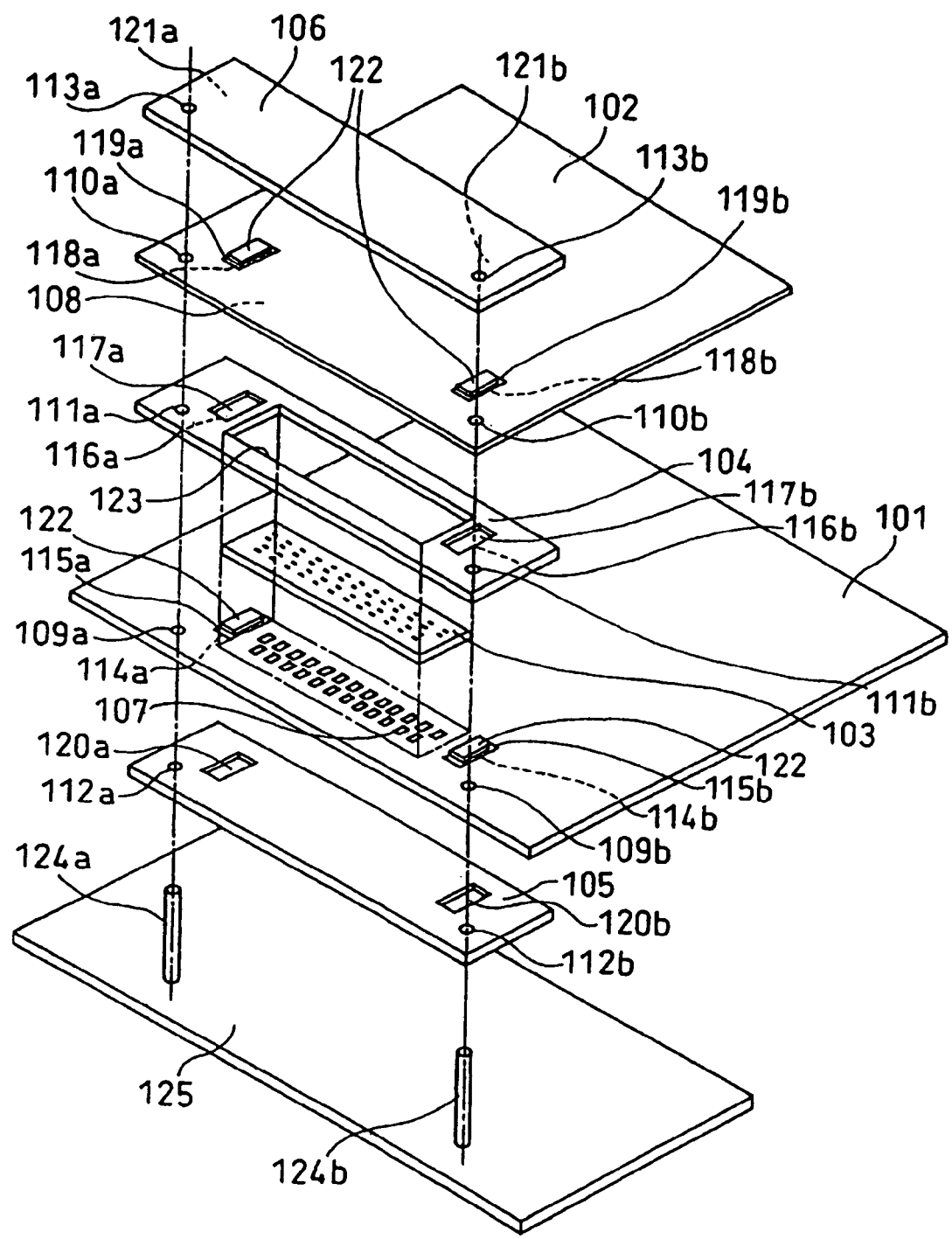
FIG. 8 is an exploded perspective view showing the configuration of the circuit board device and the wiring board interconnection method according to the first embodiment.
Figure 9:
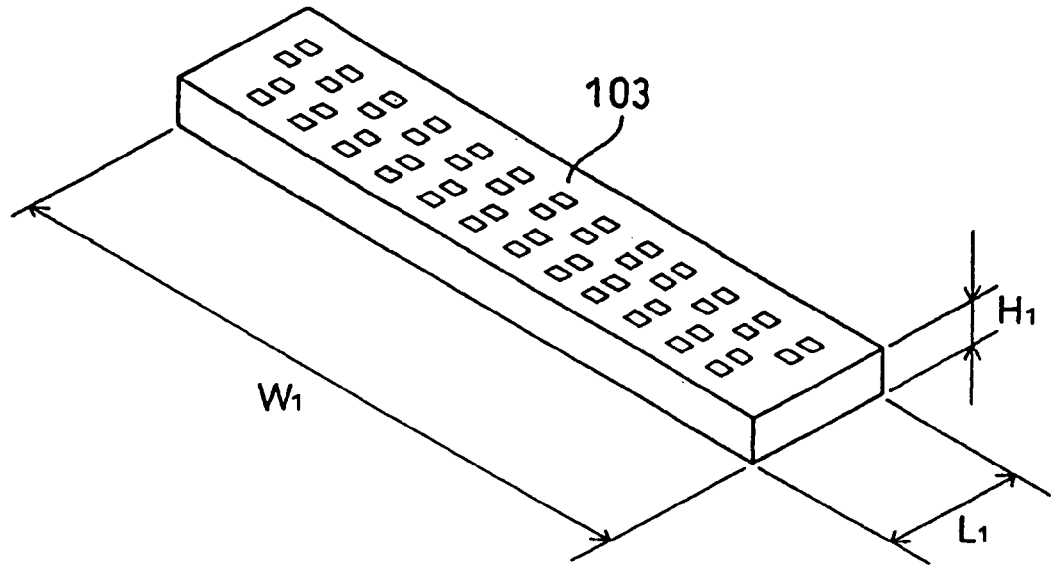
FIG. 9 is a schematic perspective view showing anisotropic conductive member 103.
Figure 10:
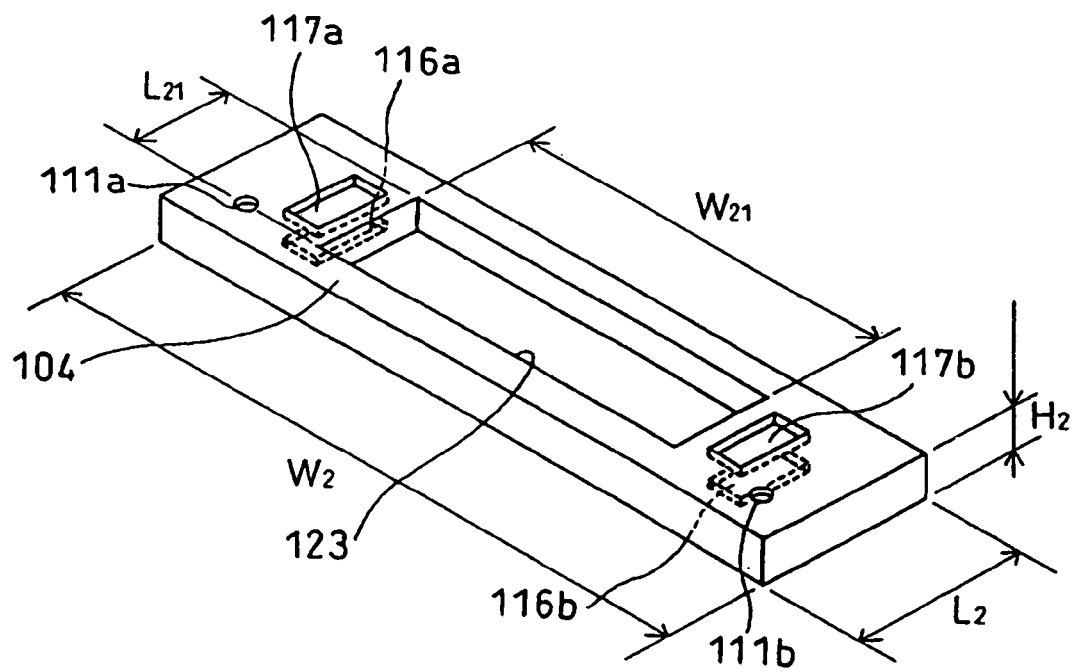
FIG. 10 is a schematic perspective view showing functional block 104.
Figure 11A:
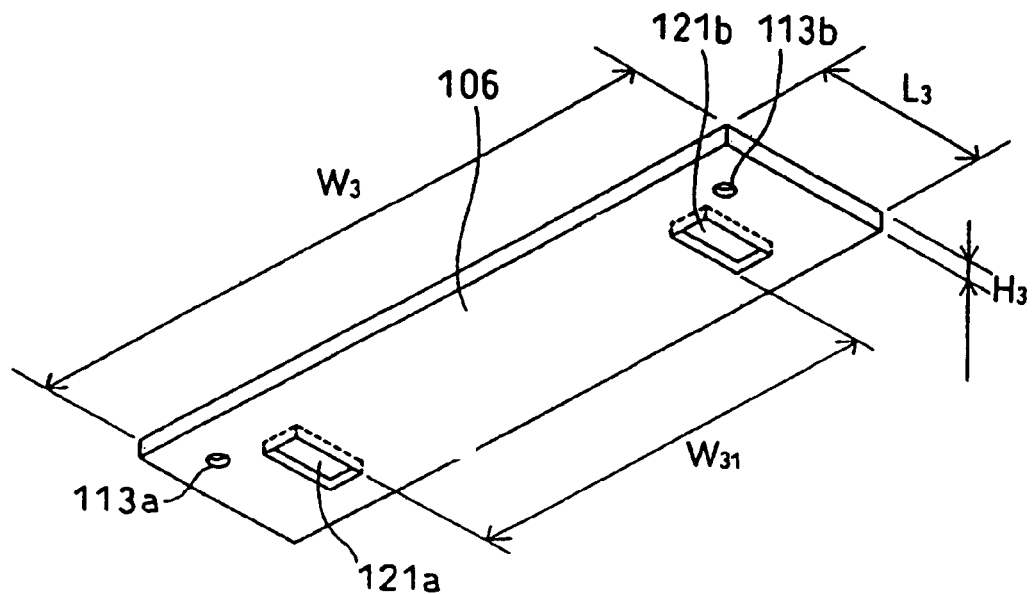
FIG. 11A is a schematic perspective view showing holding block 106.
Figure 11B:
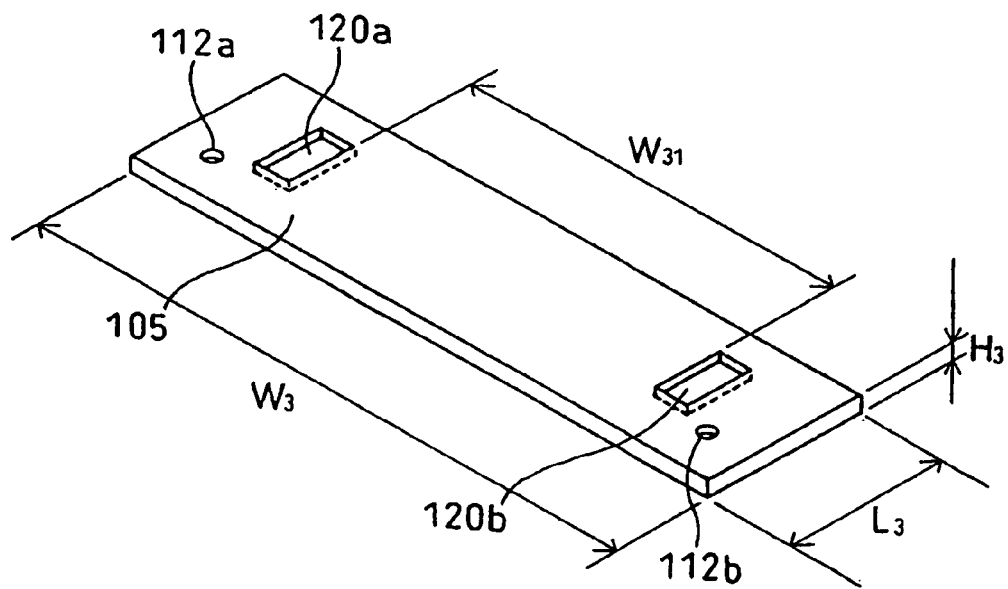
FIG. 11B is a schematic perspective view showing holding block 105.

A concrete explanation is next presented regarding embodiments of the present invention with reference to the accompanying drawings. Explanation first regards the first embodiment of the present invention. FIG. 7A is a schematic perspective view showing the circuit board device according to the present embodiment, and FIG. 7B is a sectional view taken along line A-A in FIG. 7A. FIG. 8 is an exploded perspective view showing the configuration of the circuit board device and wiring board interconnection method according to the present embodiment, FIG. 9 is a schematic perspective view showing anisotropic conductive member 103, and FIG. 10 is a schematic perspective view showing functional block 104. FIG. 11A is a schematic perspective view showing holding block 106, and FIG. 11B is a schematic perspective view showing holding block 105.

In the circuit board device according to the present embodiment, first wiring board 101 having electrode terminals 107 for signal connection provided as electrodes on its front surface and second wiring board 102 having electrode terminals 108 for signal connection provided as electrodes on its back surface are stacked between holding block 105 and holding block 106 with functional block 104 in which anisotropic conductive member 103 is inserted interposed between the wiring boards.

Positioning through-holes 109a and 109b are provided on first wiring board 101. Common GND terminals 115a and 115b are provided on the same surface as electrode terminals 107 for signal connection that are provided on the front surface of first wiring board 101. Conductive material 122 is applied to the surface of these common GND terminals 115a and 115b to form the terminals. In addition, common GND terminals 114a and 114b are provided at positions corresponding to common GND terminals 115a and 115b on the back surface of first wiring board 101. Conductive material 122 is applied to the surfaces of these common GND terminals 114a and 114b to form the terminals. Common GND terminals 115a and 114a are then electrically connected by a via (not shown), and similarly, common GND terminals 115b and 114b are electrically connected by a via (not shown).

Positioning through-holes 110a and 110b are provided in second wiring board 102. Common GND terminals 119a and 119b are provided on the front surface of second wiring board 101. Conductive material 122 is applied to the surfaces of these common GND terminals 119a and 119b to form the terminals. In addition, electrode terminals 108 for signal connection are provided on the back surface of second wiring board 102 with a one-to-one correspondence to electrode terminals 107 for signal connection of first wiring board 101. Common GND terminals 118a and 118b are provided at positions corresponding to common GND terminals 119a and 119b on the same surface as these electrode terminals 108. Conductive material 122 is applied to the surfaces of these common GND terminals 118a and 118b to form terminals. Common GND terminals 118a and 119a are then electrically connected by a via (not shown), and common GND terminals 118b and 119b are similarly connected electrically by a via (not shown).

Holding block 105 employs a metal material as its base material and is provided with positioning through-holes 112a and 112b as shown in FIG. 11B. Connection cavities 120a and 120b are provided at positions on the front surface of holding block 105 that correspond to common GND terminals 114a and 114b provided on first wiring board 101.

Holding block 106 employs a metal material as its base material and is provided with positioning through-holes 113a and 113b as shown in FIG. 11A. Connection cavities 121a and 121b are provided at positions on the back surface of holding block 106 that correspond to common GND terminals 119a and 119b provided on second wiring board 102.

Anisotropic conductive member 103 that is arranged between first wiring board 101 and second wiring board 102 takes an insulating elastic resin material as its base material, and metal fine lines are embedded in a direction perpendicular to the front and back surfaces of each wiring board at positions corresponding to each of electrode terminals 107 provided on the front surface of first wiring board 101 and electrode terminals 108 provided on the back surface of second wiring board 102.

Functional block 104 takes a metal material having high conductivity as its base material, and as shown in FIG. 10, is provided with positioning through-holes 111a and 111b. Connection cavities 116a and 116b are provided on the back surface of functional block 104 at positions corresponding to common GND terminals 115a and 115b provided on first wiring board 101. Connection cavities 117a and 117b are provided on the front surface of functional block 104 at positions corresponding to common GND terminals 118a and 118b provided on second wiring board 101. Functional block 104 has a frame shape provided with through-window 123 as an opening into which anisotropic conductive member 103 is inserted.

Taking into consideration the amount of spreading plus a degree of margin at the surfaces at which anisotropic conductive member 103 contacts each wiring board when anisotropic conductive member 103 is compressed to the thickness of functional block 104, this through-window 123 is formed larger than the outer form of anisotropic conductive member 103. In addition, the thickness of anisotropic conductive member 103 is made greater than the thickness of functional block 104.

First wiring board 101 is arranged on holding block 105, and functional block 104 with anisotropic conductive member 103 inserted in through-window 123 is arranged on this first wiring board 101. Second wiring board 102 is then arranged on this functional block 104, and further, holding block 106 is arranged on this second wiring board 102. These components are then subjected to pressure by means of a clamping jig (not shown) that compresses anisotropic conductive member 103 to the thickness of functional block 104.

At this time, electrode terminals 107 provided on the front surface of first wiring board 101 correspond one-to-one with electrode terminals 108 provided on the back surface of second wiring board 102 that is stacked on first wiring board 101 with functional block 104, in which anisotropic conductive member 103 is inserted in through-window 123, interposed. Anisotropic conductive member 103 is compressed to the thickness of functional block 104, whereby electrode terminals 107 provided on the front surface of first wiring board 101 and electrode terminals 108 provided on the back surface of second wiring board 102 are electrically connected by the conductors of anisotropic conductive member 103.

At this same time, common GND terminals 114a and 114b that are provided on the back surface of first wiring board 101 and that have conductive material 122 applied to their surfaces contact connection cavities 120a and 120b provided on the front surface of holding block 105 that takes a metal material as its base material. These common GND terminals 114a and 114b and common GND terminals 115a and 115b that are provided on the front surface of first wiring board 101 and that have conductive material 122 applied to their surfaces are each electrically connected by vias (not shown). Common GND terminals 115a and 115b that are provided on the front surface of first wiring board 101 and that have conductive material 122 applied to their surfaces then contact connection cavities 116a and 116b provided on the back surface of functional block 104 that takes a metal material having high conductivity as its base material.

Common GND terminals 118a and 118b that are provided on the back surface of second wiring board 102 and that have conductive material 122 applied to their surfaces further contact connection cavities 117a and 117b provided on the front surface of functional block 104 that has high conductivity. These common GND terminals 118a and 118b and common GND terminals 119a and 119b that are provided on the front surface of second wiring board 102 and that have conductive material 122 applied to their surfaces are each electrically connected by vias (not shown). Common GND terminals 119a and 119b that are provided on the front surface of second wiring board 102 and that have conductive material 122 applied to their surfaces then contact connection cavities 121a and 121b that are provided on the back surface of holding block 106 that takes a metal material as its base material. The circuit board device according to present embodiment is thus configured.

Explanation next regards the wiring board interconnection method of a circuit board device according to the present embodiment. As shown in FIG. 8, positioning through-holes 112a and 112b provided in holding block 105 fit onto positioning pins 124a and 124b provided in positioning jig 125. Positioning through-holes 109a and 109b provided in first wiring board 101 are then fitted over these positioning pins 124a and 124b. Positioning through-holes 111a and 111b provided in functional block 104 are further fitted over these positioning pins 124a and 124b. Anisotropic conductive member 103 is inserted into through-window 123 formed in this functional block 104. Metal fine lines are embedded in this anisotropic conductive member 103 in a direction perpendicular to the surface of first wiring board 101 at positions that correspond to electrode terminals 107 provided in the front surface of first wiring board 101.

Positioning through-holes 110a and 110b provided in second wiring board 102 are next fitted over positioning pins 124a and 124b from above functional block 104. Electrode terminals 108 that are provided in the back surface of second wiring board 102 have a one-to-one correspondence to electrode terminals 107 of first wiring board 101. Accordingly, the metal fine lines embedded in anisotropic conductive member 103 that is arranged between first wiring board 101 and second wiring board 102 are embedded in a direction that is also perpendicular to the surface of second wiring board 102 and have a one-to-one correspondence to electrode terminals 108 of second wiring board 102.

Positioning through-holes 113a and 113b provided in holding block 106 are further fitted over positioning pins 124a and 124b. At this time, positioning through-holes 112a and 112b provided in holding block 105, positioning through-holes 109a and 109b provided in first wiring board 101, positioning through-holes 111a and 111b provided in functional block 104, positioning through-holes 110a and 110b provided in second wiring board 102, and positioning through-holes 113a and 113b provided in holding block 106 are each fitted over positioning pins 124a and 124b provided in positioning jig 125 to accurately position each component.

In this state, pressure is applied between holding block 106 and holding block 105 by means of, for example, a clamping jig (not shown), and anisotropic conductive member 103 arranged between first wiring board 101 and second wiring board 102 is compressed to the thickness of functional block 104 and held in this state. In this way, electrode terminals 107 provided on the front surface of first wiring board 101 and electrode terminals 108 provided on the back surface of second wiring board 102 are electrically connected at anisotropic conductive member 103 by the conductors of anisotropic conductive member 103. At this time, anisotropic conductive member 103 spreads in through-window 123 such that the area of the surface of contact with each wiring board increases, whereby excessive impact resilience applied by anisotropic conductive member 103 in the direction of compression can be prevented.

In addition, common GND terminals 114a and 114b that are provided on the back surface of first wiring board 101 and that have conductive material 122 applied to their surfaces contact connection cavities 120a and 120b provided on the front surface of holding block 105 that takes a metal material as its base material. These common GND terminals 114a and 114b and common GND terminals 115a and 115b that are provided on the front surface of first wiring board 101 and that have conductive material 122 applied to their surfaces are each electrically connected by vias (not shown). Common GND terminals 115a and 115b that are provided in the front surface of first wiring board 101 and that have conductive material 122 applied to their surfaces contact connection cavities 116a and 116b that are provided in the back surface of functional block 104 that takes a metal material having a high conductivity as its base material.

Common GND terminals 118a and 118b that are provided on the back surface of second wiring board 102 and that have conductive material 122 applied to their surfaces further contact connection cavities 117a and 117b that are provided in the front surface of functional block 104 that has high conductivity. These common GND terminals 118a and 118b and common GND terminals 119a and 119b that are provided in the front surface of second wiring board 102 and that have conductive material 122 applied to their surfaces are each electrically connected by vias (not shown). Common GND terminals 119a and 119b that are provided in the front surface of second wiring board 102 and that have conductive material 122 applied to their surfaces then contact connection cavities 121a and 121b that are provided in the back surface of holding block 106 that takes a metal material as its base material. In this way, the circuit board device, according to the present embodiment is constructed.

Explanation next regards the operations of the circuit board device according to the present embodiment that is constructed as described hereinabove. In the circuit board device according to the present embodiment, first wiring board 101 in which electrode terminals 107 for signal connection are provided on the front surface and second wiring board 102 in which electrode terminals 108 for signal connection are provided on the back surface are stacked between holding block 105 and holding block 106 with functional block 104, into which anisotropic conductive member 103 is inserted, interposed between the wiring boards. First wiring board 101 is arranged on holding block 105, and functional block 104 with anisotropic conductive member 103 inserted into through-window 123 is arranged over first wiring board 101. Second wiring board 102 is arranged over these components, and holding block 106 is further arranged from above. Holding block 105 and holding block 106 are then clamped by a clamping jig (not shown) to apply pressure that compresses anisotropic conductive member 103 to the thickness of functional block 104 and hold the components in this state.

At this time, electrode terminals 107 that are provided on the front surface of first wiring board 101 correspond one-to-one with electrode terminals 108 that are provided on the back surface of second wiring board 102 that is stacked on first wiring board 101 with functional block 104 in which anisotropic conductive member 103 is inserted into through-window 123 interposed. By compressing anisotropic conductive member 103 to the thickness of functional block 104, electrode terminals 107 provided on the front surface of first wiring board 101 and electrode terminals 108 provided on the back surface of second wiring board 102 are electrically connected by the conductors of anisotropic conductive member 103.

At this same time, common GND terminals 114a and 114b that are provided on the back surface of first wiring board 101 and that have conductive material 122 applied to their surfaces contact connection cavities 120a and 120b that are provided on the front surface of holding block 105 that takes a metal material as its base material. These common GND terminals 114a and 114b and common GND terminals 115a and 115b that are provided in the front surface of first wiring board 101 and that have conductive material 122 applied to their surfaces are each electrically connected by vias (not shown). Common GND terminals 115a and 115b that are provided on the front surface of first wiring board 101 and that have conductive material 122 applied to their surfaces then contact connection cavities 116a and 116b that are provided on the back surface of functional block 104 that takes a metal material having high conductivity as its base material.

Common GND terminals 118a and 118b that are provided on the back surface of second wiring board 102 and that have conductive material 122 applied to their surfaces further contact connection cavities 117a and 117b provided in the front surface of functional block 104 that has high conductivity. These common GND terminals 118a and 118b are electrically connected by vias (not shown) to each of common GND terminals 119a and 119b that are provided on the front surface of second wiring board 102 and that have conductive material 122 applied to their surfaces. Common GND terminals 119a and 119b provided on the front surface of second wiring board 102 and that have conductive material 122 applied to their surfaces then contact connection cavities 121a and 121b that are provided on the back surface of holding block 106 that takes a metal material as its base material.

The circuit board device according to the present embodiment is stacked with functional block 104 into which anisotropic conductive member 103 is inserted arranged between the wiring boards. As a result, functional block 104 suppresses deformation of the wiring boards and suppresses fluctuation of the impact resilience of anisotropic conductive member 103, whereby the stability of the electrical connection between wiring boards remains high even in the event of the application of static external force.

In addition, taking into consideration the amount of spread δ of the surfaces that contact each wiring board when anisotropic conductive member 103 is compressed plus a degree of margin, through-window 123 of functional block 104 is formed larger than the outer form of anisotropic conductive member 103. As a result, when anisotropic conductive member 103 is compressed by applying pressure to and securing holding blocks 105 and 106, the impact resilience applied in the direction of compression by anisotropic conductive member 103 can be prevented from becoming excessive. As a result, the need to increase the thickness of holding blocks 105 and 106 can be eliminated and a slim circuit board device can be realized.

In addition, anisotropic conductive member 103 is inserted in through-window 123 that is provided in functional block 104, whereby the linear expansion of anisotropic conductive member 103 is suppressed by functional block 104 that encloses anisotropic conductive member 103 even in the event of changes in the ambient temperature. As a result, large shifts do not occur between the wiring boards and the anisotropic conductive member and a stable electrical connection between wiring boards can be obtained.

In addition, by connecting functional block 104 and holding blocks 105 and 106 to GND, electrode terminals 107 for signal connection of first wiring board 101 and electrode terminals 108 for signal connection of second wiring board 102 are connected by way of the conductors of anisotropic conductive member 103. This electrical connection is completely shielded from electromagnetic waves in directions parallel to the front and back surfaces of the wiring boards by being enclosed by functional block 104 that takes a metal material having high conductivity as its base material. As a result, this configuration can suppress the occurrence of electromagnetic interference (EMI) that typically generated unnecessary electromagnetic waves exert on other apparatuses, and further, can improve electromagnetic susceptibility (EMS) to noise that intrudes from the outside in the electrical connections. In addition, the arrangement of holding blocks 105 and 106 that take a metal material as base material on the outermost surfaces of the circuit board device and the electrical connection of functional block 104 and vias that connect terminals formed on the front and back surfaces of first wiring board 101 and second wiring board 102 inside the wiring boards enable complete shielding against electromagnetic waves in directions perpendicular to the front and back surfaces of the wiring boards.

In the circuit board device according to the present embodiment, the front and back surfaces of the wiring boards in a compressed and secured state contact functional block 104 or holding blocks 105 and 106. As a result, the spacing between functional block and functional block or the spacing between functional block and holding block can be minimized, i.e., can be made the thickness of the wiring boards. By minimizing the circumference of the non-conducting portion that is enclosed by conductors, the occurrence of electromagnetic interference exerted upon other apparatuses by unnecessary electromagnetic waves that are typically generated can be suppressed despite the application of higher-frequency signals. As a result, electromagnetic susceptibility to noise that intrudes from the outside can be improved in the electrical connections.

In addition, connecting functional block 104 and holding blocks 105 and 106 to the power supply makes the cross-sectional area of functional block 104 and holding blocks 105 and 106 extremely large and thus enables a decrease of the amount of current per unit of cross-sectional area of the power-supply line. This enables a suppression of the generation of heat of the electrical connections and further eliminates the need to distribute the power-supply line among a plurality of lines to reduce the amount of current per connection terminal. The miniaturization that accompanies a slimmer and more compact electronic apparatus can therefore be achieved.

In the present embodiment, the number of stacked wiring boards was taken as a single stack of two layers, but the present invention is not limited to this configuration and any number of laminations may be selected.

In addition, anisotropic conductive member 103 is not limited to an anisotropic conductive material that takes an insulating elastic resin material as its base material and in which metal fine lines are embedded, and any one of metal particles, gold-plated particles, or copper-plated particles may be used in place of metal fine lines.

Still further, the positioning of the wiring boards together, the positioning of the wiring boards and holding blocks, and the positioning of each wiring board and functional block 104 is not limited to a method in which positioning through-holes formed on each wiring board, functional block 104, and each holding block are fitted over positioning pins 124a and 124b provided on positioning jig 125. Alignment marks can be formed on each wiring board, functional block 104, and each holding block, and positioning of these parts can be achieved by observing these alignment marks by a CCD (Charge Coupled Device) camera.

Figure 12A:
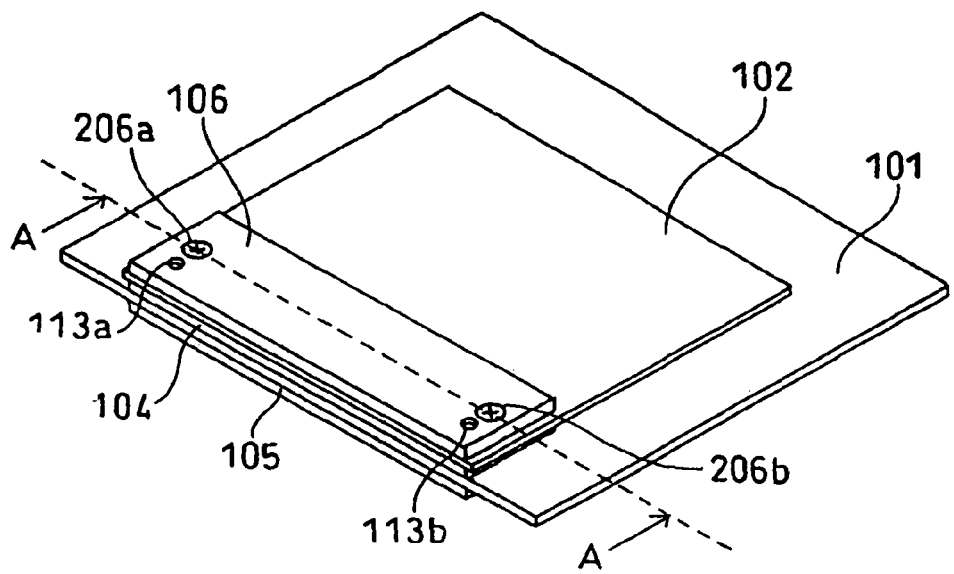
FIG. 12A is a schematic perspective view showing the circuit board device according to the second embodiment.
Figure 12B:
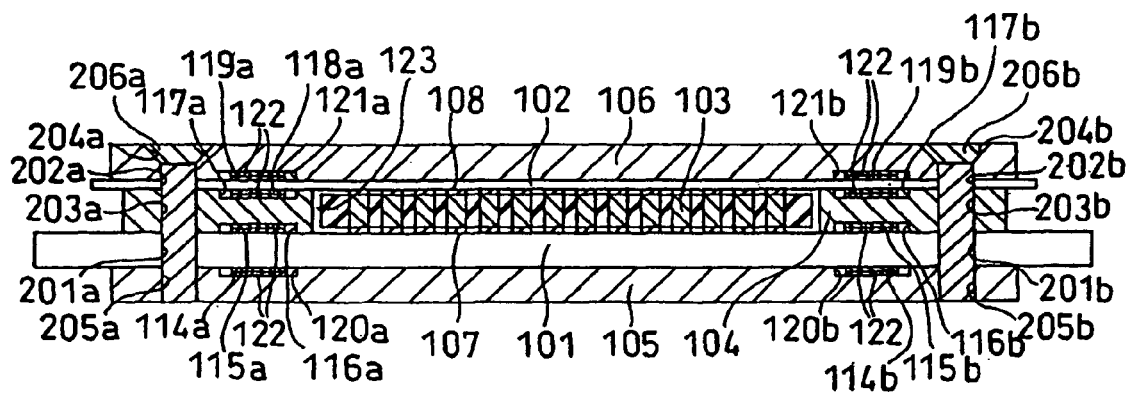
FIG. 12B is a sectional view taken along line A-A in FIG. 12A.
Figure 13:
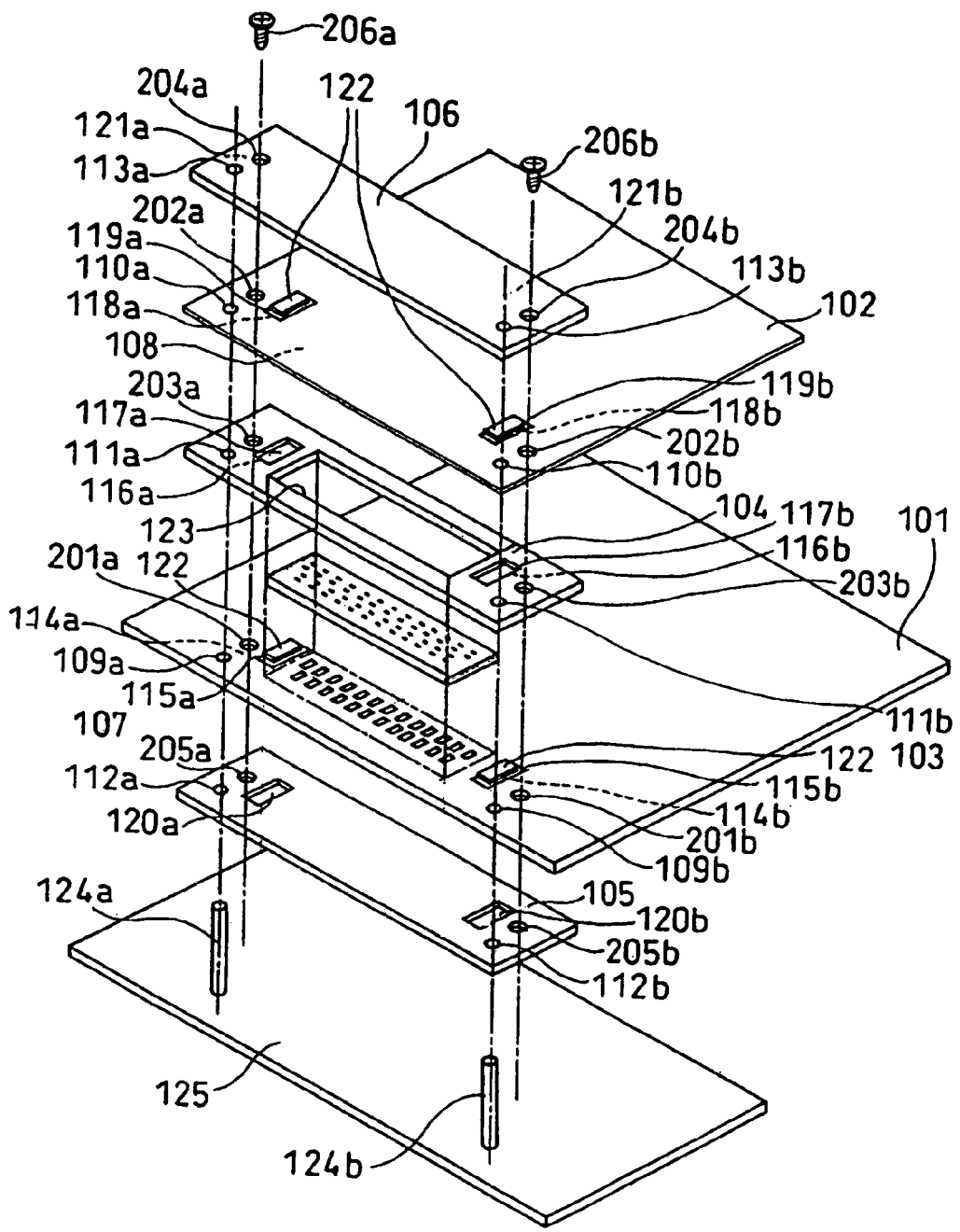
FIG. 13 is an exploded perspective view showing the configuration of the circuit board device and the wiring board interconnection method of the second embodiment.
Figure 14:
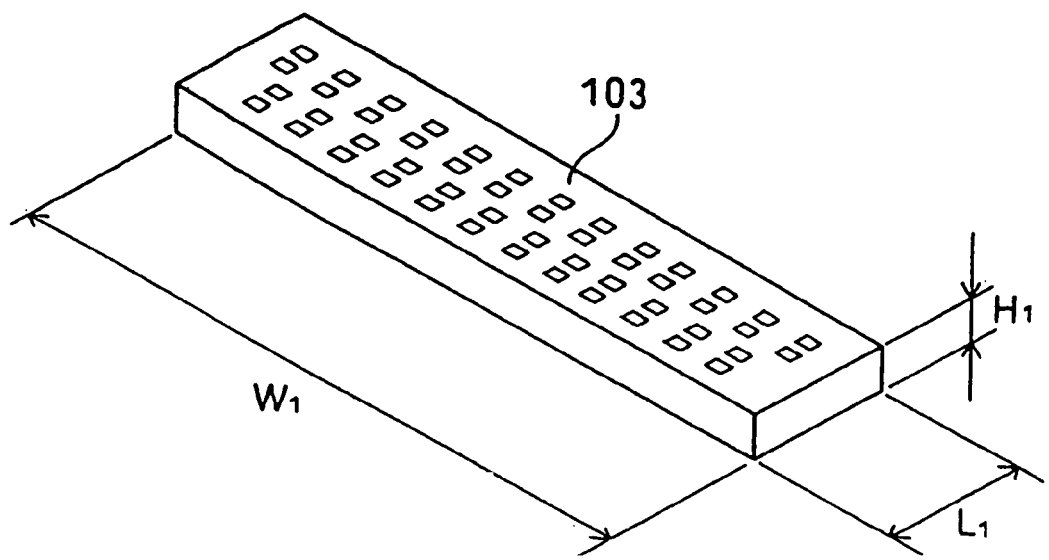
FIG. 14 is a schematic perspective view showing anisotropic conductive member 103.
Figure 15:
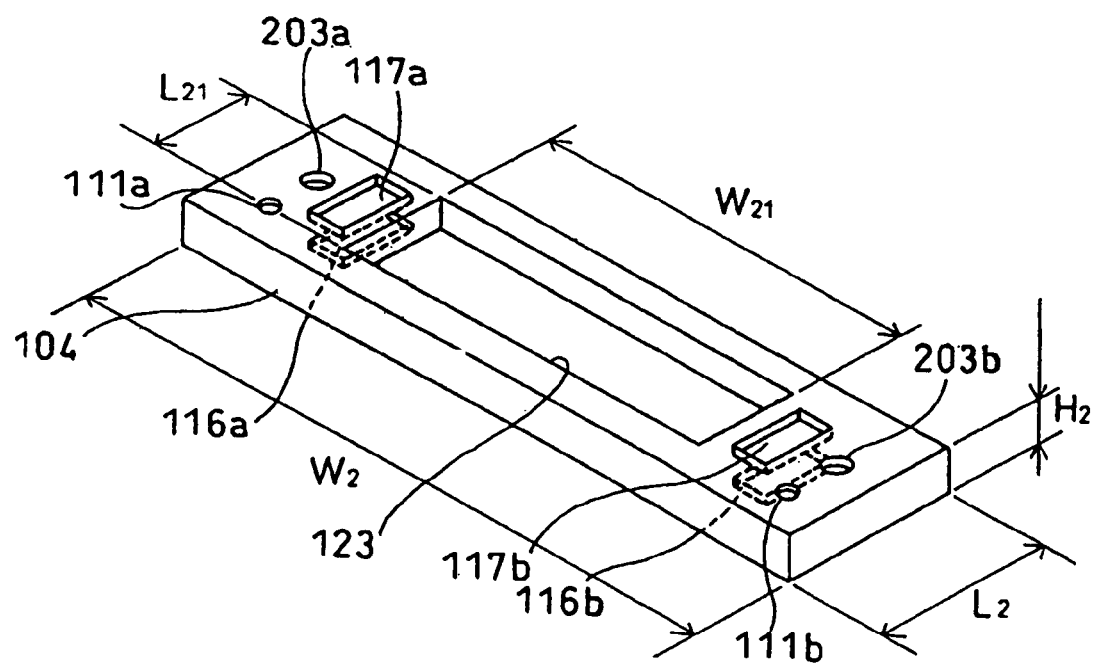
FIG. 15 is a schematic perspective view of functional block 104.
Figure 16A:
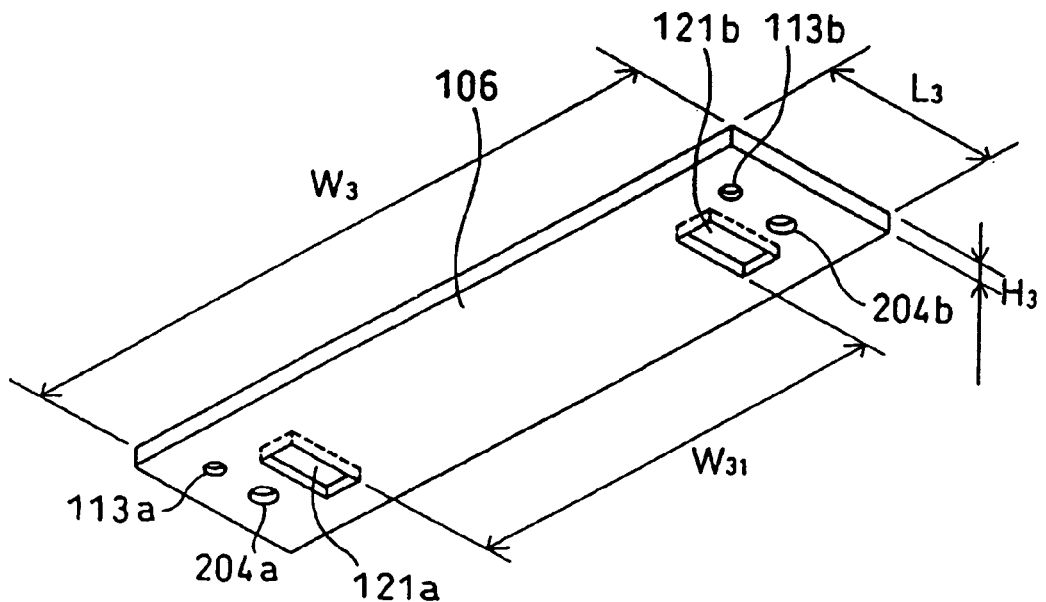
FIG. 16A is a schematic perspective view showing holding block 106.
Figure 16B:
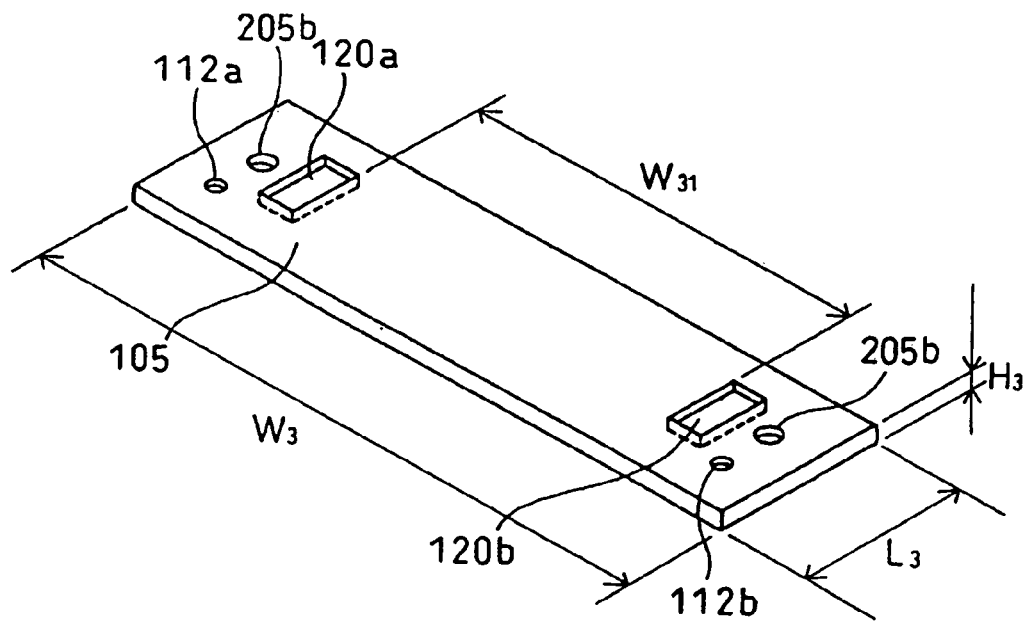
FIG. 16B is a schematic perspective view showing holding block 105.
Figure 17:
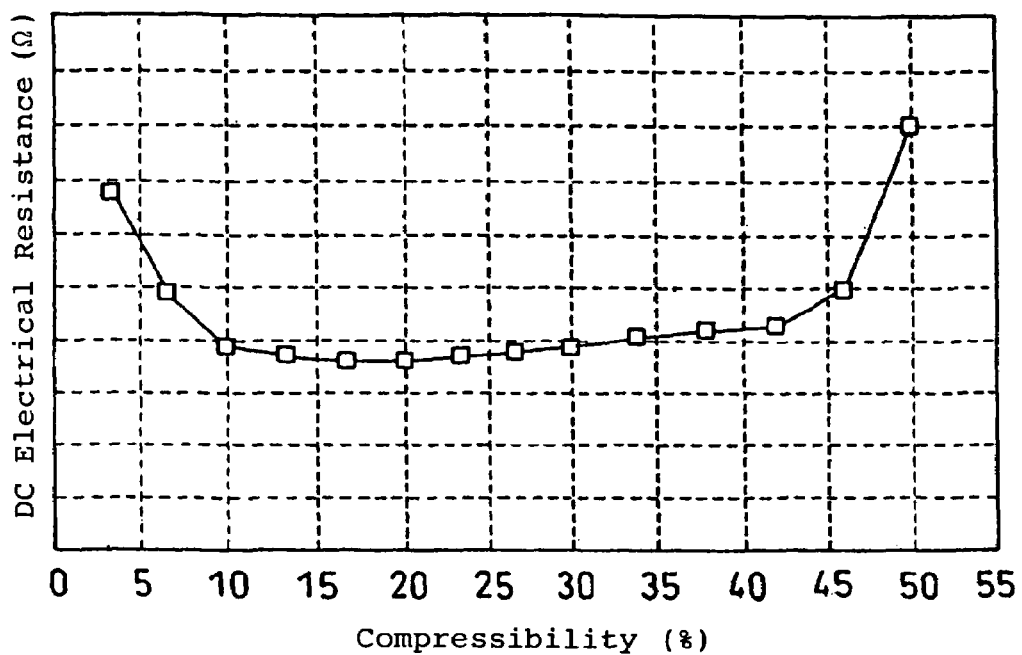
FIG. 17 is a graph showing the relation between compressibility and dc electrical resistance of anisotropic conductive member 103 of the circuit board device according to the present invention.

Explanation next regards the second embodiment. FIG. 12A is a schematic perspective view showing the circuit board device according to the present embodiment, and FIG. 12B is a sectional view taken along line A-A in FIG. 12A. FIG. 13 is an exploded perspective view showing the configuration of the circuit board device and the wiring board interconnection method according to the present embodiment, FIG. 14 is a schematic perspective view showing anisotropic conductive member 103, and FIG. 15 is a schematic perspective view showing functional block 104. FIG. 16A is a schematic perspective view showing holding block 106, and FIG. 16B is a schematic perspective view showing holding block 105. FIG. 17 is a graph showing the relation between compressibility and dc electrical resistance of anisotropic conductive member 103 of the circuit board device according to the present invention. In FIGS. 12 to 17, constituent elements identical to FIGS. 7 to 11 are given the same reference numbers and detailed explanation of these elements is here omitted.

In the above-described first embodiment, the circuit board device was of a configuration in which anisotropic conductive member 103 that was clamped between the wiring boards was subjected to pressure applied by means of, for example, a clamping jig (not shown), compressed to the thickness of functional block 104 and secured in this state. In the present embodiment, the circuit board device has a configuration that is similar to that of the first embodiment but differs in that pressure is applied by means of screws 206a and 206b rather than a clamping jig (not shown) and functional block 104 and holding blocks 105 and 106 are connected to GND.

First wiring board 101 can employ a rigid printed wiring board that takes, for example, FR4 as its base material. Positioning through-holes 109a and 109b as well as screw clearance through-holes 201a and 201b are provided in first wiring board 101. In addition, electrode terminals 107 for signal connection are provided on the front surface of first wiring board 101. Common GND terminals 115a and 115b are further provided on the same surface as these electrode terminals 107, and conductive material 122 is applied to the surfaces of these common GND terminals 115a and 115b. Common GND terminals 114a and 114b are provided on the back surface of first wiring board 101, and conductive material 122 is applied to the surfaces of these common GND terminals 114a and 114b. Common GND terminals 115a and 114a are then electrically connected by means of a via (not shown). Common GND terminals 115b and 114b are similarly electrically connected by way of a via (not shown).

Second wiring board 102 can employ a flexible printed wiring board that takes, for example, polyimide as its base material. Positioning through-holes 110a and 110b as well as screw clearance through-holes 202a and 202b are provided in second wiring board 102. In addition, common GND terminals 119a and 119b are provided on the front surface of second wiring board 102. Conductive material 122 is applied to the surfaces of these common GND terminals 119a and 119b. Electrode terminals 108 for signal connection that have a one-to-one correspondence with electrode terminals 107 for signal connection of first wiring board 101 are provided on the back surface of second wiring board 102. Common GND terminals 118a and 118b are provided on the same surface as these electrode terminals 108, and conductive material 122 is applied to the surfaces of these common GND terminals 118a and 118b. Common GND terminals 118a and 119a are then electrically connected by means of a via (not shown). Common GND terminals 118b and 119b are similarly electrically connected by a via (not shown).

As an example, a board having a thickness of 0.7 mm can be used as first wiring board 101 and a board having a thickness of 0.2 mm can be used as second wiring board 102. Regarding electrode terminals 107 provided on the front surface of first wiring board 101 and electrode terminals 108 provided on the back surface of second wiring board 102, the number of terminals for each can be 25, the pitch in the longitudinal direction can be 0.3 mm (L/S=0.15/0.15), the pitch in the lateral direction can be 0.8 mm, the terminal dimensions can be 0.15 mm (W)×0.5 mm (L), and the terminals can be arranged in staggered rows (12 electrodes in the row close to the edge of the board and 13 electrodes in the other row). In addition, the terminal dimensions of each of common GND terminals 115a, 115b, 118a, and 118b can be 0.4 mm (W)×0.9 mm (L), and common GND terminals 115a and 115b can be formed at positions at a distance of 0.55 mm from the outermost terminals of electrode terminals 107, and common GND terminals 118a and 118b can be formed at positions at a distance of 0.55 mm from the outermost terminals of electrode terminals 108. In this way, the spacing between common GND terminals 115a and 115b is 4.85 mm, and the spacing between common GND terminals 116a and 116b is 4.85 mm.

Common GND terminals 114a and 114b are provided on the back surface of first wiring board 101, i.e., on the surface that confronts holding block 105, at positions that are projected from common GND terminals 115a and 115b that are provided on the front surface of first wiring board 101. In addition, common GND terminals 119a and 119b are provided on the front surface of second wiring board 102, i.e., on the surface that confronts holding block 106, at positions that are projected from common GND terminals 118a and 118b provided on the back surface of second wiring board 102. As conductive material 122, silver paste can be applied by a dispensing method to the surfaces of each of common GND terminals 114a, 114b, 115a, 115b, 118a, 118b, 119a, and 119b.

Conductive member 103 that is arranged between first wiring board 101 and second wiring board 102 has insulating elastic resin material as its base material in which metal-fine lines are embedded in a direction perpendicular to the front and back surfaces of each wiring board at positions that correspond to each of electrode terminals 107 that are provided in the front surface of first wiring board 101 and electrode terminals 108 that are provided on the back surface of second wiring board 102.

Anisotropic conductive member 103 can employ, for example, silicone rubber having a rubber hardness of 50 degrees (JIS-K-6249) as the insulating elastic resin material. In addition, the metal fine lines can employ a conductive material composed of stainless steel lines having a diameter $\phi$ of 12 μm that have been subjected to a gold-plating process, and, for example, can have the dimensions W1=4.2 mm, L1=1.2 mm, and H1=0.3 mm.

Functional block 104 is composed of metal material as its base material and is provided with positioning through-holes 111a and 111b and screw clearance through-holes 203a and 203b, as shown in FIG. 15. Functional block 104 is provided with connection cavities 116a and 116b at positions on its back surface that correspond to common GND terminals 115a and 115b that are provided on first wiring board 101, and is provided with connection cavities 117a and 117b at positions on its front surface that correspond to common GND terminals 118a and 118b that are provided on second wiring board 101. Functional block 104 has a frame shape provided with through-window 123 as an opening for inserting anisotropic conductive member 103. Anisotropic conductive member 103 is inserted into this through-window 123. Taking into consideration the amount of spread on the surfaces of anisotropic conductive member 103 that contact with each wiring board when anisotropic conductive member 103 has been compressed to the thickness of functional block 104 plus some margin, this through-window 123 is formed larger than the outer shape of anisotropic conductive member 103. In addition, the thickness of anisotropic conductive member 103 is formed greater than the thickness of functional block 104.

FIG. 17 shows the resistance of anisotropic conductive member 103 when the thickness H1 of anisotropic conductive member 103 has been compressed. As shown in FIG. 17, anisotropic conductive member 103 has a stable electrical resistance when the compressibility is in the range of from 10% to 45%. As a result, the thickness H2 of functional block 104 can be made, for example, H2=0.25 mm (16.7% compressibility).

In addition, the insulating elastic resin material that is the base material of anisotropic conductive member 103 has a property by which volume does not change even after compression, and as a result, when the amount of spread δ toward the front and back surfaces of the wiring boards is calculated by the following Equation 1 that shows the relationship of the insulating elastic resin material before and after compression, δ=0.180625 mm. Taking into consideration the amount of spread δ and a slight margin, the following dimensions can be used:

W21=W1+0.2 mm=4.4 mm
L21=L1+0.2 mm=1.4 mm
W2=7.4 mm
L2=2.3 mm

In addition, the following dimensions of each of connection cavities 116a, 116b, 117a, and 117b can be used:

0.5 mm (W)×1.0 mm×0.07 mm (D)      [Equation 1]

Holding blocks 105 and 106 are blocks that take a metal material as the base material. As shown in FIG. 16B, holding block 105 is provided with positioning through-holes 112a and 112b as well as screw fastening tap-holes 205a and 205b, and further, connection cavities 120a and 120b are provided at positions that correspond to common GND terminals 114a and 114b provided on the back surface of first wiring board 101. In addition, as shown in FIG. 16A, holding block 106 is provided with positioning through-holes 113a and 113b as well as screw clearance through-holes 204a and 204b, and further, connection cavities 121a and 121b are provided at positions that correspond to common GND terminals 119a and 119b provided on the front surface of second wiring board 102.

In this case, holding blocks 105 and 106 can use, for example, aluminum having high conductivity as a metal material, and can employ the dimensions W3=7.4 mm, L3=2.3 mm, and H3=0.5 mm. In addition, connection cavities 120a, 120b, 121a, and 121b can each use the dimensions 0.5 mm (W)×1.0 mm (L)×0.07 mm (D).

Explanation next regards the wiring board interconnection method of the circuit board device according to the present embodiment. As shown in FIG. 13, positioning through-holes 112a and 112b provided on holding block 105 are fitted on positioning pins 124a and 124b provided on positioning jig 125. Positioning through-holes 109a and 109b provided in first wiring board 101 are next fitted over positioning pins 124a and 124b. Positioning through-holes 111a and 111b provided in functional block 104 are further fitted over positioning pins 124a and 124b. Anisotropic conductive member 103 is inserted in through-window 123 formed in this functional block 104, and metal fine lines are embedded in this anisotropic conductive member 103 in the direction perpendicular to the front surface of first wiring board 101 at positions that correspond to electrode terminals 107 provided on the front surface of first wiring board 101.

Positioning through-holes 110a and 110b provided in second wiring board 102 are further fitted over positioning pins 124a and 124b from above functional block 104. Electrode terminals 108 provided on the back surface of second wiring board 102 have a one-to-one correspondence to electrode terminals 107 of first wiring board 101. Accordingly, metal fine lines embedded in anisotropic conductive member 103 that is arranged between first wiring board 101 and second wiring board 102 are embedded in a direction also perpendicular to the back surface of second wiring board 102 and have a one-to-one correspondence with electrode terminals 108 of second wiring board 102.

Positioning through-holes 113a and 113b provided in holding block 106 are further fitted over positioning pins 124a and 124b from above. At this time, positioning through-holes 112a and 112b provided in holding block 105, positioning through-holes 109a and 109b provided in first wiring board 101, positioning through-holes 111a and 111b provided in functional block 104, positioning through-holes 110a and 110b provided in second wiring board 102, and positioning through-holes 113a and 113b provided in holding block 106 are all fitted over positioning pins 124a and 124b provided in positioning jig 125 to accurately position each component.

In this state, first wiring board 101 and second wiring board 102 that have been arranged with functional block 104 and anisotropic conductive member 103 interposed are clamped by holding block 105 and holding block 106. Screw 206a is next screwed from screw clearance through-hole 204a formed in holding block 106 into screw fastening tap-hole 205a provided in holding block 105 via screw clearance through-holes 202a, 203a, and 201a. Screw 206b is similarly screwed from screw clearance through-hole 204b formed in holding block 106 into screw fastening tap-hole 205b provided in holding block 105 via screw clearance through-holes 202b, 203b, and 201b, whereby anisotropic conductive member 103 is compressed to the thickness of functional block 104.

As described hereinabove, electrode terminals 107 provided on the front surface of first wiring board 101 and electrode terminals 108 provided on the back surface of second wiring board 102 are electrically connected by the conductors of anisotropic conductive member 103. At this time, the spreading of the area of the surfaces of anisotropic conductive member 103 that contact each wiring board in through-window 123 prevent the impact resilience applied in the direction of compression by anisotropic conductive member 103 from becoming excessive.

In addition, common GND terminals 114a and 114b provided on the back surface of first wiring board 101 and in which conductive material 122 has been applied to surfaces contact connection cavities 120a and 120b that are provided on the front surface of holding block 105 that takes a metal material as its base material. These common GND terminals 114a and 114b and common GND terminals 115a and 115b that are provided on the front surface of first wiring board 101 and in which conductive material 122 has been applied to surfaces are each electrically connected by vias (not shown). These common GND terminals 115a and 115b then contact connection cavities 116a and 116b provided on the back surface of functional block 104 that takes a metal material as its base material.

In addition, common GND terminals 118a and 118b that are provided on the back surface of second wiring board 102 and in which conductive material 122 has been applied to surfaces contact connection cavities 117a and 117b provided on the front surface of functional block 104. These common GND terminals 118a and 118b and common GND terminals 119a and 119b provided on the front surface of second wiring board 102 and in which conductive material 122 has been applied to surfaces are each electrically connected by vias (not shown). These common GND terminals 119a and 119b then contact connection cavities 121a and 121b that are provided on the back surface of holding block 106 that takes metal material as its base material. Functional block 104 and holding blocks 105 and 106 are then connected to GND, whereby the circuit board device of the present embodiment is configured.

As described hereinabove, the circuit board device according to the present embodiment is of a configuration in which anisotropic conductive member 103 that is inserted into through-window 123 of functional block 104 is used as the electrical connection medium between the wiring boards, these wiring boards are clamped between holding blocks 105 and 106, and these parts are compressed and secured by screws. At this time, functional block 104 and holding blocks 105 and 106 are connected to GND. As a result, electrical connections in which electrode terminals 107 for signal connection of first wiring board 101 and electrode terminals 108 for signal connection of second wiring board 102 are connected by way of the conductors of anisotropic conductive member 103 are enclosed in functional block 104 that employs a metal material having high conductivity as its base material, whereby complete shielding to electromagnetic waves is achieved in directions parallel to the front and back surfaces of the wiring boards.

In order to suppress the occurrence of electromagnetic interference (EMI) exerted by typically generated unnecessary electromagnetic waves upon other devices and improve the electromagnetic susceptibility (EMS) of electrical connections against noise that intrudes from the outside, the circumference L of non-conductor portions that are enclosed by conductors must be set within the range that satisfies L≦λ/10. In the present embodiment, this circumference L is determined by the wiring board thickness and the electrical connection pitch between two functional blocks or between a functional block and holding block. In this case, the first opening is taken as a portion that is determined by the electrical connection pitch between functional block 104 and holding block 105 and the thickness of first wiring board 101, that has no electrical conductivity, and that can be ignored considerations of electric matter. In the circuit board device according to the present embodiment, the electrical connection pitch between functional block 104 and holding block 105 is 4.85 mm, the thickness of first wiring board 101 is 0.7 mm, and opening circumference L of this first opening is therefore 11.1 mm (=4.85×2+0.7×2). In this case, the maximum value of frequency f that satisfies the relation in which first opening circumference L≦λ/10 is 2.7 GHz according to the following equation. Here, c is the speed of light:

$$0.29979 \times 10^9 \text{ m/sec.} \qquad \text{[Equation 2]}$$

Accordingly, even when there is a first opening between functional block 104 and holding block 105, high electromagnetic susceptibility (EMS) to noise that intrudes from the outside can be achieved in electrical connections without exerting electromagnetic interference (EMI) upon other devices even when high frequencies up to a frequency of 2.7 GHz are applied.

Similarly, the second opening is taken as a portion that is determined by the electrical connection pitch between holding block 106 and functional block 104 and the thickness of second wiring board 102, that has no electrical conduction, and that can be ignored considerations of electric matter. In this case, the electrical connection pitch between holding block 106 and functional block 104 is 4.85 mm and the thickness of second wiring board 102 is 0.2 mm in the circuit board device according to the present embodiment, whereby the opening circumference L of this second opening is 10.1 mm (=4.85×2+0.2×2). Here, according to Equation 2, the maximum value of frequency f that satisfies the relation in which the opening circumference L of the second opening is less than or equal to λ/10 is 3.0 GHz.

Thus, even when there is a second opening between holding block 106 and functional block 104, high electromagnetic susceptibility (EMS) to noise that intrudes from the outside can be achieved in electrical connections without causing electromagnetic interference (EMI) upon other devices even when signals of high frequencies up to a frequency of 3.0 GHz are applied. In addition, in this circuit board device according to the present embodiment as well, holding blocks 105 and 106 that take a metal material as the base material are arranged on the outermost surfaces of the circuit board device in a direction perpendicular to the front and back surfaces of the wiring boards. The electrical connection of functional block 104 and vias that connect terminals formed on the front and back surfaces of first wiring board 101 and second wiring board 102 inside the wiring boards then enables complete shielding against electromagnetic waves.

In the circuit board device according to the present embodiment, functional block 104 as well as holding blocks 105 and 106 is the common GND of each wiring board. As a result of the shielding effect realized by functional block 104 as well as holding blocks 105 and 106, making the opening circumference of the first opening to be 11.1 mm and the opening circumference of the second opening to be 10.1 mm enables an improvement of electromagnetic susceptibility (EMS) to noise that intrudes from the outside in the electrical connections without causing electromagnetic interference (EMI) upon other devices, even when high frequencies of up to each of frequencies 2.7 GHz and 3.0 GHz are applied.

The circuit board device according to the present embodiment shows a case in which a rigid printed wiring board that takes FR4 as its base material is used for first wiring board 101 and a flexible printed wiring board that employs polyimide as its base material is used as second wiring board 102, but the present invention is not limited to this form, and a rigid printed wiring board and a flexible printed wiring board can be of any combination. In addition, although a case was shown in which the number of layers of wiring boards is a single stack of two layers, the present invention is not limited to this form and any number of layers may be selected.

Although the board thickness H2 of functional block 104 was 0.25 mm in the present embodiment, the present invention is not limited to this form. The same effects can be obtained regardless of the board thickness H2 of functional block 104 as long as the thickness can guarantee a compression amount between 10% and 45% that obtains stabilized electrical resistance of anisotropic conductive member 103.

Although board thickness H3 of holding blocks 105 and 106 were set to 0.5 mm in the present embodiment, the present invention is not limited to this form. The same effects can be obtained regardless of board thickness H3 of holding blocks 105 and 106 as long as the thickness can guarantee a compression amount between 10% and 45% that obtains stabilized electrical resistance of anisotropic conductive member 103.

Although an example has been shown in which anisotropic conductive member 103 uses an insulating elastic resin material as its base material and has embedded metal fine lines that use a conductive material composed of stainless steel lines 2 μm in diameter that have been subjected to gold-plating, the present invention is not limited to this form. The metal fine lines can use any one of gold lines, copper lines, brass lines, phosphor-bronze lines, and nickel lines, and the diameter φ may be within the range from 5 μm to 20 μm. In addition, instead of metal fine lines embedded in the insulating elastic resin material, any one of metal particles, gold-plated particles, or copper-plated particles may be embedded in place of the metal fine lines. Further, although an example was shown in which silicone rubber having a rubber hardness of 50-degrees (JIS-K-6249) was used, the rubber hardness may be within the range of from 20-degrees to 80 degrees.

Although an example was shown in which silver paste was used as conductive material 122, the present invention is not limited to this form, and a conductive paste obtained by dispersing metal particles of, for example, gold, nickel, and copper or metal-plated particles obtained by subjecting resin particles to metal plating in resin, a tin-lead solder, lead-free solder, ACF (Anisotropic Conductive Film), or ACP (Anisotropic Conductive Paste) can also be used.

In addition, the positioning of the wiring boards, the positioning of the wiring boards and holding blocks, and the positioning of each wiring board and functional block 104 is not limited to a method of fitting positioning through-holes formed in each wiring board, functional block 104, and each holding block over positioning pins 124a and 124b provided on positioning jig 125. Positioning can also be realized by forming alignment marks on each wiring board, functional block 104, and each holding block and then observing these alignment marks by means of a CCD camera.

Figure 18A:
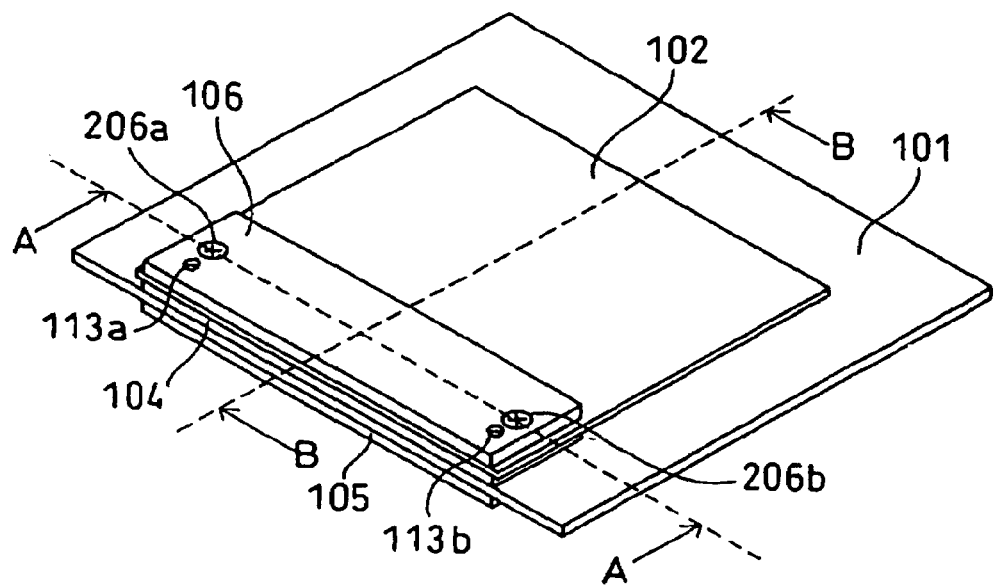
FIG. 18A is a schematic perspective view showing the circuit board device according to the third embodiment.
Figure 18B:
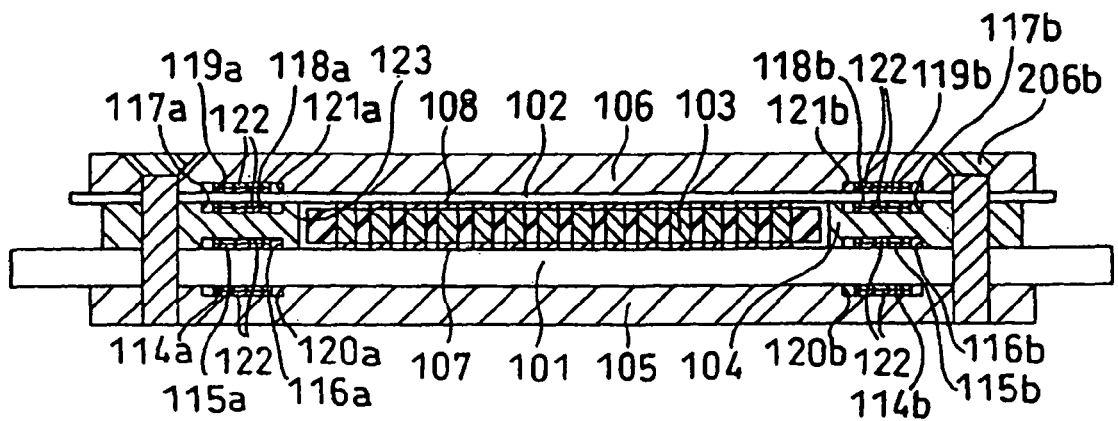
FIG. 18B is a sectional view taken along line A-A in FIG. 18A.
Figure 18C:
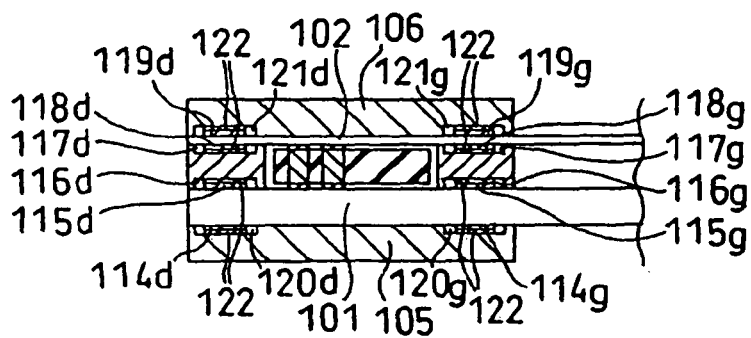
FIG. 18C is a sectional view taken along line B-B in FIG. 18A.
Figure 19:
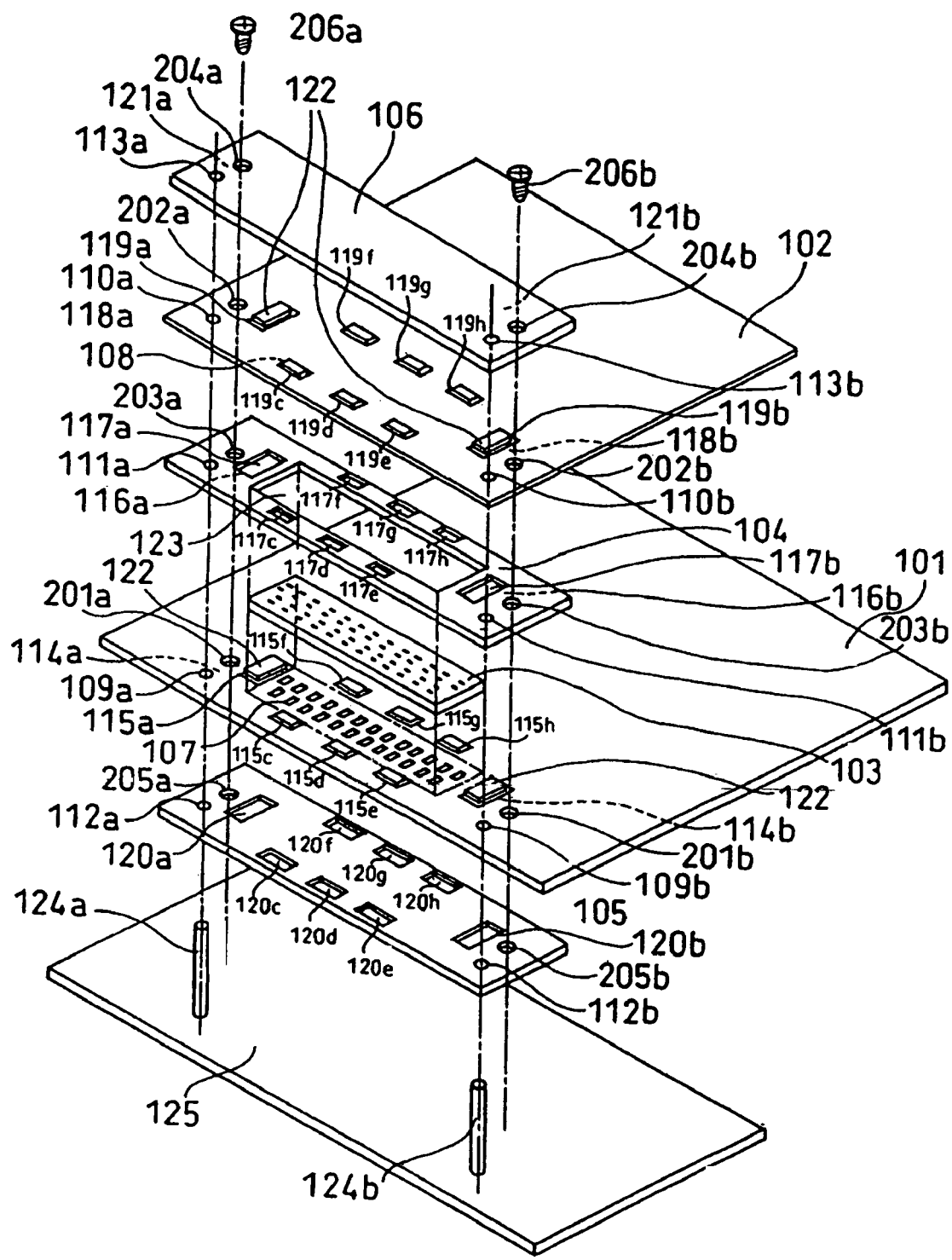
FIG. 19 is an exploded perspective view showing the configuration of the circuit board device and the wiring board interconnection method according to the third embodiment.
Figure 20:
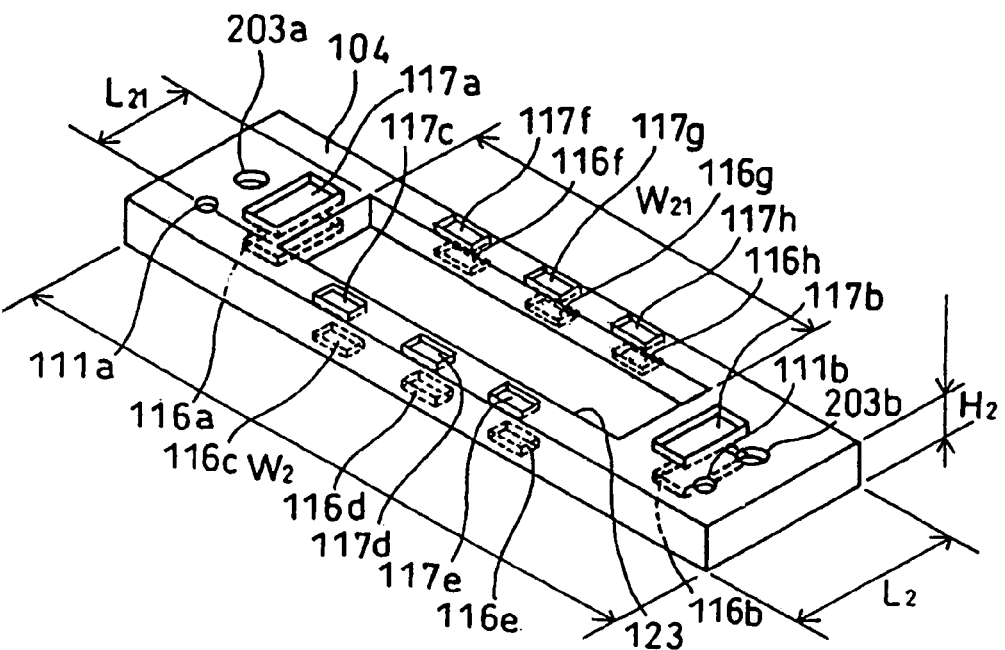
FIG. 20 is a schematic perspective view showing functional block 104.
Figure 21A:
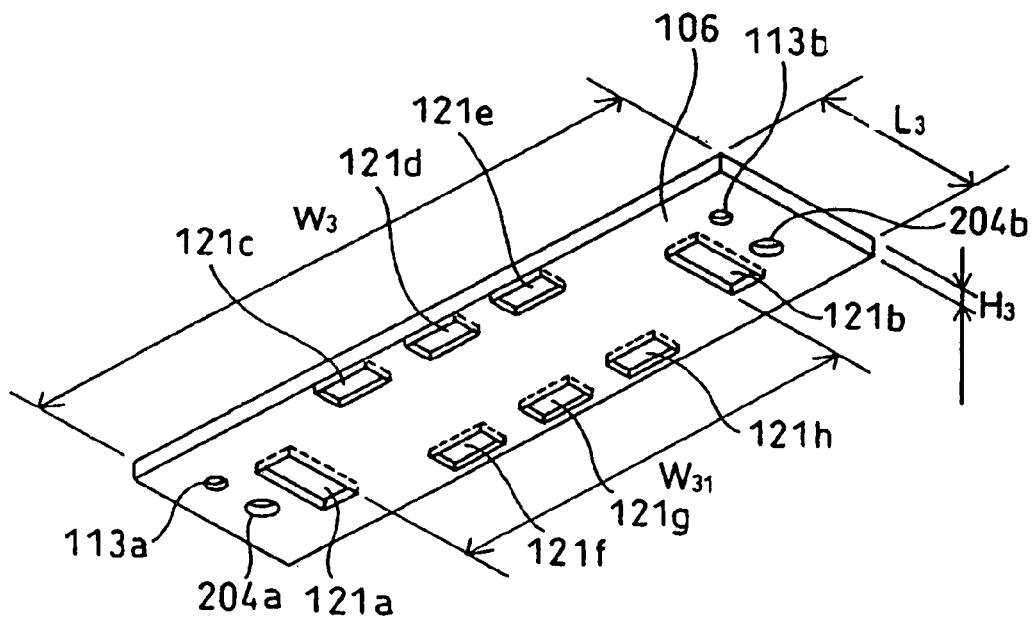
FIG. 21A is a schematic perspective view showing holding block 105.
Figure 21B:
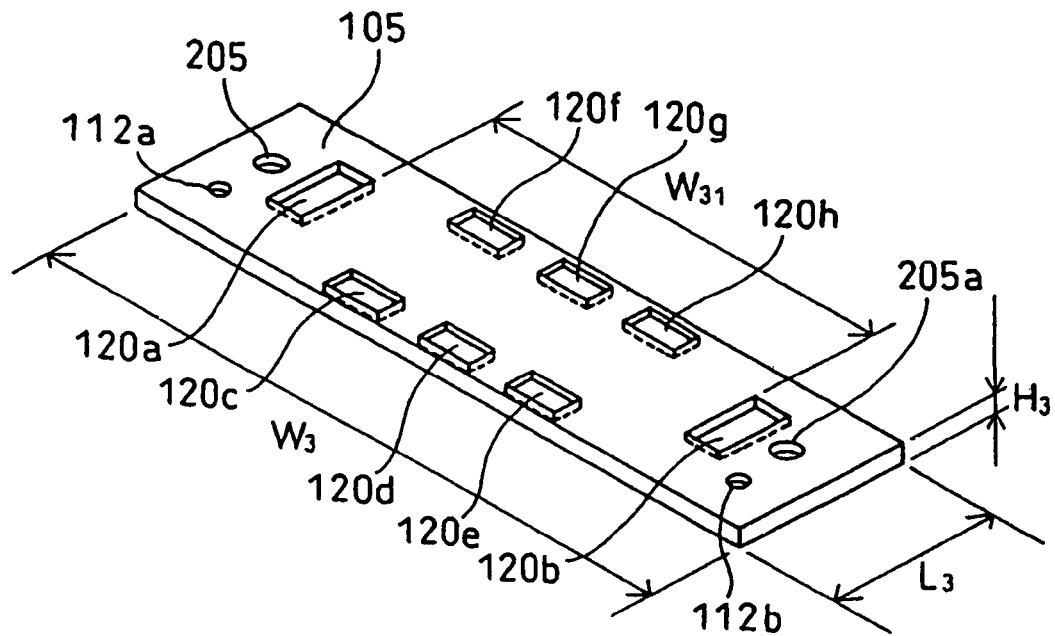
FIG. 21B is a schematic perspective view showing holding block 106.

Explanation next regards the third embodiment of the present invention. FIG. 18A is a schematic perspective view showing the circuit board device according to the present embodiment, FIG. 18B is a sectional view taken along line A-A in FIG. 18A, and FIG. 18C is a sectional view taken along line B-B in FIG. 18A. FIG. 19 is an exploded perspective view showing the configuration of the circuit board device and the wiring board interconnection method according to the present embodiment, and FIG. 20 is a schematic perspective view showing functional block 104 of the circuit board device according to the present embodiment. FIG. 21A is a schematic perspective view showing holding block 105, and FIG. 21B is a schematic perspective view showing holding block 106. In FIGS. 18 to 21, constituent elements that are identical FIGS. 7 to 17 are given the same reference numbers, and detailed explanation regarding these elements is omitted.

In the circuit board device according to the present embodiment, common GND terminals 115a to 115h are provided on the same surface as electrode terminals 107 for signal connection that are provided on the front surface of first wiring board 101. Conductive material 122 is applied to the surfaces of these common GND terminals 115a to 115h. Common GND terminals 114a to 114h are provided on the back surface of first wiring board 101 at positions that correspond to these common GND terminals 115a to 115h. Conductive material 122 is applied to the surfaces of these common GND terminals 114a to 114h. Common GND terminals 115a and 114a are electrically connected by a via (not shown), and common GND terminals 115b and 114b are electrically connected by a via (not shown). Each common GND terminal provided on the front surface of first wiring board 101 is similarly electrically connected by a via to a corresponding common GND terminal provided on the back surface of first wiring board 101.

In the same way, common GND terminals 118a to 118h are provided on the same surface as electrode terminals 108 for signal connection that are provided on the back surface of second wiring board 102. Conductive material 122 is applied to the surfaces of these common GND terminals 118a to 118h. In addition, common GND terminals 119a to 119h are provided on the front surface of second wiring board 102 at positions that correspond to common GND terminals 118a to 118h. Conductive material 122 is applied to the surfaces of these common GND terminals 119a to 119h. Common GND terminals 118a and 119a are electrically connected by a via (not shown), and common GND terminals 118b and 119b are electrically connected by a via (not shown). Each of the common GND terminals provided on the front surface of second wiring board 102 are similarly electrically connected by a via to a corresponding common GND terminal provided on the back surface of second wiring board 102.

Functional block 104 takes a metal material having high conductivity as its base material and is provided with positioning through-holes 111a and 111b as shown in FIG. 20. Connection cavities 116a to 116h are provided on the back surface of functional block 104 at positions that correspond to common GND terminals 115a to 115h provided on first wiring board 101. Connection cavities 117a to 117h are provided on the front surface of functional block 104 at positions that correspond to common GND terminals 118a to 118h provided on second wiring board 101. Functional block 104 has a frame shape provided with through-window 123 as an opening into which anisotropic conductive member 103 is inserted, and anisotropic conductive member 103 is inserted in this through-window 123. Taking into consideration the amount of spreading of the surfaces of anisotropic conductive member 103 that contact each wiring board when anisotropic conductive member 103 is compressed to the thickness of functional block 104 plus a slight margin, this through-window 123 is formed larger than the outer shape of anisotropic conductive member 103. In addition, the thickness of anisotropic conductive member 103 is formed with a greater thickness than functional block 104.

A metal material is used as the base material of holding block 105 and positioning through-holes 112a and 112b are provided as shown in FIG. 21B. Connection cavities 120a to 120h are provided in the front surface of holding block 105 at positions that correspond to common GND terminals 114a to 114h provided in first wiring board 101.

A metal material is used as the base material of holding block 106 and positioning through-holes 113a and 113b are provided as shown in FIG. 21A. Connection cavities 121a and 121h are provided on the back surface of holding block 106 at positions that correspond to common GND terminals 119a to 119h provided in second wiring board 102.

The dimensions of common GND terminals 114c to 114h provided on the back surface of first wiring board 101 can be 0.9 mm (W)×0.3 mm (L). The dimensions of common GND terminals 115c to 115h provided on the front surface of first wiring board 101 can be 0.9 mm (W)×0.3 mm (L), the terminal spacing can be 0.5375 mm, and the terminals can be arranged at positions that are 0.775 mm from the longitudinal center of electrode terminals 107. In addition, the dimensions of common GND terminals 114a and 114b provided on the back surface of first wiring board 101 as well as common GND terminals 115a and 115b provided on the front surface of first wiring board 101 can be 0.4 mm (W)×0.9 mm (L) as in the second embodiment, and the position of arrangement of each of these common GND terminals can also be set as in the second embodiment.

The dimensions of common GND terminals 118c to 118h provided on the back surface of second wiring board 102 can be 0.9 mm (W)×0.3 mm (L), the terminal spacing can be 0.5375 mm, and the common GND terminals can be arranged at positions having a distance of 0.775 mm from the longitudinal center of electrode terminals 108. The dimensions of common GND terminals 119c to 119h provided on the front surface of second wiring board 102 can be made 0.9 mm (W)×0.3 mm (L). The dimensions of common GND terminals 118a and 118b provided on the back surface of second wiring board 102 and common GND terminals 119a and 119b provided on the front surface of second wiring board 102 can be made 0.4 mm (W)×0.9 mm (L) as in the second embodiment, and the positions of each of these common GND terminals can be set similar to the second embodiment.

The dimensions of connection cavities 116c to 116h provided on the back surface of functional block 104 and connection cavities 117c to 117h provided on the front surface of functional block 104 can be made 1.0 mm (W)×0.4 mm (L)×0.07 mm (D). In addition, the dimensions of connection cavities 116a and 116b provided on the back surface of functional block 104 as well as connection cavities 117a and 117b provided on the front surface of functional block 104 can be made 0.5 mm (W)×1.0 mm (L)×0.07 mm (D) as in the second embodiment, and the positions of each of these common GND terminals can be set as in the second embodiment.

The dimensions of connection cavities 120c to 120h provided on the front surface of holding block 105 as well as connection cavities 121c to 121h of the connection cavities that are provided on the back surface of holding block 106 can be made 1.0 mm (W)×0.4 mm (L)×0.07 mm (D). In addition, connection cavities 120a and 120b provided on the front surface of holding block 105 as well as connection cavities 121a and 121b of the connection cavities provided on the back surface of holding block 106 can be made 0.5 mm (W)×1.0 mm (L)×0.07 mm (D) as in the second embodiment, and the positions of each of these connection cavities can be set as in the second embodiment.

The wiring board interconnection method of the circuit board device according to the present embodiment is similar to the wiring board interconnection method of the circuit board device according to the above-described second embodiment.

By means of the above-described configuration, functional block 104 and anisotropic conductive member 103 are clamped between first wiring board 101 and second wiring board 102. At this time, anisotropic conductive member 103 is inserted inside through-window 123 provided in functional block 104. In addition, positioning through-holes 112a and 112b provided in holding block 105, positioning through-holes 109a and 109b provided in first wiring board 101, positioning through-holes 111a and 111b provided in functional block 104, positioning through-holes 110a and 110b provided in second wiring board 102, positioning through-holes 113a and 113b provided in holding block 106 are fitted over positioning pins 124a and 124b provided on positioning jig 125 whereby each component is accurately positioned.

In this state, first wiring board 101 and second wiring board 102 are clamped by holding block 105 and holding block 106 with functional block 104 and anisotropic conductive member 103 interposed. Screw 206a is next fastened to screw fastening tap-hole 205a provided in holding block 105 from screw clearance through-hole 204a formed in holding block 106 and by way of screw clearance through-holes 202a, 203a, and 201a. Screw 206b is similarly fastened to screw fastening tap-hole 205b provided in holding block 105 from screw clearance through-hole 204b formed in holding block 106 and by way of screw clearance through-holes 202b, 203b, and 201b. Anisotropic conductive member 103 is thus compressed to the thickness of functional block 104.

By the above-described procedure, electrode terminals 107 provided on the front surface of first wiring board 101 and electrode terminals 108 provided on the back surface of second wiring board 102 are electrically connected by the conductors of anisotropic conductive member 103. At this time, anisotropic conductive member 103 spreads inside through-window 123 such that the area of the surfaces of contact with each wiring board increases, whereby the impact resilience applied in the direction of compression by anisotropic conductive member 103 is prevented from becoming excessive.

Common GND terminals 114a to 114h that are provided on the back surface of first wiring board 101 and in which conductive material 122 is applied to surfaces each contact connection cavities 120a to 120h provided on the front surface of holding block 105 that takes a metal material as its base material. These common GND terminals 114a to 114h and common GND terminals 115a to 115h provided on the front surface of first wiring board 101 and in which conductive material 122 has been applied to surfaces are each electrically connected by way of vias (not shown). Common GND terminals 115a to 115h that are provided on the front surface of first wiring board 101 and in which conductive material 122 has been applied to surfaces each contact connection cavities 116a to 116h provided on the back surface of functional block 104 that takes a metal material as it base material.

Further, common GND terminals 118a to 118h that are provided on the back surface of second wiring board 102 and in which conductive material 122 has been applied to surfaces each contact connection cavities 117a to 117h provided on the front surface of functional block 104. These common GND terminals 118a to 118h and common GND terminals 119a to 119h that are provided on the front surface of second wiring board 102 and in which conductive material 122 has been applied to surfaces are each electrically connected by vias (not shown). Common GND terminals 119a to 119h that are provided on the front surface of second wiring board 102 and in which conductive material 122 has been applied to surfaces each contact connection cavities 121a to 121h provided in the back surface of holding block 106 that takes a metal material as its base material. Functional block 104 and holding blocks 105 and 106 are then connected to GND, whereby the circuit board device according to the present embodiment is configured.

In the circuit board device according to the present embodiment, functional block 104 and holding blocks 105 and 106 are connected to GND. As a result, the electrical connections by which electrode terminals 107 for signal connection of first wiring board 101 and electrode terminals 108 for signal connection of second wiring board 102 are connected by way of the conductors of anisotropic conductive member 103 are enclosed by functional block 104 that takes a metal material having high conductivity as its base material, whereby complete shielding against electromagnetic waves is realized in directions parallel to the front and back surfaces of the wiring boards.

Here, the first opening is the portion that is determined by the electrical connection pitch between functional block 104 and holding block 105 and that is determined by the thickness of first wiring board 101, and that is not electrically conductive and thus electrically negligible. In this case, the electrical connection pitch between functional block 104 and holding block 105 in the circuit board device according to the present embodiment is 0.5375 mm and the thickness of first wiring board 101 is 0.7 mm, whereby the opening circumference L of the first opening is 2.475 mm (=0.5375×2+0.7×2). Here, the maximum value of frequency f that satisfies the relation in which first opening circumference L is equal to or less than $\lambda/10$ is 12.1 GHz based on the above-described Equation 2. As a result, even when there is a first opening between functional block 104 and holding block 105, high electromagnetic susceptibility (EMS) to noise that intrudes from the outside can be achieved in the electrical connections without causing electromagnetic interference (EMI) upon other devices even when high frequencies up to a frequency of 12.1 GHz are applied.

Similarly, a second opening is the portion that is not electrically conductive and that can be ignored considerations of electric matter, and further, that is determined by the electrical connection pitch between holding block 106 and functional block 104 and that is determined by the thickness of second wiring board 102. In this case, the electrical connection pitch between holding block 106 and functional block 104 is 0.5375 mm and the thickness of second wiring board 102 is 0.2 mm in the circuit board device according to the present embodiment, and the opening circumference L of this second opening is therefore 1.475 mm (=0.5375×2+0.2×2). In this case, the maximum value of frequency f that satisfies the relation in which second opening circumference L is equal to or less than λ/10 is 20.3 GHz based on the above-described Equation 2.

As a result, even when there is a second opening between holding block 106 and functional block 104, high electromagnetic susceptibility (EMS) to noise that intrudes from the outside can be achieved in electrical connections without causing electromagnetic interference (EMI) upon other devices even when high frequencies up to a frequency of 3.0 GHz are applied. In the circuit board device according to the present embodiment as well, holding blocks 105 and 106 that employ a metal material as base material are arranged on the outermost surfaces of the circuit board device in directions perpendicular to the front and back surfaces of the wiring boards. The electrical connection of functional block 104 and vias that connect terminals formed on the front and back surfaces of first wiring board 101 and second wiring board 102 inside the wiring boards enables complete shielding against electromagnetic waves.

In the circuit board device according to the present embodiment, the opening circumference of the first opening and the opening circumference of the second opening are made smaller than in the circuit board device according to the second embodiment, whereby the occurrence of electromagnetic interference (EMI) exerted upon other devices by the typically generated unnecessary electromagnetic waves can be suppressed and electromagnetic susceptibility (EMS) to noise that intrudes from the outside can be improved in electrical connections between the wiring boards even when signals of higher frequencies are applied.

In the present embodiment, the number of common GND terminals provided on the front and back surfaces of each wiring board was eight per surface, but the present invention is not limited to this configuration and similar effects can be obtained if the number of common GND terminals is any number equal to or greater than two.

Figure 22A:
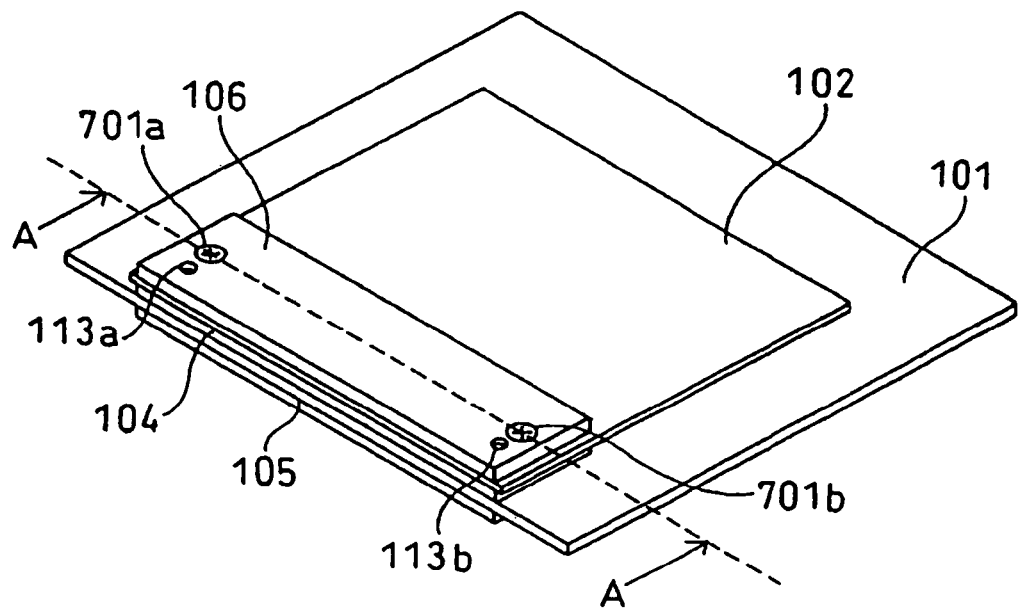
FIG. 22A is a schematic perspective view showing the circuit board device according to the fourth embodiment.
Figure 22B:
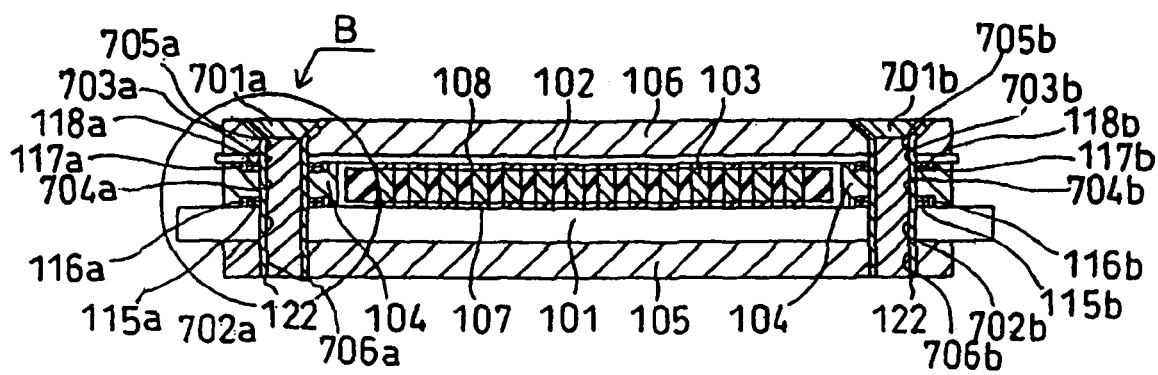
FIG. 22B is a sectional view taken along line A-A in FIG. 22A.
Figure 22C:
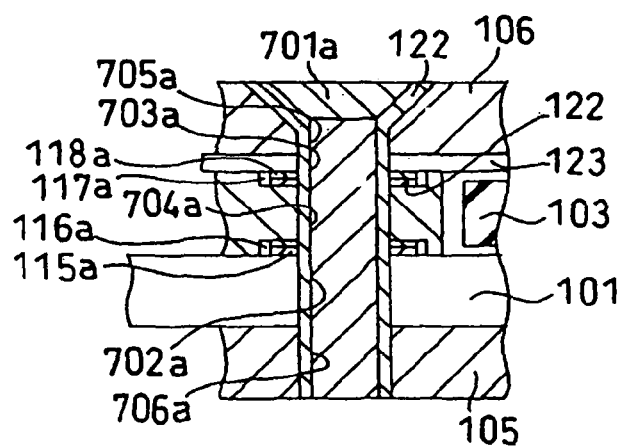
FIG. 22C is a sectional view showing an enlargement of the site indicated by arrow B in FIG. 22B.
Figure 23:
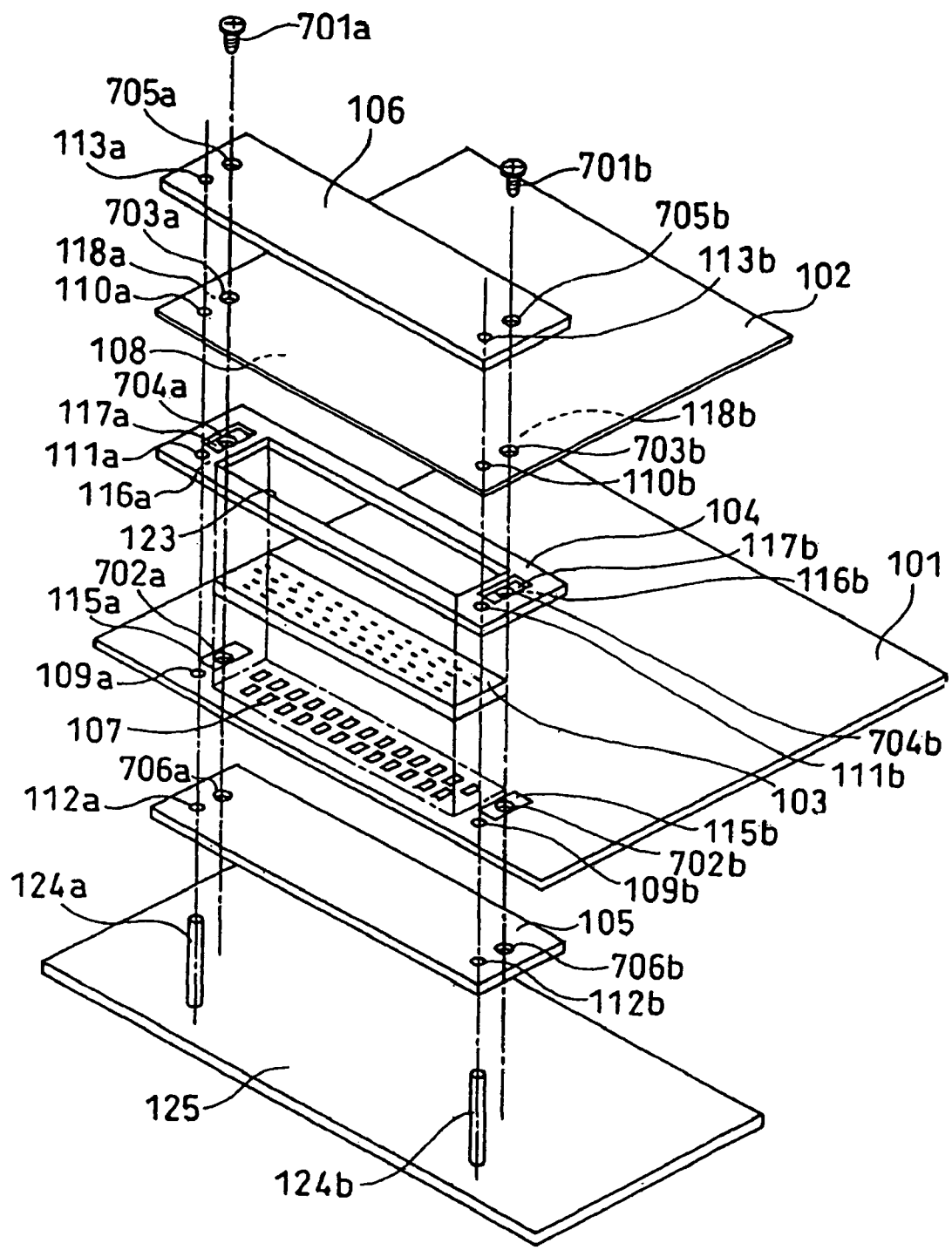
FIG. 23 is an exploded perspective view showing the configuration of the circuit board device and the wiring board interconnection method according to the fourth embodiment.
Figure 24:
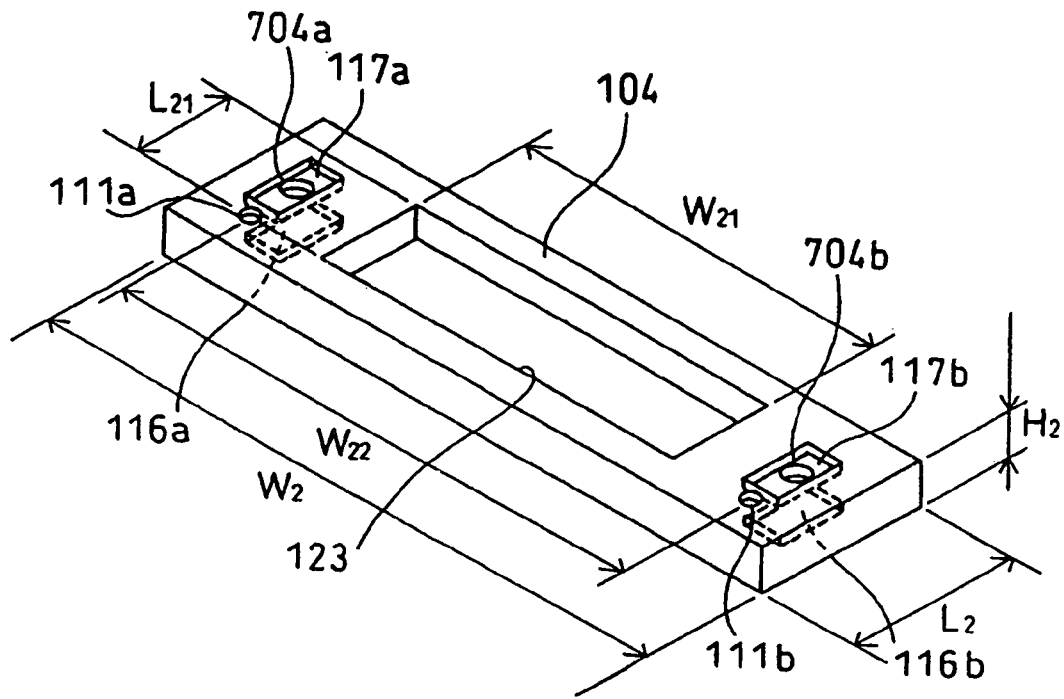
FIG. 24 is a schematic perspective view showing functional block 104.
Figure 25A:
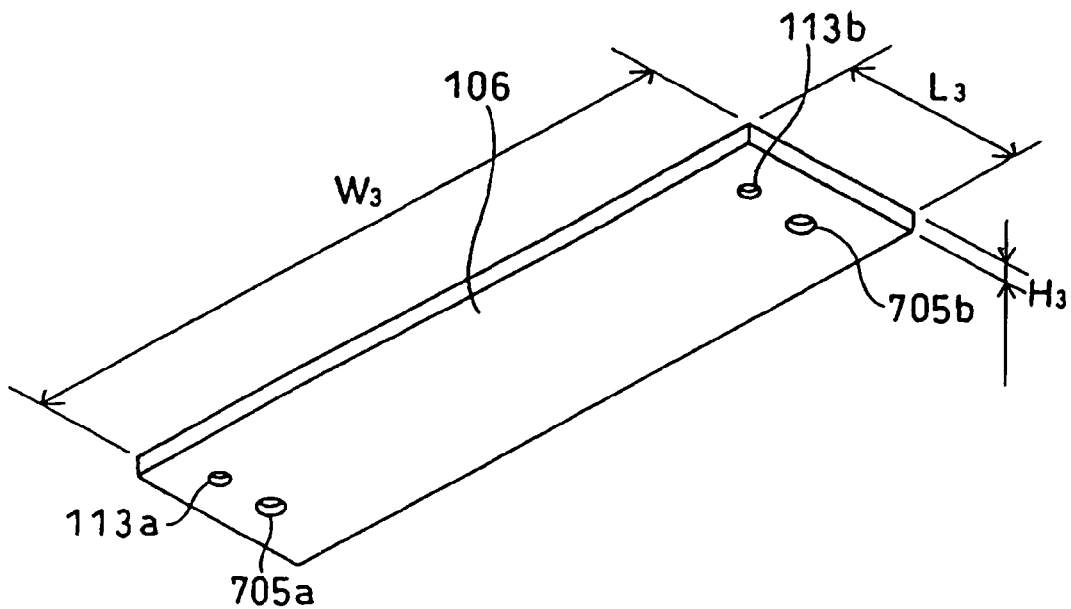
FIG. 25A is a schematic perspective view showing holding block 106.
Figure 25B:
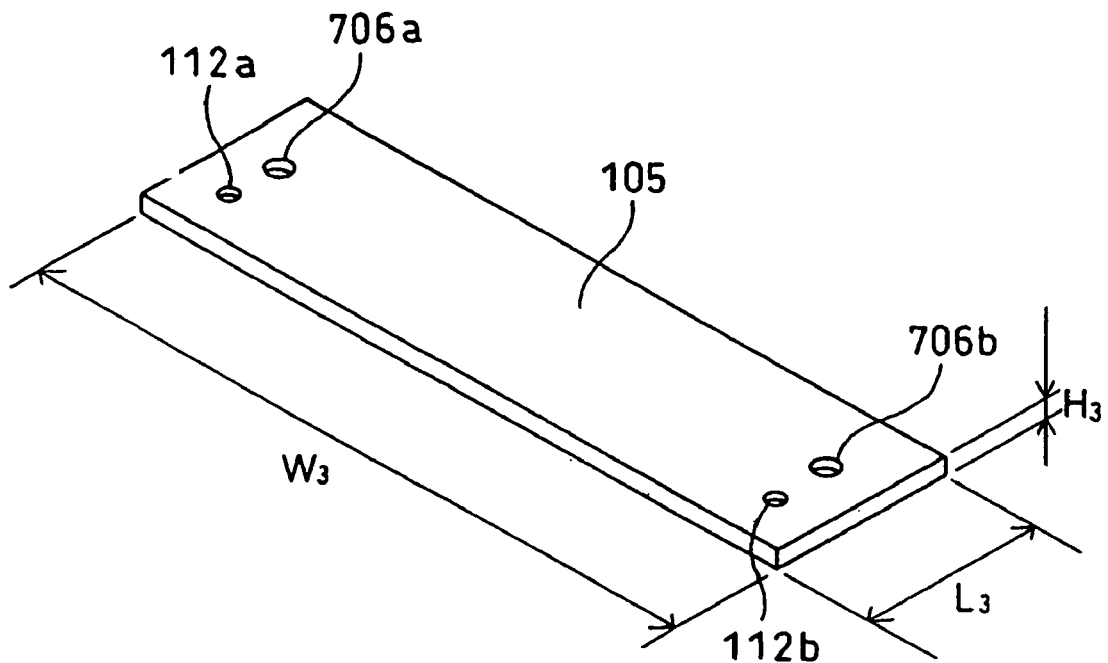
FIG. 25B is a schematic perspective view showing holding block 105.

Explanation next regards the fourth embodiment of the present invention. FIG. 22A is a schematic perspective view showing the circuit board device according to the present embodiment, FIG. 22B is a sectional view taken along line A-A in FIG. 22A, and FIG. 22C is a schematic sectional view of the portion shown by arrow B in FIG. 22B. FIG. 23 is an exploded perspective view showing the configuration of the circuit board device and the wiring board interconnection method according to the present embodiment, and FIG. 24 is a schematic perspective view showing functional block 104. FIG. 25A is a schematic perspective view showing holding block 106, and FIG. 25B is a schematic perspective view showing holding block 105. In FIGS. 22 to 25, constituent elements identical to FIGS. 7 to 22 are given the same reference numbers, and detailed explanation of these elements is omitted.

In the circuit board device according to the present embodiment, tap-holes 706a and 706b are provided in holding block 105 in place of screw fastening tap-holes 205a and 205b provided in the above-described second embodiment. In addition, common GND linking through-holes 702a and 702b are provided in first wiring board 101 in place of screw clearance through-holes 201a and 201b provided in the above-described second embodiment. In addition, common GND linking through-holes 704a and 704b are provided in functional block 104 in place of screw clearance through-holes 203a and 203b provided in the above-described second embodiment. Common GND linking through-holes 703a and 703b are provided in second wiring board 102 in place of screw clearance through-holes 202a and 202b provided in the above-described second embodiment. Common GND linking through-holes 705a and 705b are provided in holding block 106 in place of screw clearance through-holes 204a and 204b provided in the above-described second embodiment. The insides of these common GND linking through-holes and tap-holes are filled with conductive material 122. The conduction between functional block 104 and holding blocks 105 and 106 that function as a common GND is realized by fastening common GND linking screws 701a and 701b that are formed of conductors in tap-holes by way of the common GND linking through-holes.

First wiring board 101 can use a rigid printed wiring board that takes a material such as FR4 as its base material. Positioning through-holes 109a and 109b are provided in first wiring board 101. In addition, electrode terminals 107 for signal connection are provided on the front surface. In addition, common GND terminals 115a and 115b are provided on the same surface as these electrode terminals 107. Conductive material 122 is applied to the surfaces of these common GND terminals 115a and 115b. Common GND linking through-holes 702a and 702b are then formed in common GND terminals 115a and 115b in which conductive material 122 has been applied to these surfaces, and GND electrodes (not shown) are provided exposed from the inner walls of these common GND linking through-holes 702a and 702b.

Second wiring board 102 can use a flexible printed wiring board that takes, for example, polyimide as its base material. Positioning through-holes 110a and 110b are provided in second wiring board 102. Electrode terminals 108 for signal connection are provided on the back surface. Common GND terminals 118a and 118b are provided on the same surface as these electrode terminals 108. Conductive material 122 is applied to the surfaces of these common GND terminals 118a and 118b. Common GND linking through-holes 703a and 703b are then formed in common GND terminals 118a and 118b in which conductive material 122 has been applied to surfaces, and GND electrodes (not shown) are provided exposed from the inner walls of these common GND linking through-holes 703a and 703b.

First wiring board 101 having a thickness of 0.7 mm and second wiring board 102 having a thickness of 0.2 mm can be used. Regarding electrode terminals 107 provided on the front surface of first wiring board 101 and electrode terminals 108 provided on the back surface of second wiring board 102, the number of terminals can be set to 25 each, the pitch in the longitudinal direction can be set to 0.3 mm (L/S=0.15/0.15), the pitch in the lateral direction can be set to 0.8 mm, the dimensions of the terminals can be set to 0.15 mm (W)×0.5 mm (L), and the terminals can be arranged in staggered rows (12 electrodes in the row close to the edge of the board and 13 electrodes in the other row). In addition, the dimensions of each of common GND terminals 115a, 115b, 118a, and 118b are 1.5 mm (W)×2.0 mm (L), and common GND terminals 115a and 115b can be provided such that their centers are common with common GND linking through-holes 702a and 702b that are formed with a diameter of 1.5 mm at positions at a distance of 0.55 mm from the outermost terminals of electrode terminals 107. In addition, common GND terminals 118a and 118b can be provided such that their centers are common with common GND linking through-holes 703a and 703b that are formed with a diameter of 1.5 mm at positions at a distance of 0.55 mm from the outermost terminals of electrode terminals 108.

Anisotropic conductive member 103 can use the same component as the second embodiment.

Functional block 104 employs a metal material as its base material and is provided with positioning through-holes 111a and 111b as shown in FIG. 24. Connection cavities 116a and 116b are provided on the back surface of functional block 104 at positions that correspond to common GND terminals 115a and 115b provided on first wiring board 101. Connection cavities 117a and 117b are provided on the front surface of functional block 104 at positions that correspond to common GND terminals 118a and 118b provided on second wiring board 102. Common GND linking through-holes 704a and 704b are then provided in these connection cavities 116a and 117a as well as in connection cavities 116b and 117b. Functional block 104 further has a frame shape provided with through-window 123 as an opening into which anisotropic conductive member 103 is inserted. Anisotropic conductive member 103 is inserted into this through-window 123. Taking into consideration the amount of spread of the surfaces of anisotropic conductive member 103 that contact each of the wiring boards when anisotropic conductive member 103 is compressed to the thickness of functional block 104 plus a certain degree of margin, this through-window 123 is formed larger than the outer shape of anisotropic conductive member 103. The thickness of anisotropic conductive member 103 is also formed greater than the thickness of functional block 104.

Functional block 104 can employ, for example, aluminum that has a high conductivity as its metal material, and the thickness H2 of functional block 104 can be made, for example, H2=0.25 mm (compressibility 16.7%) to guarantee a compression amount of from 10% to 45% in which anisotropic conductive member 103 has electrical resistance that is more stabilized as shown in FIG. 17 than the resistance of anisotropic conductive member 103 when thickness H1 of anisotropic conductive member 103 has been compressed.

In addition, the insulating elastic resin material that is the base material of anisotropic conductive member 103 has properties by which volume does not change even after compression, and as a result, calculating the amount of spread δ in the direction of the front and back surfaces of wiring boards by means of the above-described Equation 1 that shows the relationship before and after compression of insulating elastic resin material results in δ=0.180625 mm. Based on this result and taking into consideration the amount of spread δ plus a slight margin allows:

W21=W1+0.2 mm=4.4 mm
L21=L1+0.2 mm=1.4 mm
W2=7.4 mm
L2=2.3 mm

In addition, connection cavities 116a, 116b 117a, and 117b can each be made 0.5 mm (W)×1.0 mm (L)×0.07 mm (D), and the diameters of common GND linking through-holes 704a and 704b can each be made 1.5 mm.

Holding blocks 105 and 106 are blocks that employ a metal material as base material, and as shown in FIG. 25B, positioning through-holes 112a and 112b as well as tap-holes 706a and 706b are provided on holding block 105. These tap-holes 706a and 706b serve the functions of common GND linkage and screw fastening. In addition, positioning through-holes 113a and 113b as well as common GND linking through-holes 705a and 705b are provided in holding block 106 as shown in FIG. 25A.

Holding blocks 105 and 106 can employ, for example, aluminum that has high conductivity as the base material, and the dimensions of each can be made W3=7.4 mm, L3=2.3 mm, and H3=0.5 mm to equal the dimensions of functional block 104.

The wiring board interconnection method of a circuit board device according to the present embodiment is equivalent to the wiring board interconnection method of a circuit board device according to the above-described second embodiment.

According to the above-described configuration, functional block 104 and anisotropic conductive member 103 are clamped between first wiring board 101 and second wiring board 102. At this time, anisotropic conductive member 103 is inserted in through-window 123 provided in functional block 104. In addition, positioning through-holes 112a and 112b provided in holding block 105, positioning through-holes 109a and 109b provided in first wiring board 101, positioning through-holes 111a and 111b provided in functional block 104, positioning through-holes 110a and 110b provided in second wiring board 102, and positioning through-holes 113a and 113b provided in holding block 106 are fitted over positioning pins 124a and 124b provided on positioning jig 125 whereby each is accurately positioned.

In this state, first wiring board 101 and second wiring board 102 that are arranged with functional block 104 and anisotropic conductive member 103 interposed are clamped by holding block 105 and holding block 106. Common GND linking screw 701a is next fastened to tap-hole 706a provided in holding block 105 from common GND linking through-hole 705a formed in holding block 106 and by way of common GND linking through-holes 703a, 704a and 702a. In addition, common GND linking screw 701b is fastened to tap-hole 706b provided in holding block 105 from common GND linking through-hole 705b formed in holding block 106 and by way of common GND linking through-holes 703b, 704b, and 702b. In this way, anisotropic conductive member 103 is compressed to the thickness of functional block 104. At this time, common GND linking through-holes and tap-holes are filled with conductive material 122.

According to the preceding procedure, electrode terminals 107 provided on the front surface of first wiring board 101 and electrode terminals 108 provided on the back surface of second wiring board 102 are electrically connected by the conductors of anisotropic conductive member 103. At this time, the area of the surfaces of anisotropic conductive member 103 that contact each wiring board spread inside through-window 123, whereby impact resilience applied by anisotropic conductive member 103 in the direction of compression is prevented from becoming excessive.

In addition, common GND terminals 115a and 115b that are provided on the front surface of first wiring board 101 and that have conductive material 122 applied to their surfaces are each electrically connected to holding block 105 that takes a metal material as its base material by way of common GND linking screws 701a and 701b as well as conductive material 122. These common GND terminals 115a and 115b and functional block 104 are electrically connected by way of common GND linking screws 701a and 701b as well as conductive material 122. Functional block 104 and common GND terminals 118a and 118b that are provided on the back surface of second wiring board 102 and that have conductive material 122 applied to their surfaces are electrically connected by way of common GND linking screws 701a and 701b as well as by conductive material 122. These common GND terminals 118a and 118b and holding block 106 are electrically connected by way of common GND linking screws 701a and 701b as well as conductive material 122. Functional block 104 and holding blocks 105 and 106 are further connected to GND. The circuit board device according to the present embodiment is thus configured.

The circuit board device according to the present embodiment makes the common GND terminals common to fastening screws and this is therefore advantageous for realizing a reduction of area, smaller size and lighter weight. In addition, the use of fastening screws having a large cross-sectional area as the common GND terminal connection members realizes superior stability of the GND potential.

Although an example was shown in the present embodiment in which common GND linking screws 701*a* and 701*b* are used as common GND terminal connection members, the present invention is not limited to this configuration. For example, the same effect is obtained if positioning pins 124*a* and 124*b* provided in positioning jib 125 are not provided in positioning jig 125, but rather, conductive positioning pins having the same function are provided in holding block 105 and these positioning pins are then used as common GND terminal connection members, or if other conductive pin-formed members are used.

Figure 26A:
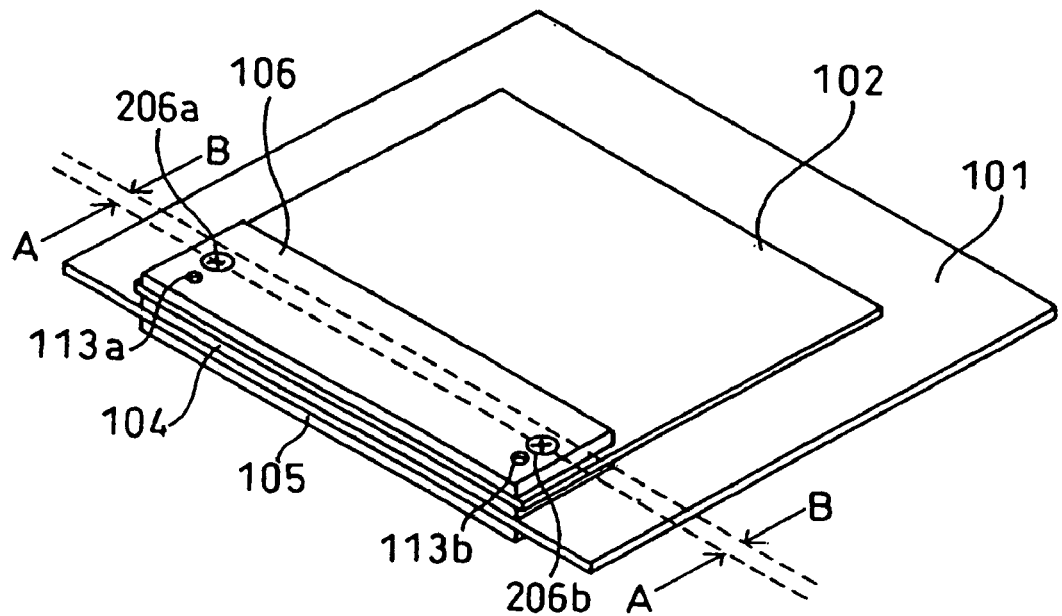
FIG. 26A is a schematic perspective view showing the circuit board device according to the fifth embodiment.
Figure 26B:
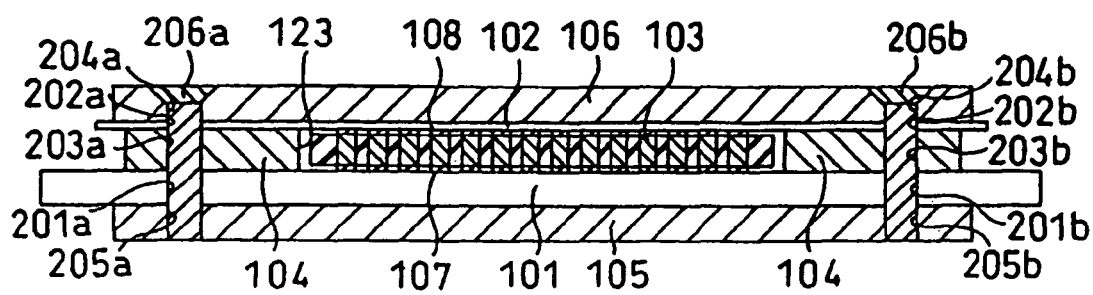
FIG. 26B is a sectional view taken along line A-A in FIG. 26A.
Figure 26C:
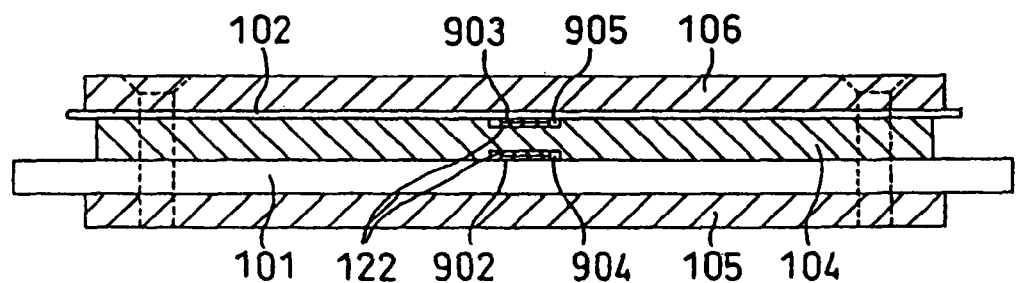
FIG. 26C is a sectional view taken along line B-B in FIG. 26A.
Figure 27:
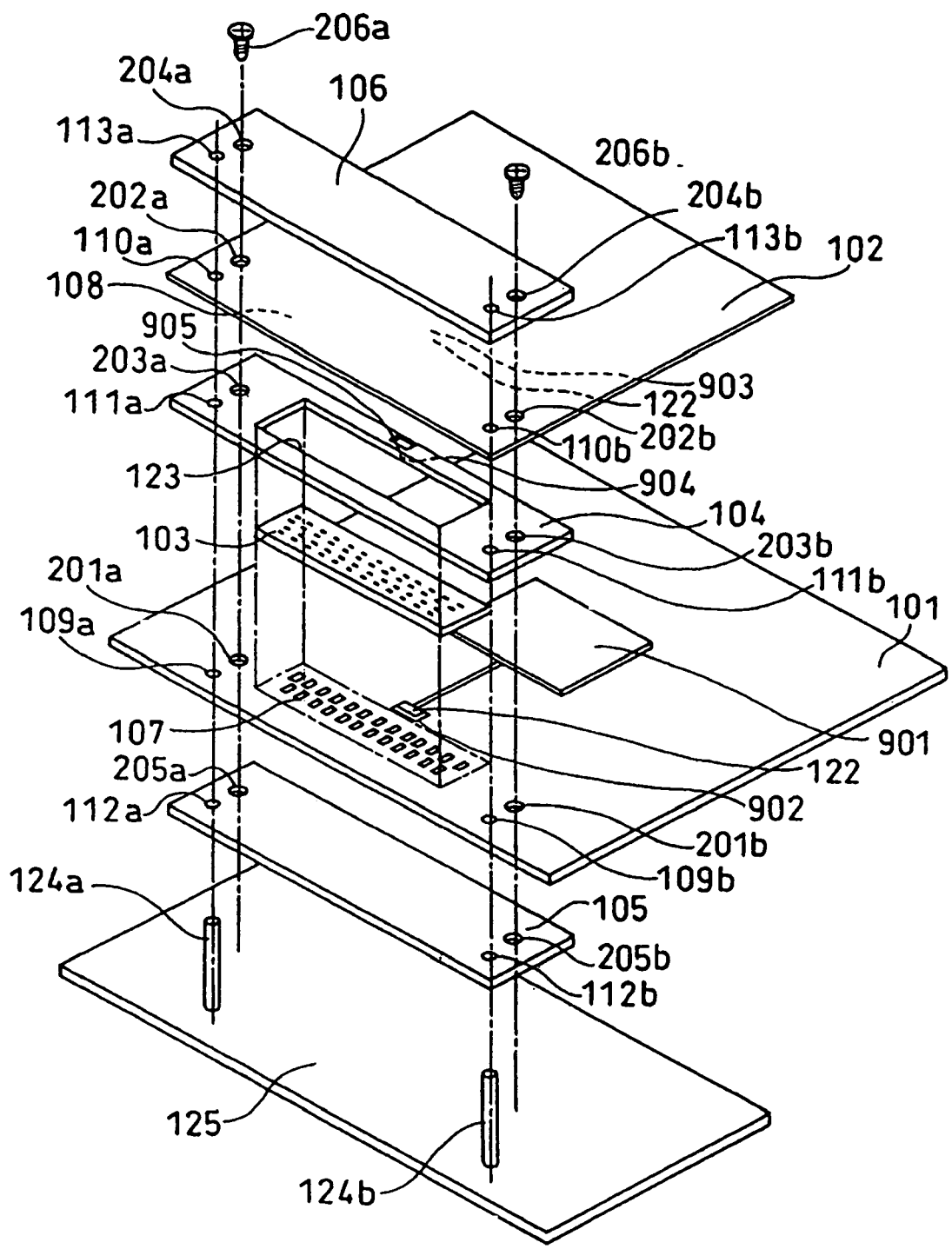
FIG. 27 is an exploded perspective view showing the configuration of the circuit board device and the wiring board interconnection method according to the fifth embodiment.
Figure 28:
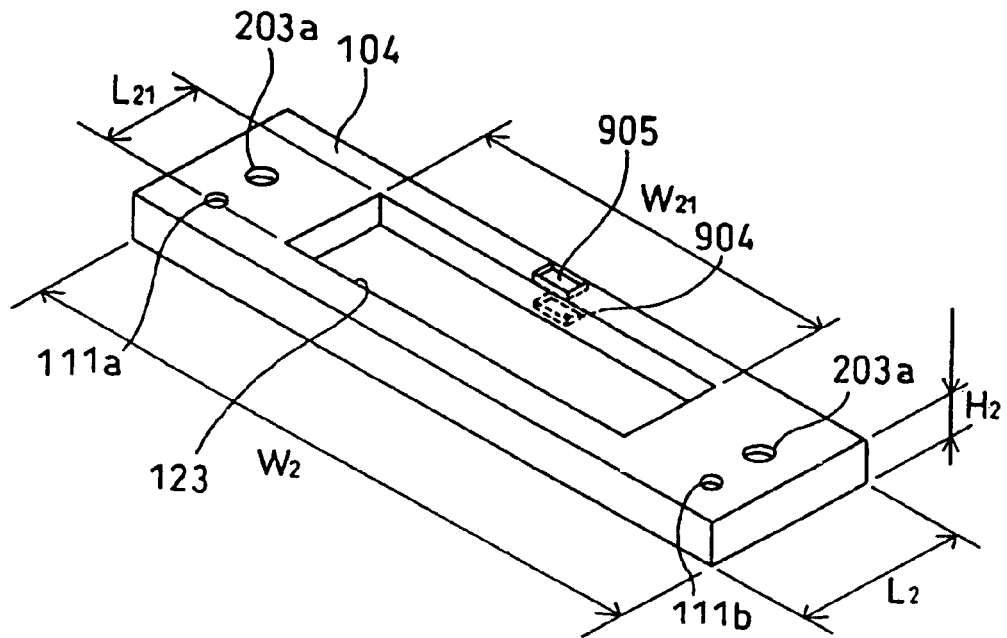
FIG. 28 is a schematic perspective view showing functional block 104.
Figure 29A:
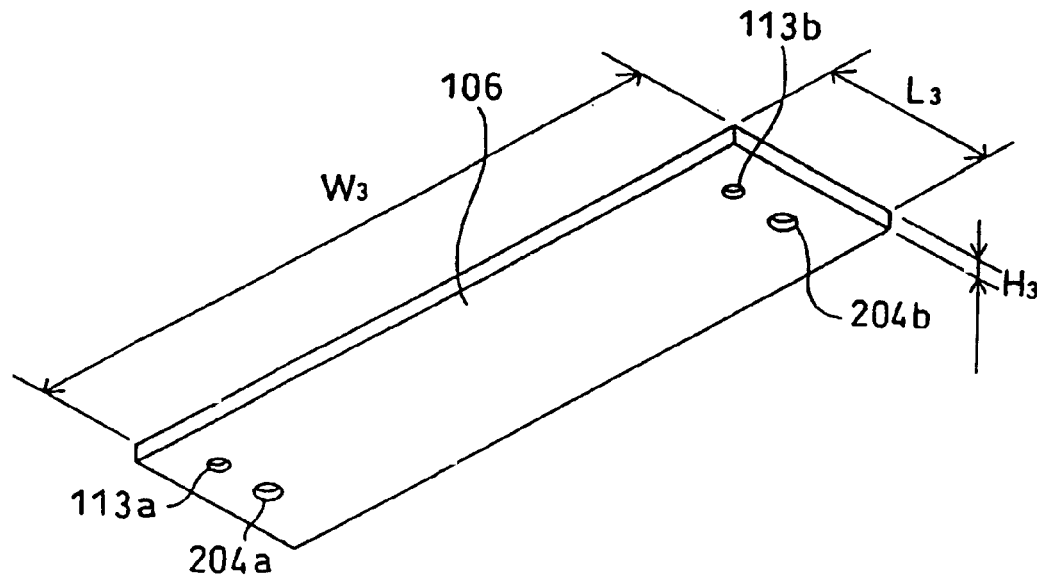
FIG. 29A (a) is a schematic perspective view showing holding block 106.
Figure 29B:
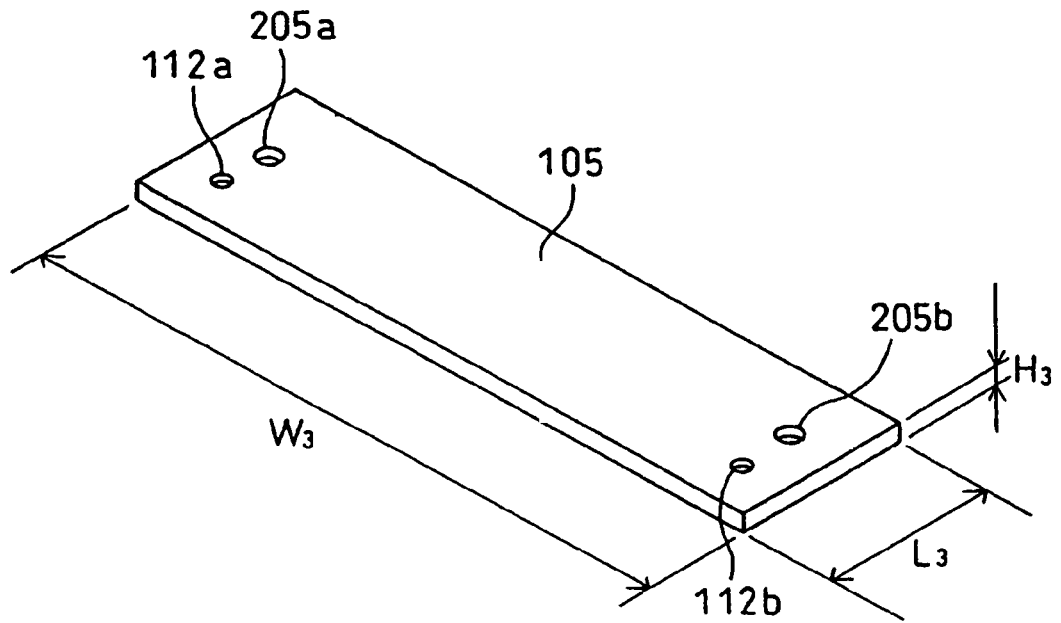
FIG. 29B is a schematic perspective view showing holding block 105.

Explanation next regards the fifth embodiment of the present invention. FIG. 26A is a schematic perspective view showing the circuit board device according to the present embodiment, FIG. 26B is a sectional view taken along line A-A in FIG. 26A, and FIG. 26C is a sectional view taken along line B-B in FIG. 26A. FIG. 27 is an exploded perspective view showing the configuration and the wiring board interconnection method of the circuit board device according to the present embodiment, and FIG. 28 is a schematic perspective view showing functional block 104. FIG. 29A is a schematic perspective view showing holding block 106, and FIG. 29B is a schematic sectional view showing holding block 105. In FIGS. 26 to 29, constituent elements identical to FIGS. 7 to 25 are given the same reference numbers, and explanation regarding these elements is omitted.

In the circuit board device according to the present embodiment, functional block 104 is used as the power-supply lines of LSI (Large-Scale Integration) 901 mounted on the front surface of first wiring board 101. In other words, functional block 104 is connected to the power supply.

First wiring board 101 can employ a rigid printed wiring board that takes, for example, FR4 as its base material. Positioning through-holes 109*a* and 109*b* and screw clearance through-holes 201*a* and 201*b* are provided in first wiring board 101. The front surface of first wiring board 101 is provided with electrode terminals 107 for signal connection, and further, LSI 901 is mounted and power-supply line connection terminal 902 connected to this LSI 901 is further provided. In addition, conductive material 122 is applied to the surfaces of this power-supply line connection terminal 902.

Second wiring board 102 can employ, for example, a flexible printed wiring board that takes a polyimide as its base material. Second wiring board 102 is provided with positioning through-holes 110*a* and 110*b* as well as with screw clearance through-holes 202*a* and 202*b*. In addition, electrode terminals 108 for signal connection having a one-to-one correspondence with electrode terminals 107 for signal connection of first wiring board 101 are provided on the back surface of second wiring board 102. In addition, power-supply line connection terminal 903 having conductive material 122 applied to its surface is provided at a position corresponding to power-supply line connection terminal 902 provided on first wiring board 101.

Here, a board having a thickness of 0.7 mm can be used as first wiring board 101 and a board having a thickness of 0.2 mm can be used as second wiring board 102. Regarding electrode terminals 107 provided on the front surface of first wiring board 101 and electrode terminals 108 provided on the back surface of second wiring board 102, the number of terminals of each can be 25, the pitch in the longitudinal direction can be 0.3 mm (L/S=0.15/0.15), the pitch in the lateral direction can be 0.8 mm, the dimensions of the terminals can be 0.15 mm (W)×0.5 mm (L), and the terminals can be arranged in staggered rows (12 terminals in the row close to the edge of the board and 13 terminals in the other row). In addition, power-supply line connection terminals 902 and 903 each have terminal dimensions of 0.9 mm (W)×0.3 mm (L), and power-supply line connection terminal 902 can be formed at a position that is at a distance of 0.775 mm from the outermost terminals of wiring board inner side of electrode terminals 107. Power-supply line connection terminal 903 can be formed at a position that is at a distance of 0.775 mm from the outermost terminal of the wiring board inner side of electrode terminals 108. Silver paste can then be applied by a dispensing method as the conductive material 122 applied to the surfaces of power-supply line connection terminals 902 and 903.

Functional block 104 uses a metal material as its base material, and is provided with positioning through-holes 111*a* and 111*b* as well as screw clearance through-holes 203*a* and 203*b* as shown in FIG. 28. Connection cavity 904 is provided on the back surface of functional block 104 at a position that corresponds to power-supply line connection terminal 902 provided on first wiring board 101. In addition, connection cavity 905 is provided on the front surface of functional block 104 at a position that corresponds to power-supply line connection terminal 903 provided on second wiring board 102. Functional block 104 further has a frame shape provided with through-window 123 as the opening into which anisotropic conductive member 103 is inserted. Anisotropic conductive member 103 is inserted in this through-window 123. Taking into consideration the amount of spread of the surfaces of anisotropic conductive member 103 that contact each wiring board when anisotropic conductive member 103 is compressed to the thickness of functional block 104 plus a certain amount of margin, this through-window 123 is formed larger than the outer shape of anisotropic conductive member 103. In addition, the thickness of anisotropic conductive member 103 is formed greater than the thickness of functional block 104. Anisotropic conductive member 103 can use the same element as in the second embodiment.

Here, functional block 104 employs, for example, aluminum having a high conductivity as its metal material, and the thickness H2 of functional block 104 can be made, for example, H2=0.25 mm (compressibility 16.7%) to guarantee an amount of compression of from 10% to 45% at which anisotropic conductive member 103 has electrical resistance that is stabilized as shown in FIG. 17 compared to the resistance of anisotropic conductive member 103 when the thickness H1 of anisotropic conductive member 103 is compressed.

The insulating elastic resin material that is the base material of anisotropic conductive member 103 has a property whereby the volume does not change even after compression. As a result, calculation of the amount of spread $\delta$ in the direction of the front and back surfaces of the wiring boards by the above-described Equation 1 that shows the relationship before and after compression of the insulating elastic resin material yields $\delta=0.180625$ mm. As a result, taking into consideration this amount of spread $\delta$ plus a certain amount of margin, the dimensions can be made:

W21=W1+0.2 mm=4.4 mm
L21=L1+0.2 mm=1.4 mm
W2=7.4 mm
L2=2.3 mm

In addition, the dimensions of connection cavities 904 and 905 can each be made 1.0 mm (W)×0.4 mm (L)×0.07 mm (D).

Holding blocks 105 and 106 are blocks that take a metal material as their base material, and as shown in FIG. 29A, positioning through-holes 113a and 113b as well as screw clearance through-holes 204a and 204b are provided in holding block 106. In addition, as shown in FIG. 29B, holding block 105 is provided with positioning through-holes 112a and 112b as well as screw fastening tap-holes 205a and 205b.

Here, holding blocks 105 and 106 can employ, for example, stainless steel as their metal material, and the dimensions of each can be made W3=7.4 mm, L3=2.3 mm and H3=0.5 mm to equal functional block 104.

The wiring board interconnection method of the circuit board device according to the present embodiment is equivalent to the wiring board interconnection method of a circuit board device according to the above-described second embodiment.

According to the above-described configuration, functional block 104 and anisotropic conductive member 103 are clamped between first wiring board 101 and second wiring board 102. At this time, anisotropic conductive member 103 is inserted in through-window 123 provided in functional block 104. In addition, positioning through-holes 112a and 112b provided in holding block 105, positioning through-holes 109a and 109b provided in first wiring board 101, positioning through-holes 111a and 111b provided in functional block 104, positioning through-holes 110a and 110b provided in second wiring board 102, and positioning through-holes 113a and 113b provided in holding block 106 are fitted over positioning pins 124a and 124b provided in positioning jig 125, whereby each component is accurately positioned.

In this state, first wiring board 101 and second wiring board 102 that are arranged with functional block 104 and anisotropic conductive member 103 interposed are clamped by holding block 105 and holding block 106. Screw 206a is then fastened into screw fastening tap-hole 205a provided in holding block 105 from screw clearance through-hole 204a provided in holding block 106 and by way of screw clearance through-holes 202a, 203a, and 201a. In addition, screw 206b is similarly fastened into screw fastening tap-hole 205b provided in holding block 105 from screw clearance through-hole 204b provided in holding block 106 and by way of screw clearance through-holes 202b, 203b, and 201b. Anisotropic conductive member 103 is thus compressed to the thickness of functional block 104.

By means of the above-described procedure, electrode terminals 107 provided on the front surface of first wiring board 101 and electrode terminals 108 provided on the back surface of second wiring board 102 are electrically connected by the conductors of anisotropic conductive member 103. At this time, the spreading of anisotropic conductive member 103 such that the area of the surfaces of anisotropic conductive member 103 that contact each wiring board increases in through-window 123 prevents the impact resilience applied by anisotropic conductive member 103 in the direction of compression from becoming excessive.

In addition, power-supply line connection terminal 902 that is provided on the front surface of first wiring board 101 and that has conductive material 122 applied to its surfaces contacts connection cavity 904 provided in the back surface of functional block 104 that takes a metal material as its base material. In addition, connection cavity 905 provided in the front surface of functional block 104 contacts power-supply line connection terminal 903 that is provided on the back surface of second wiring board 102 and that has conductive material 122 applied to its surface. As a result, power-supply line connection terminal 902 provided on the front surface of first wiring board 101 and power-supply line connection terminal 903 provided on the back surface of second wiring board 102 are electrically connected by way of conductive material 122 and functional block 104. Functional block 104 is then connected to the power supply, whereby the circuit board device according to the present embodiment is configured.

The circuit board device according to the present embodiment uses functional block 104 as the power-supply lines of LSI 901, whereby the cross-sectional area of the power-supply lines is extremely large. As a result, the amount of current per unit cross-sectional area of the power-supply line can be decreased. The generation of heat of the electrical connections can therefore be suppressed, and the need to distribute the power-supply line among a plurality of lines to decrease the amount of current per connection terminal can be eliminated. As a result, miniaturization that accompanies a slimmer and space-saving electronic apparatus can be realized.

Although an example was shown in which the circuit board device according to the present embodiment used a rigid printed wiring board that takes FR4 as its base material as first wiring board 101 and a flexible printed wiring board that takes polyimide as its base material as second wiring board 102, the present invention is not limited to this form, and a rigid printed wiring board and flexible printed wiring board can be combined in any way.

In addition, although functional block 104 had thickness H2 of 0.25 mm in the present embodiment, the present invention is not limited to this form, and the same effect can be obtained as long as thickness H2 of functional block 104 is set to a thickness that can guarantee an amount of compression of from 10% to 45% that realizes anisotropic conductive member 103 having a stabilized electrical resistance.

Although holding blocks 105 and 106 used a metal material as their base material in the present embodiment, the present invention is not limited to this form, and a resin material or a ceramic material can also be used. In addition, although the plate thickness H3 of holding blocks 105 and 106 was 0.5 mm, the present invention is not limited to this form. The same effect can be obtained regardless of the plate thickness H3 of holding blocks 105 and 106 as long as the thickness can guarantee an amount of compression from 10% to 45% at which a stable electrical resistance of anisotropic conductive member 103 can be obtained.

In addition, positioning of the wiring boards, positioning of wiring boards and holding blocks, and positioning of each wiring board and functional block 104 is not limited to the method of fitting positioning through-holes formed in each wiring board, functional block 104, and each holding block onto positioning pins 124a and 124b provided on positioning jig 125. Alignment marks can be formed on each wiring board, functional block 104, and each holding block and positioning of these components can then be realized by observing these alignment marks by a CCD (Charge Coupled Device) camera.

Figure 30A:
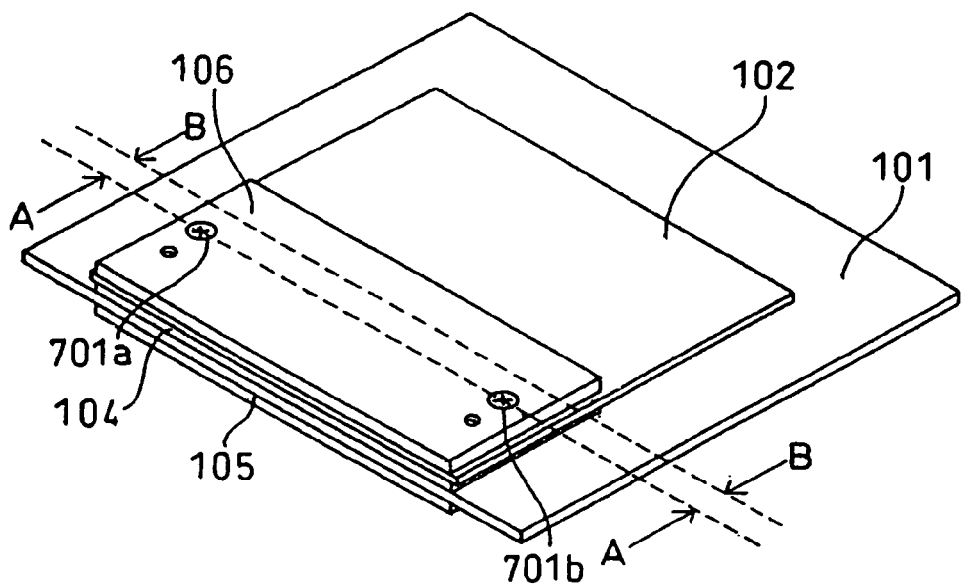
FIG. 30A is a schematic perspective view showing the circuit board device according to the sixth embodiment.
Figure 30B:
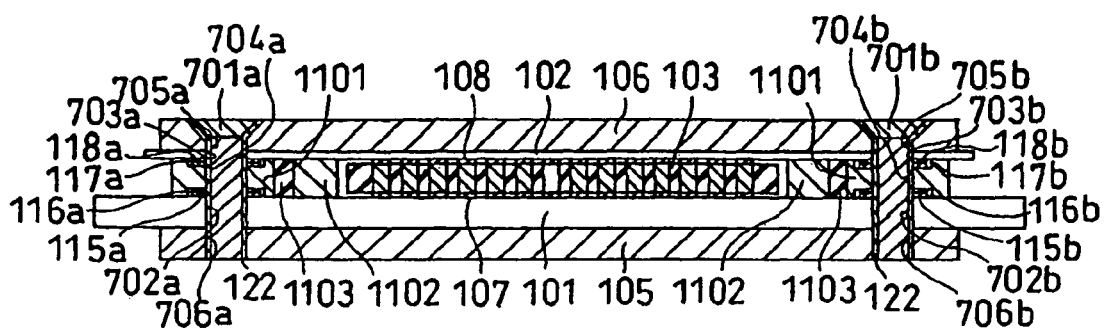
FIG. 30B is a sectional view taken along line A-A in FIG. 30A.
Figure 30C:
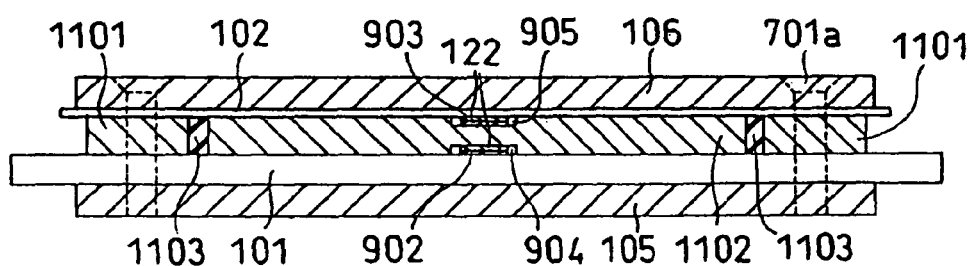
FIG. 30C is a sectional view taken along line B-B in FIG. 30A.
Figure 31:
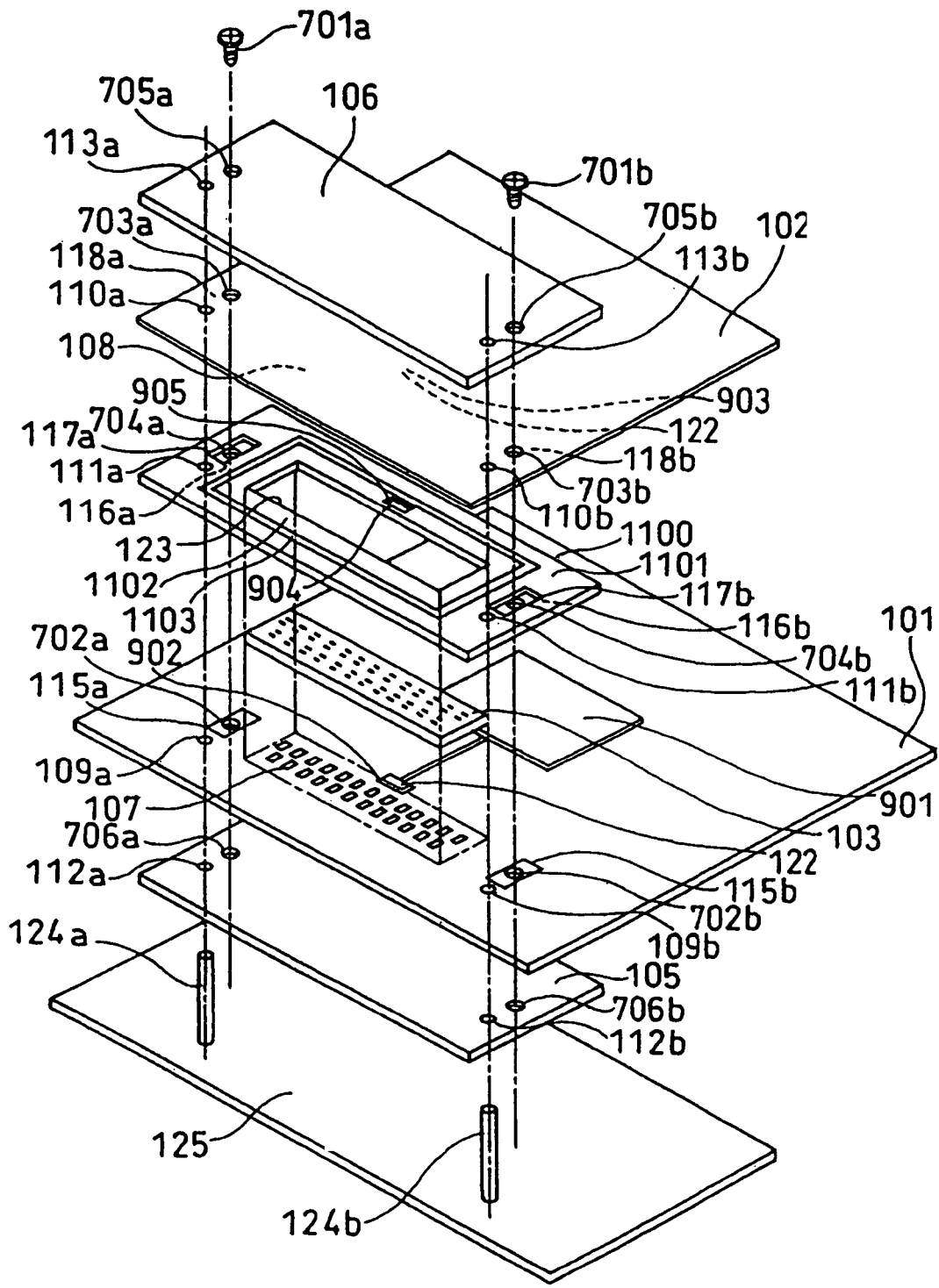
FIG. 31 is an exploded perspective view showing the configuration of a circuit board device and a wiring board interconnection method.
Figure 32:
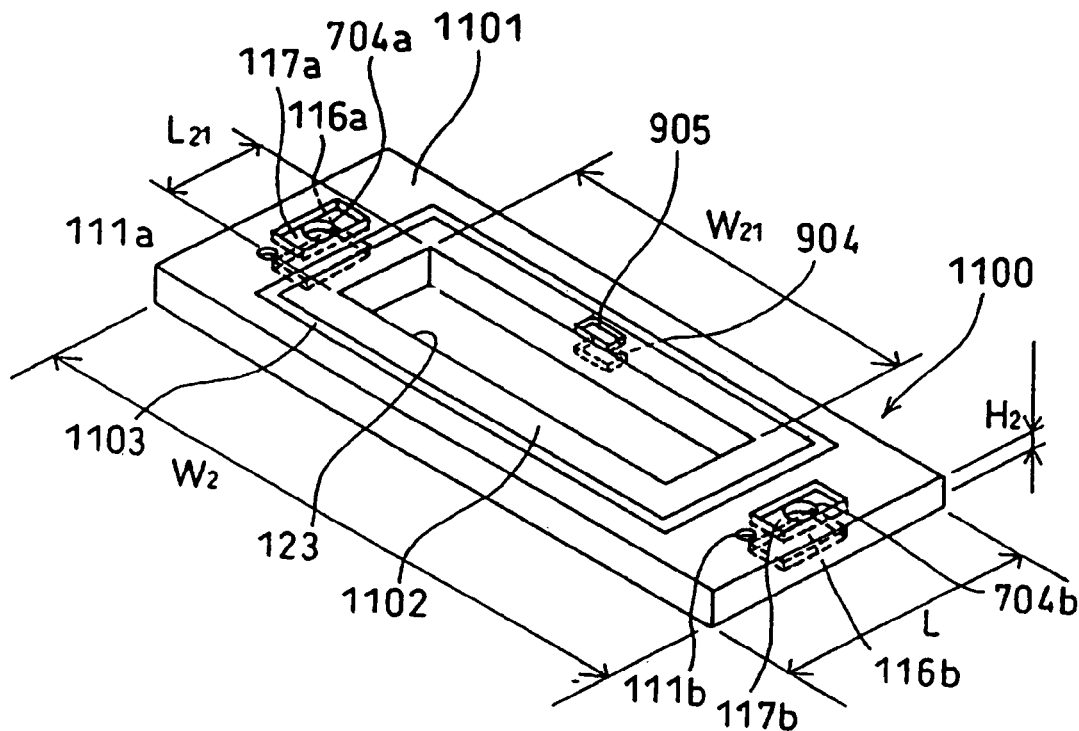
FIG. 32 is a schematic perspective view showing functional block 1100.
Figure 33A:
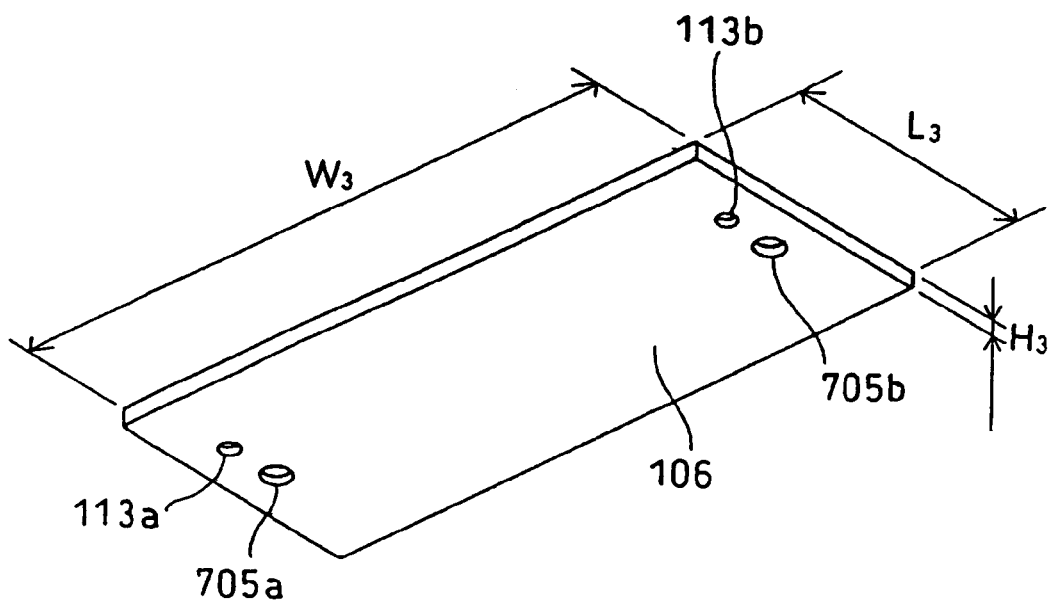
FIG. 33A is a schematic perspective view showing holding block 106.
Figure 33B:
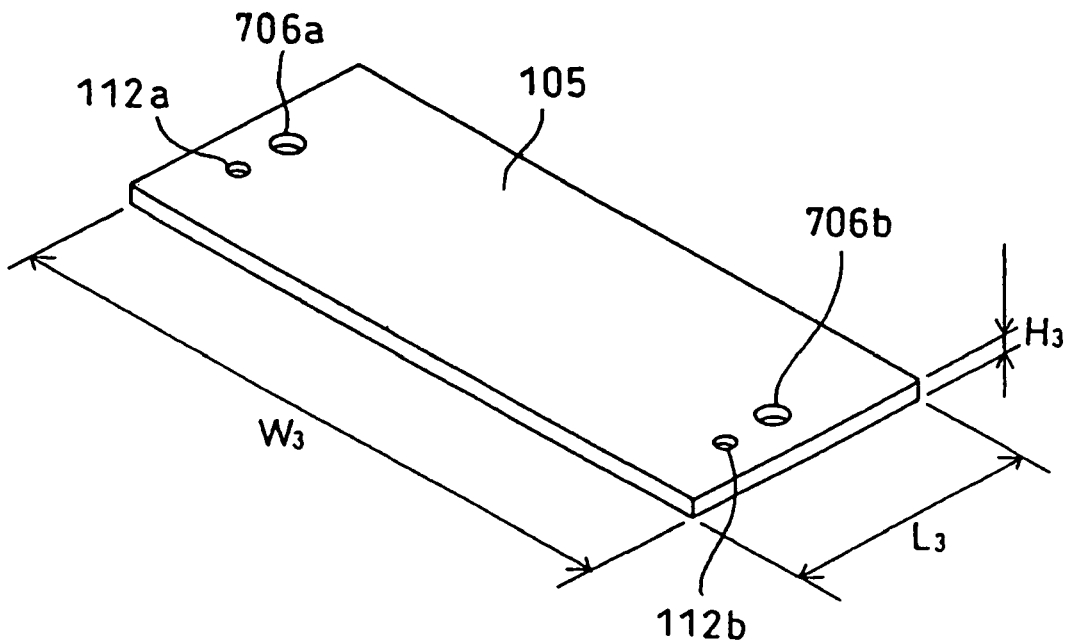
FIG. 33B is a schematic perspective view showing holding block 105.

Explanation next regards the sixth embodiment of the present invention. FIG. 30A is a schematic perspective view showing the circuit board device according to the present embodiment, FIG. 30B is a sectional view taken along line A-A in FIG. 30A, and FIG. 30C is a sectional view taken along line B-B in FIG. 30A. FIG. 31 is an exploded perspective view showing the configuration and wiring board interconnection method of the circuit board device according to the present embodiment, and FIG. 32 is a schematic perspective view showing functional block 1100. FIG. 33A is a schematic perspective view showing holding block 106, and FIG. 33B is a schematic perspective view showing holding block 105. Constituent elements in FIGS. 31 to 33 that are identical to elements in FIGS. 7 to 30 are given the same reference numbers, and detailed explanation of these elements is omitted.

In the circuit board device according to the present embodiment, functional block 1100 is divided between common GND unit 1101 as a first block and, as a second block, power-supply line unit 1102 that is used as the power-supply line of LSI 901 that is mounted on the front surface of first wiring board 101 as shown in FIG. 32. Common GND unit 1101 and power-supply line unit 1102 are insulated and isolated by insulating resin 1103. Common GND unit 1101 is connected to GND, and power-supply line unit 1102 is connected to the power supply.

First wiring board 101 can use, for example, a rigid printed wiring board that takes FR4 as its base material. Positioning through-holes 109a and 109b are provided in first wiring board 101. In addition, electrode terminals 107 for signal connection are provided on the front surface of first wiring board 101. Common GND terminals 115a and 115b are further provided on the same surface as these electrode terminals 107. Conductive material 122 is applied to the surfaces of these common GND terminals 115a and 115b. Common GND linking through-holes 702a and 702b are then formed on these common GND terminals 115a and 115b that have conductive material 122 applied to their surfaces, and GND electrodes (not shown) are provided exposed from the inner walls of these common GND linking through-holes 702a and 702b. In addition, LSI 901 is further mounted on the front surface of first wiring board 101, and power-supply line connection terminal 902 is provided that is connected to this LSI 901. Conductive material 122 is then applied to the surface of this power-supply line connection terminal 902.

Second wiring board 102 can employ, for example, a flexible printed wiring board that takes polyimide as its base material. Positioning through-holes 110a and 110b are provided on second wiring board 102. In addition, electrode terminals 108 for signal connection are provided on the back surface of second wiring board 102. Still further, common GND terminals 118a and 118b are provided on the same surface as these electrode terminals 108. Conductive material 122 is applied to the surfaces of these common GND terminals 118a and 118b. Common GND linking through-holes 703a and 703b are then formed in common GND terminals 118a and 118b that have conductive material 122 applied to their surfaces, and GND electrodes (not shown) are provided exposed from the inner walls of these common GND linking through-holes 703a and 703b. Finally, power-supply line connection terminal 903 that has conductive material 122 applied to its surface is provided on the back surface of second wiring board 102 at a position corresponding to power-supply line connection terminal 902 that was provided on first wiring board 101.

Here, a board having a thickness of 0.7 mm can be used as first wiring board 101, and a board having a thickness of 0.2 mm can be used as second wiring board 102. Regarding electrode terminals 107 provided on the front surface of first wiring board 101 and electrode terminals 108 provided on the back surface of second wiring board 102, the number of electrodes for each can be 25, the pitch in the longitudinal direction can be 0.3 mm (L/S=0.15/0.15), the pitch in the lateral direction can be 0.8 mm, the terminal dimensions can be 0.15 mm (W)×0.5 mm (L), and the terminals can be arranged in staggered rows (with 12 electrodes in the row close to the board edge and 13 electrodes in the other row).

Common GND terminals 115a, 115b, 118a, and 118b can each have the terminal dimensions 1.5 mm (W)×2.0 mm (L). Common GND terminals 115a and 115b can be provided with centers common to common GND linking through-holes 702a and 702b that are formed with a diameter of 1.5 mm and at positions that are at a distance of 0.55 mm from the outermost terminal of electrode terminals 107. Common GND terminals 118a and 118b can be provided to have centers in common with common GND linking through-holes 703a and 703b that are formed with a diameter of 1.5 mm at positions that are at a distance of 0.55 mm from the outermost terminal of electrode terminals 108.

In addition, connection terminals 902 and 903 for power-supply lines can each have terminal dimensions of 0.9 mm (W)×0.3 mm (L). Power-supply line connection terminal 902 can be formed at a position that is at a distance of 0.775 mm from the outermost terminal on the wiring board inner side of electrode terminals 107. Power-supply line connection terminal 903 can be formed at a position that is at a distance of 0.775 mm from the outermost terminal on the wiring board inner side of electrode terminals 108. Then, as conductive material 122, silver paste can be applied by a dispensing method to the surfaces of power-supply line connection terminals 902 and 903.

Functional block 1100 takes a metal material as its base material, and is provided with positioning through-holes 111a and 111b as shown in FIG. 32. Connection cavities 116a and 116b are provided on the back surface of functional block 1100 at positions that correspond to common GND terminals 115a and 115b provided on first wiring board 101. Connection cavities 117a and 117b are provided on the front surface of functional block 1100 at positions that correspond to common GND terminals 118a and 118b provided on second wiring board 101. Common GND linking through-holes 704a and 704b are then provided at these connection cavities 116a and 117a as well as at connection cavities 116b and 117b. Connection cavity 904 is further provided on the back surface of functional block 1100 at a position that corresponds to power-supply line connection terminal 902 provided on first wiring board 101. Connection cavity 905 is further provided on the front surface of functional block 1100 at a position that corresponds to power-supply line connection terminal 903 provided on second wiring board 102.

Functional block 1100 also has a frame shape provided with through-window 123 as an opening into which anisotropic conductive member 103 is inserted. Anisotropic conductive member 103 is inserted in this through-window 123. Taking into consideration the amount of spread of the surfaces of anisotropic conductive member 103 that contact each wiring board when anisotropic conductive member 103 is compressed to the thickness of functional block 1100 plus a certain margin, this through-window 123 is formed larger than the outer shape of anisotropic conductive member 103. In addition, the thickness of anisotropic conductive member 103 is formed greater than the thickness of functional block 1100. Anisotropic conductive member 103 can use the same element as in the second embodiment. In functional block 1100, the rim of through-window 123 functions as power-supply line unit 1102 and the outer periphery functions as common GND unit 1101. The boundaries of power-supply line unit 1102 and common GND unit 1101 are insulated and isolated by insulating resin 1103.

Here, functional block 104 employs, for example, aluminum having high conductivity as its metal material, and the thickness H2 of functional block 104 can be made, for example, H2=0.25 mm (compressibility 16.7%) to guarantee an amount of compression of from 10% to 45% shown in FIG. 17 at which anisotropic conductive member 103 has electrical resistance that is more stable than the resistance of anisotropic conductive member 103 when the thickness H1 of anisotropic conductive member 103 is compressed.

The insulating elastic resin material that is the base material of anisotropic conductive member 103 has a property whereby volume does not change even after compression. As a result, the calculation of the amount of spread δ in the direction toward the front and back surfaces of the wiring boards by the above-described Equation 1 that shows the relationship before and after the compression of the insulating elastic resin material yields δ=0.180625 mm, whereby, taking into consideration the amount of spread δ plus a certain amount of margin, the dimensions of anisotropic conductive member 103 can be made:

W21=W1+0.2 mm=4.4 mm
L21=L1+0.2 mm=1.4 mm
W2=10.85 mm
L2=5.3 mm

In addition, connection cavities 116a, 116b, 117a, and 117b can each be made: 0.5 mm (W)×1.0 mm (L)×0.07 mm (D). The diameters of common GND linking through-holes 704a and 704b can each be made 1.5 mm. The dimensions of connection cavities 904 and 905 can each be made 1.0 mm (W)×0.4 mm (L)×0.07 mm (D).

Holding blocks 105 and 106 are blocks that take a metal material as their base material. As shown in FIG. 33A, positioning through-holes 113a and 113b as well as common GND linking through-holes 705a and 705b are provided in holding block 106. In addition, as shown in FIG. 33B, positioning through-holes 112a and 112b as well as tap-holes 706a and 706b are provided in holding block 105, and these tap-holes 706a and 706b have the function of linking the common GND and screw fastening.

Holding blocks 105 and 106 employ, for example, aluminum having high conductivity as their metal material, and the dimensions of each can be made W3=10.85 mm, L3=5.3 mm, and H3=0.5 mm, the same as functional block 104.

The wiring board interconnection method of the circuit board device according to the present embodiment is similar to the wiring board interconnection method of the circuit board device according to the above-described second embodiment.

According to the above-described configuration, functional block 104 and anisotropic conductive member 103 are clamped between first wiring board 101 and second wiring board 102. At this time, anisotropic conductive member 103 is inserted inside through-window 123 provided in functional block 104. In addition, positioning through-holes 112a and 112b provided in holding block 105, positioning through-holes 109a and 109b provided in first wiring board 101, positioning through-holes 111a and 111b provided in functional block 104, positioning through-holes 110a and 110b provided in second wiring board 102, and positioning through-holes 113a and 113b provided in holding block 106 are fitted over positioning pins 124a and 124b provided in positioning jig 125 whereby each component is accurately positioned.

In this state, first wiring board 101 and second wiring board 102 that are arranged with functional block 104 and anisotropic conductive member 103 interposed are clamped by holding block 105 and holding block 106. Common GND linking screw 701a is then fastened to tap-hole 706a provided in holding block 105 from common GND linking through-hole 705a formed in holding block 106 and by way of common GND linking through-holes 703a, 704a, and 702a. Common GND linking screw 701b is similarly fastened into tap-hole 706b provided in holding block 105 from common GND linking through-hole 705b formed in holding block 106 and by way of common GND linking through-holes 703b, 704b, and 702b. As a result, anisotropic conductive member 103 is compressed to the thickness of functional block 104. At this time, the common GND linking through-holes and tap-holes are filled with conductive material 122.

In this way, electrode terminals 107 provided on the front surface of first wiring board 101 and electrode terminals 108 provided on the back surface of second wiring board 102 are electrically connected by the conductors of anisotropic conductive member 103. At this time, anisotropic conductive member 103 spreads in through-window 123 such that the area of the surfaces of contact with each wiring board increases, whereby impact resilience applied in the direction of compression by anisotropic conductive member 103 is prevented from becoming excessive.

Common GND terminals 115a and 115b that are provided on the front surface of first wiring board 101 and that have conductive material 122 applied to their surfaces are electrically connected to holding block 105 that takes a metal material as its base material by way of common GND linking screws 701a and 701b as well as conductive material 122. These common GND terminals 115a and 115b and functional block 104 are electrically connected by way of common GND linking screws 701a and 701b as well as conductive material 122. In addition, functional block 104 and common GND terminals 118a and 118b that are provided on the back surface of second wiring board 102 and that have conductive material 122 applied to their surfaces are electrically connected by way of common GND linking screws 701a and 701b and by conductive material 122. These common GND terminals 118a and 118b and holding block 106 are electrically connected by way of common GND linking screws 701a and 701b as well as by conductive material 122. Common GND unit 1101 is then connected to GND.

Power-supply line connection terminal 902 that is provided on the front surface of first wiring board 101 and that has conductive material 122 applied to its surfaces contacts connection cavity 904 that is provided on the back surface of functional block 104 that takes metal material as its base material. Further, connection cavity 905 that is provided on the front surface of functional block 104 and power-supply line connection terminal 903 that is provided on the back surface of second wiring board 102 and that has conductive material 122 applied to its surfaces come into contact. As a result, power-supply line connection terminal 902 that is provided on the front surface of first wiring board 101 and power-supply line connection terminal 903 that is provided on the back surface of second wiring board 102 are thus electrically connected by way of conductive material 122 and functional block 104. Common power-supply line unit 1102 is then connected to the power supply. The circuit board device according to the present embodiment is thus configured.

The circuit board device according to the present embodiment takes common GND unit 1101 of functional block 1100 as well as holding blocks 105 and 106 as the common GND, and moreover, takes power-supply line unit 1102 of functional block 1100 as the power-supply line of LSI 901 that is mounted on the front surface of first wiring board 101. As a result, electrical connections in which electrode terminals 107 of first wiring board 101 and electrode terminals 108 of second wiring board 102 are connected by anisotropic conductive member 103 and the electrical connection of power-supply line unit 1102 of functional block 1100 and power-supply line connection terminal 902 of LSI 901 that is mounted on the front surface of first wiring board 101 are enclosed by common GND unit 1101 of functional block 1100 and thus completely shielded against electromagnetic waves in directions parallel to the front and back surfaces of the wiring boards. The occurrence of electromagnetic interference (EMI) exerted upon other devices by unnecessary electromagnetic waves that are typically generated can be suppressed and electromagnetic susceptibility (EMS) to noise that intrudes from the outside can be improved in these electrical connections. In addition, complete shielding against electromagnetic waves is also realized in directions perpendicular to the front and back surfaces of the wiring boards by arranging holding blocks 105 and 106 that take a metal material as base material on the outermost surfaces of the circuit board device and by electrically connecting the common GND unit 1101 of functional block 1100 and vias that connect terminals formed on the front and back surfaces of first wiring board 101 and second wiring board 102 within the wiring boards.

In the present embodiment, power-supply line unit 1102 of functional block 1100 is used as the power-supply line of LSI 901, whereby the cross-sectional area is extremely large for a power-supply line. In this way, the amount of current per unit cross-sectional area of the power-supply line can be decreased, whereby the generation of heat of the electrical connection can be suppressed, the need to distribute the power-supply line among a plurality of lines to decrease the amount of current per connection terminal can be eliminated, and miniaturization that accompanies a slimmer and more compact electronic apparatus can be realized.

In the present embodiment, functional block 1100 is insulated and separated by insulating resin 1103 and thus divided between two blocks, one block being common GND unit 1101 that is used as the common GND and the other block being power-supply line unit 1102 that is used as the power-supply line of LSI 901 that is mounted on the front surface of first wiring board 101, but the present invention is not limited to this form. Both of these two blocks can be connected to GND and used as an analog common GND unit and a digital common GND unit. Similar to the above-described effects, this case also enables the realization of a circuit board device that, even when a high-frequency signal is applied, can suppress the occurrence of electromagnetic interference (EMI) that is exerted upon other devices by unnecessary electromagnetic waves that are generated and can improve the electromagnetic susceptibility (EMS) of electrical connections to noise that intrudes from the outside.

Figure 34A:
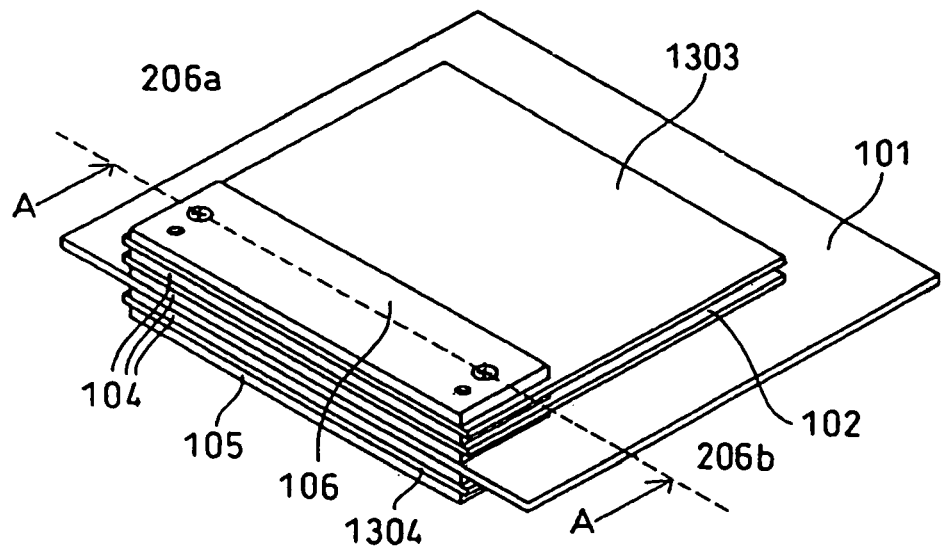
FIG. 34A is a schematic perspective view showing the circuit board device according to the seventh embodiment.
Figure 34B:
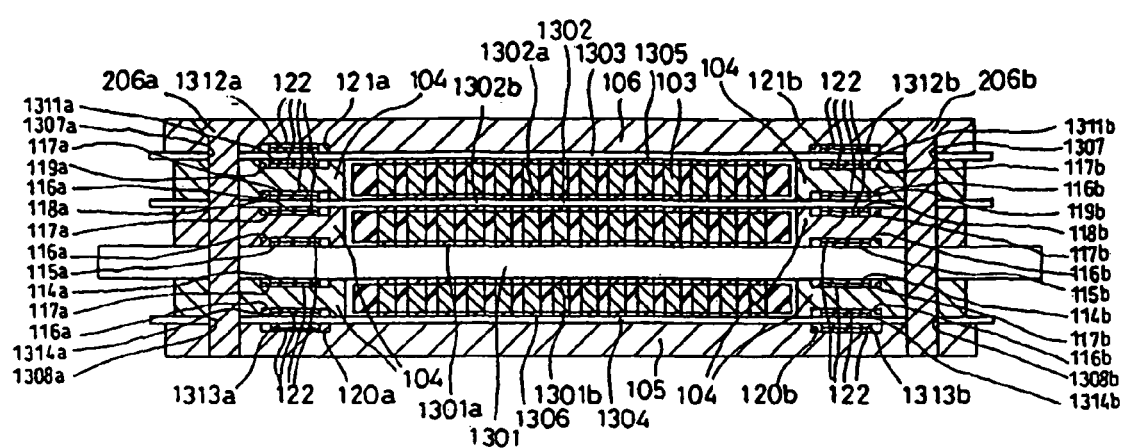
FIG. 34B is a sectional view taken along line A-A in FIG. 34A.
Figure 35:
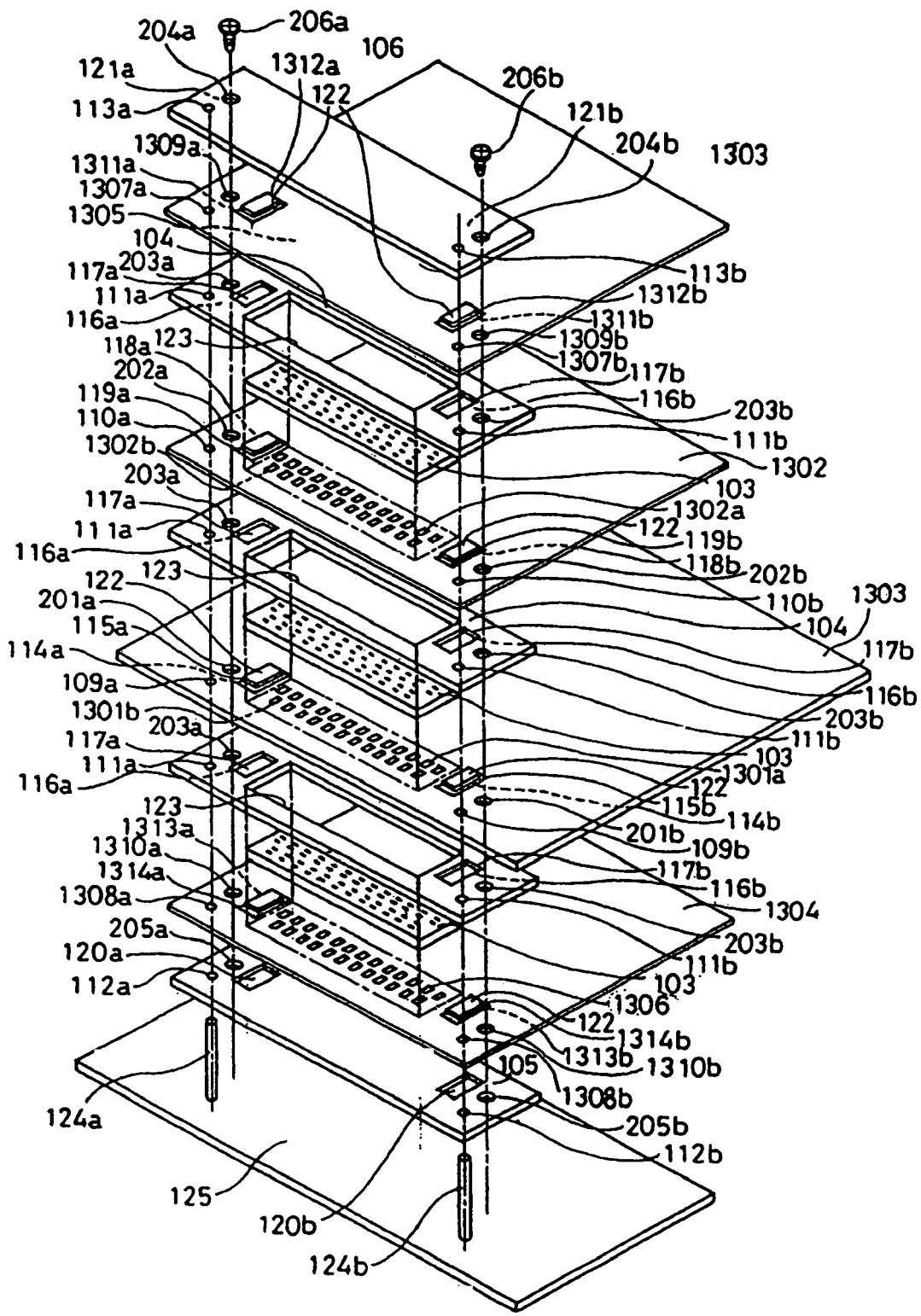
FIG. 35 is an exploded perspective view showing the configuration of the circuit board device and the wiring board interconnection method according to the seventh embodiment.

Explanation next regards the seventh embodiment of the present invention. FIG. 34A is a schematic perspective view showing the circuit board device according to the present embodiment, and FIG. 34B is a sectional view taken along line A-A in FIG. 34A. FIG. 35 is an exploded perspective view showing the configuration and wiring board interconnection method of the circuit board device according to the present embodiment. Constituent elements in FIGS. 34 and 35 that are identical to elements in FIGS. 7 to 33 are given the same reference numbers and detailed explanation of these elements is omitted.

The circuit board device according to the present embodiment is a four-layered stack having three stacked layers of wiring boards. Fourth wiring board 1304 having electrode terminals 1306 provided on the front surface, first wiring board 1301 having electrode terminals 1301b on its back surface and electrode terminals 1301a on its front surface, second wiring board 1302 having electrode terminals 1302b provided on its back surface and electrode terminals 1302a provided on its front surface, and third wiring board 1303 having electrode terminals 1305 provided on its back surface are stacked together between holding block 105 and holding block 106 with functional blocks 104 in which anisotropic conductive members 103 are inserted interposed between each pair of wiring boards. Pressure is then applied by screws 206a and 206b that compresses anisotropic conductive members 103 to the thickness of functional blocks 104 to secure these components.

The same components as described in the second embodiment can be used for anisotropic conductive members 103, functional blocks 104, and holding blocks 105 and 106.

Fourth wiring board 1304 can use, for example, a flexible printed wiring board that takes polyimide as its base material. Positioning through-holes 1308a and 1308b as well as screw clearance through-hole 1310a and 1310b are provided in fourth wiring board 1304. Common GND terminals 1313a and 1313b are provided on the back surface of fourth wiring board 1304, and conductive material 122 is applied to the surfaces of these common GND terminals 1313a and 1313b. In addition, electrode terminals 1306 for signal connection that have a one-to-one correspondence with electrode terminals 1301b for signal connection provided on the back surface of first wiring board 1301 are provided on the front surface of fourth wiring board 1304. Common GND terminals 1314a and 1314b are provided on the same surface as these electrode terminals 1306, and conductive material 122 is applied to the surfaces of these common GND terminals 1314a and 1314b. Common GND terminals 1313a and 1314a are then electrically connected by means of a via (not shown). Similarly, common GND terminals 1313b and 1314b are electrically connected by a via (not shown).

First wiring board 1301 can use, for example, a rigid printed wiring board that takes FR4 as its base material. Positioning through-holes 109a and 109b as well as screw clearance through-hole 201a and 201b are provided in first wiring board 1301. In addition, electrode terminals 1301b for signal connection that have a one-to-one correspondence with electrode terminals 13006 for signal connection provided on the front surface of fourth wiring board 1304 are provided on the back surface of first wiring board 1301. Common GND terminals 114a and 114b are provided on the same surface as these electrode terminals 1301b, and conductive material 122 is applied to the surfaces of these common GND terminals 114a and 114b. In addition, electrode terminals 1301a for signal connection that have a one-to-one correspondence with electrode terminals 1302b for signal connection provided on the back surface of second wiring board 1302 are provided on the front surface of first wiring board 1301. Common GND terminals 115a and 115b are provided on the same surface as these electrode terminals 1301a, and conductive material 122 is applied to the surfaces of these common GND terminals 115a and 115b. Common GND terminals 115a and 114a are then electrically connected by a via (not shown), and common GND terminals 115b and 114b are similarly electrically connected by a via (not shown).

Second wiring board 1302 can employ, for example, a flexible printed wiring board that takes polyimide as its base material. Positioning through-holes 110a and 110b as well as screw clearance through-hole 202a and 202b are provided in second wiring board 1302. In addition, electrode terminals 1302b for signal connection that have a one-to-one correspondence with electrode terminals 1301a for signal connection provided on the front surface of first wiring board 1301 are provided on the back surface of second wiring board 1302. Common GND terminals 118a and 118b are provided on the same surface as these electrode terminals 1302b, and conductive material 122 is applied to the surfaces of these common GND terminals 118a and 118b. Electrode terminals 1302a for signal connection that have a one-to-one correspondence to electrode terminals 1305 for signal connection provided on the back surface of third wiring board 1303 are provided on the front surface of second wiring board 1302. Common GND terminals 119a and 119b are provided on the same surface as these electrode terminals 1302a, and conductive material 122 is applied to the surfaces of these common GND terminals 119a and 119b. Common GND terminals 118a and 119a are then electrically connected by a via (not shown), and common GND terminals 118b and 119b are similarly electrically connected by a via (not shown).

Third wiring board 1303 can employ, for example, a flexible printed wiring board that takes polyimide as its base material. Positioning through-holes 1307a and 1307b as well as screw clearance through-holes 1309a and 1309b are provided in third wiring board 1303. In addition, electrode terminals 108 for signal connection that have a one-to-one correspondence with electrode terminals 1302a for signal connection provided on second wiring board 102 are provided on the back surface of third wiring board 1303. Common GND terminals 118a and 118b are provided on the same surface as these electrode terminals 108, and conductive material 122 is applied to the surfaces of these common GND terminals 1311a and 1311b. Common GND terminals 1312a and 1312b are provided on the front surface of third wiring board 1303, and conductive material 122 is applied to the surfaces of these common GND terminals 1312a and 1312b. Common GND terminals 1311a and 1312a are then electrically connected by via 3128a, and common GND terminals 1311b and 1312b are similarly electrically connected by via 3128b.

Here, a board having a thickness of 0.7 mm can be used as first wiring board 1301, boards having a thickness of 0.2 mm can be used as second wiring board 1302, third wiring board 1303, and fourth wiring board 1304. Regarding electrode terminals 1306 provided on the front surface of fourth wiring board 1304, electrode terminals 1301b provided on the back surface and electrode terminals 1301a provided on the front surface of first wiring board 1301, electrode terminals 1302b provided on the back surface and electrode terminals 1302a provided on the front surface of second wiring board 1302, and electrode terminals 1303 provided on the back surface of third wiring board 1303, the number of terminals of each can be 25, the pitch in the longitudinal direction can be 0.3 mm (L/S=0.15/0.15), the pitch in the lateral direction can be 0.8 mm, the terminal dimensions can be 0.15 mm (W)×0.5 mm (L), and the terminals can be arranged in staggered rows (with 12 terminals in the row close to the board edge and 13 terminals in the other row).

The terminal dimensions of each of common GND terminals 1313a, 1313b, 1314a, 1314b, 114a, 114b, 115a, 115b, 118a, 118b, 119a, 119b, 1311a, 1311b, 1312a, and 1312b can be made 0.4 mm (W)×0.9 mm (L). Common GND terminals 1314a and 1314b can be formed at positions at a distance of 0.55 mm from the outermost terminals of electrode terminals 1306. Common GND terminals 114a and 114b can be formed at positions that are at a distance of 0.55 mm from the outermost terminals of electrode terminals 1301b. Common GND terminals 115a and 115b can be formed at positions that are at a distance of 0.55 mm from the outermost terminals of electrode terminals 1301a. Common GND terminals 118a and 118b can be formed at positions that are at a distance of 0.55 mm from the outermost terminals of electrode terminals 1302b. Common GND terminals 119a and 119b can be formed at positions that are at a distance of 0.55 mm from the outermost terminals of electrode terminals 1302a. Common GND terminals 1311a and 1311b can be formed at positions that are at a distance of 0.55 mm from the outermost terminals of electrode terminals 1305.

Common GND terminals 1313a and 1313b are provided on the back surface of fourth wiring board 1304, i.e., on the surface of fourth wiring board 1304 that confronts holding block 105 at positions projected from common GND terminals 1314a and 1314b provided on the front surface of fourth wiring board 1304. Common GND terminals 1312a and 1312b are provided on the front surface of third wiring board 1303, i.e., on the surface that confronts holding block 106 at positions projected from common GND terminals 1311a and 1311b provided on the back surface of third wiring board 1303. As conductive material 122, silver paste can be applied by a dispensing method to the surfaces of each of common GND terminals 1313a, 1313b, 1314a, 1314b, 114a, 114b, 115a, 115b, 118a, 118b, 119a, 119b, 1311a, 1311b, 1312a, and 1312b.

Explanation next regards the wiring board interconnection method of the circuit board device according to the present embodiment. As shown in FIG. 35, positioning through-holes 112a and 112b provided in holding block 105 are fitted over positioning pins 124a and 124b provided on positioning jig 125. Positioning through-holes 1308a and 1308b provided in fourth wiring board 1304 are then fitted onto positioning pins 124a and 124b from above. Positioning through-holes 111a and 111b provided in functional block 104 are next fitted onto positioning pins 124a and 124b from above. Anisotropic conductive member 103 is inserted into through-window 123 that is formed in this functional block 104, and metal fine lines are embedded in this anisotropic conductive member 103 in a direction perpendicular to the surface of fourth wiring board 1304 at positions that correspond to electrode terminals 1306 provided on the front surface of fourth wiring board 1304.

Positioning through-holes 109a and 109b provided in first wiring board 1301 are next fitted onto positioning pins 124a and 124b from above functional block 104. Electrode terminals 1301b provided on the back surface of first wiring board 1301 have a one-to-one correspondence to electrode terminals 1306 of fourth wiring board 1304. Accordingly, metal fine lines embedded in anisotropic conductive member 103 that is arranged between fourth wiring board 1304 and first wiring board 1301 are embedded in a direction that is also perpendicular to the back surface of first wiring board 1301 and have a one-to-one correspondence to electrode terminals 1301b provided on the back surface of first wiring board 1301.

Positioning through-holes 111a and 111b provided in functional block 104 are then fitted onto positioning pins 124a and 124b from above. Anisotropic conductive member 103 is inserted into through-window 123 that is formed in this functional block 104. Metal fine lines are embedded in this anisotropic conductive member 103 in a direction perpendicular to the front surface of first wiring board 1301 at positions that correspond to electrode terminals 1301a provided on the front surface of first wiring board 1301.

Positioning through-holes 110a and 110b provided on second wiring board 1302 are further fitted over positioning pins 124a and 124b from above functional block 104. Electrode terminals 1302b provided on the back surface of second wiring board 1302 have a one-to-one correspondence to electrode terminals 1301a of first wiring board 1301. Accordingly, the metal fine lines embedded in anisotropic conductive member 103 that is arranged between first wiring board 1301 and second wiring board 1302 are embedded in a direction that is also perpendicular to the back surface of second wiring board 1302 and also have a one-to-one correspondence to electrode terminals 1302b provided on the back surface of second wiring board 1302.

Positioning through-holes 111a and 111b provided in functional block 104 are then fitted onto positioning pins 124a and 124b from above these components. Anisotropic conductive member 103 is inserted in through-window 123 that is formed in this functional block 104. Metal fine lines are embedded in this anisotropic conductive member 103 in a direction perpendicular to the front surface of second wiring board 1302 at positions that correspond to electrode terminals 1302a provided in the front surface of second wiring board 1302.

Positioning through-holes 1307a and 1307b provided on third wiring board 1303 are further fitted onto positioning pins 124a and 124b from above functional block 104. Electrode terminals 1305 provided on the back surface of third wiring board 1303 have a one-to-one correspondence to electrode terminals 1302a of second wiring board 1302. Accordingly, metal fine lines embedded in anisotropic conductive member 103 that is arranged between second wiring board 1302 and third wiring board 1303 are embedded in a direction perpendicular to the back surface of third wiring board 1303 and have a one-to-one correspondence with electrode terminals 1305 provided on the back surface of third wiring board 1303.

Positioning through-holes 113a and 113b provided in holding block 106 are then fitted onto positioning pins 124a and 124b from over these components. At this time, positioning through-holes 112a and 112b provided in holding block 105, positioning through-holes 1308a and 1308b provided in fourth wiring board 1304, positioning through-holes 111a and 111b provided in functional block 104, positioning through-holes 109a and 109b provided in first wiring board 101, positioning through-holes 111a and 111b provided in functional block 104, positioning through-holes 110a and 110b provided in second wiring board 102, positioning through-holes 111a and 111b provided in functional block 104, positioning through-holes 1307a and 1307b provided in third wiring board 1303, and positioning through-holes 113a and 113b provided in holding block 106 are fitted onto positioning pins 124a and 124b provided on positioning jig 125, whereby each component is accurate positioned.

In this state, fourth wiring board 1304, first wiring board 1301, second wiring board 1302, and third wiring board 1303 are clamped between holding block 105 and holding block 106 with functional blocks 104 and anisotropic conductive members 103 interposed. Screw 206a is fastened to screw fastening tap-hole 205a provided in holding block 105 from screw clearance through-hole 204a formed in holding block 106 and by way of screw clearance through-holes 1309a, 203a, 202a, 203a, 201a, 203a, and 1310a. Screw 206b is similarly fastened to screw fastening tap-hole 205b provided in holding block 105 from screw clearance through-hole 204b formed in holding block 106 and by way of screw clearance through-holes 1309b, 203b, 202b, 203b, 201b, 203b, and 1310b. In this way, anisotropic conductive members 103 are compressed to the thickness of functional blocks 104.

By means of the foregoing procedure, electrode terminals 1306 provided on the front surface of fourth wiring board 1304 and electrode terminals 1301b provided on the back surface of first wiring board 1301 are electrically connected by the conductors of anisotropic conductive member 103. In addition, electrode terminals 1301a provided on the front surface of first wiring board 1301 and electrode terminals 1302b provided on the back surface of second wiring board 1302 are electrically connected by the conductors of anisotropic conductive member 103. Still further, electrode terminals 1306 provided on the front surface of second wiring board 1302 and electrode terminals 1301b provided on the back surface of first wiring board 1301 are electrically connected by the conductors of anisotropic conductive member 103. Electrode terminals 1302a provided on the front surface of second wiring board 1302 and electrode terminals 1305 provided on the back surface of third wiring board 1303 are electrically connected by means of the conductors of anisotropic conductive member 103. At this time, the spreading of anisotropic conductive members 103 in through-windows 123 such that the areas of the surfaces of contact with each wiring board increase prevents the impact resilience by anisotropic conductive members 103 in the direction of compression from becoming excessive.

At this time, connection cavities 120a and 120b provided in holding block 105 come into contact with common GND terminals 1313a and 1313b that are provided on the back surface of fourth wiring board 1304 and that have conductive material 122 applied to their surfaces. These common GND terminals 1313a and 1313b and common GND terminals 1314a and 1314b that are provided on the front surface of fourth wiring board 1304 and that have conductive material 122 applied to their surfaces are each electrically connected by vias (not shown). These common GND terminals 1314a and 1314b then come into contact with connection cavities 116a and 116b that are provided on the back surface of functional block 104 that takes a metal material as its base material.

Common GND terminals 114a and 114b that are provided on the back surface of first wiring board 1301 and that have conductive material 122 applied to their surfaces contact connection cavities 117a and 117b that are provided on the front surface of functional block 104. These common GND terminals 114a and 114b, and common GND terminals 115a and 115b, that are provided on the front surface of first wiring board 1301 and that have conductive material 122 applied to their surfaces, are each electrically connected by vias (not shown). These common GND terminals 115a and 115b contact connection cavities 116a and 116b that are provided on the back surface of functional block 104 that takes a metal material as its base material.

Common GND terminals 118a and 118b that are provided on the back surface of second wiring board 1302 and that have conductive material 122 applied to their surfaces contact connection cavities 117a and 117b that are provided on the front surface of functional block 104. These common GND terminals 118a and 118b and common GND terminals 119a and 119b that are provided on the front surface of second wiring board 1302 and that have conductive material 122 applied to their surfaces are each electrically connected by vias (not shown). These common GND terminals 119a and 119b then contact connection cavities 116a and 116b that are provided on the back surface of functional block 104 that takes a metal material as its base material.

Common GND terminals 1311a and 1311b that are provided on the back surface of third wiring board 1303 and that have conductive material 122 applied to their surfaces contact connection cavities 117a and 117b that are provided on the front surface of functional block 104. These common GND terminals 1311a and 1311b and common GND terminals 1312a and 1312b that are provided on the front surface of third wiring board 1303 and that have conductive material 122 applied to their surfaces are electrically connected by vias (not shown). These common GND terminals 1312a and 1212b then contact connection cavities 121a and 121b that are provided on the back surface of holding block 106 that takes a metal material as its base material. Functional blocks 104 and holding blocks 105 and 106 are then connected to GND, whereby the circuit board device according to the present embodiment is configured.

As described hereinabove, the circuit board device according to the present embodiment is constructed by using anisotropic conductive members 103 inserted in through-windows 123 of functional blocks 104 as the electrical connection media between a plurality of wiring boards and then clamping, compressing, and securing these wiring boards by holding blocks 105 and 106. At this time, functional blocks 104 and holding blocks 105 and 106 are connected to GND. As a result, electrical connections between fourth wiring board 1304 and first wiring board 1301, between first wiring board 1301 and second wiring board 1302, and between second wiring board 1302 and third wiring board 1303 are enclosed by functional blocks 104 that take a metal material having high conductivity as their base material in directions parallel to the front and back surfaces of each wiring board. As a result, complete shielding against electromagnetic waves can be realized, the occurrence of electromagnetic interference (EMI) exerted upon other devices by unnecessary electromagnetic waves that are typically generated can be suppressed, and electromagnetic susceptibility (EMS) against noise that intrudes from outside of electrical connections can be improved.

In this case, the portion that is determined by the electrical connection pitch between functional block 104 and holding block 105 and the thickness of fourth wiring board 1304, that is electrically nonconductive and that can be ignored considerations of electric matter is taken as a first opening. In this case, the electrical pitch between functional block 104 and holding block 105 is 4.85 mm and the thickness of fourth wiring board 1304 is 0.2 mm in the circuit board device according to the present embodiment, whereby the opening circumference L of this first opening is 10.1 mm (=4.85×2+0.2×2).

In addition, the portion that is determined by the electrical connection pitch between functional block 104 and functional block 104 that sandwich first wiring board 1301 from above and below and the thickness of first wiring board 1301, that is electrically nonconductive, and that can be ignored considerations of electric matter is taken as the second opening. In this case, the electrical connection pitch between functional block 104 and functional block 104 is 4.85 mm, the thickness of first wiring board 1301 is 0.7 mm, and the opening circumference L of this first opening is therefore 17.1 mm (=4.85×2+0.7×2).

The portion determined by the electrical connection pitch between functional block 104 and functional block 104 that sandwich second wiring board 1302 from above and below and the thickness of second wiring board 1302, that is electrically nonconductive, and that can be ignored considerations of electric matter is taken as the third opening. In this case, the electrical connection pitch between functional block 104 and functional block 104 is 4.85 mm and the thickness of second wiring board 1302 is 0.2 mm, and the opening circumference L of this first opening is therefore 11.1 mm (=4.85×2+0.2×2).

The portion determined by the electrical connection pitch between holding block 106 and functional block 104 and the thickness of third wiring board 1303, that is electrically nonconductive, and that can be ignored considerations of electric matter is taken as the fourth opening. In this case, the electrical connection pitch between holding block 106 and functional block 104 is 4.85 mm and the thickness of third wiring board 1303 is 0.2 mm, and the opening circumference L of this fourth opening is therefore 10.1 mm (=4.85×2+0.2×2).

At this time, the maximum value of frequency f that satisfies the relation by which the opening circumferences L of the first, third, and fourth openings are equal to or less than $\lambda/10$ is 3.0 GHz according to the above-described Equation 2. Consequently, despite the existence of the first, third, and fourth openings, electromagnetic interference (EMI) is not exerted upon other devices and electromagnetic susceptibility (EMS) in an electrical connection against noise that intrudes from the outside is high even when a high frequency up to a frequency of 3.0 GHz is applied.

In addition, the maximum value of frequency f that satisfies the relation whereby the opening circumference L of the second opening is equal to or less than $\lambda/10$ is 2.7 GHz according to the above-described Equation 2. Consequently, despite the existence of the second opening, electromagnetic interference (EMI) is not exerted upon other devices and electromagnetic susceptibility (EMS) in an electrical connection against noise that intrudes from the outside is high even when a high frequency of up to 2.7 GHz is applied.

In the circuit board device according to the present embodiment, holding blocks 105 and 106 that take a metal material as their base material are arranged on the outermost surfaces of the circuit board device in directions perpendicular to the front and back surfaces of the wiring boards. The electrical connection of functional blocks 104 and vias that connect terminals formed on the front and back surfaces of first wiring board 1301, second wiring board 1302, third wiring board 1303, and fourth wiring board 1304 within the wiring boards enables complete shielding against electromagnetic waves.

In the circuit board device according to the present embodiment, an example was shown in which a rigid printed wiring board that takes FR4 as its base material was used for first wiring board 1301 and flexible printed wiring boards that take polyimide as their base material were used for second wiring board 1302, third wiring board 1303, and fourth wiring board 1304, but the present invention is not limited to this form. The rigid printed wiring board and flexible printed wiring boards can be freely combined, and although the number of layers of wiring boards was a three-stage stack of four layers, the present invention is not limited to this configuration, and any number of layers may be selected.

In addition, the positioning of wiring boards, positioning of wiring board and holding block, and positioning of each wiring board and functional block 104 is not limited to a method of fitting positioning through-holes formed in each wiring board, functional block 104, and each holding block onto positioning pins 124a and 124b provided in positioning jig 125. Alignment marks can be formed on each wiring board, functional block 104, and each holding block, and these alignment marks can be observed by a CCD camera to realize positioning of the components.

Although the present embodiment was described taking the configuration in the second embodiment as a premise, the present invention is not limited to this form, and the same effects can be obtained if the configuration described in any of the third to sixth embodiments is selected.

Figure 36:
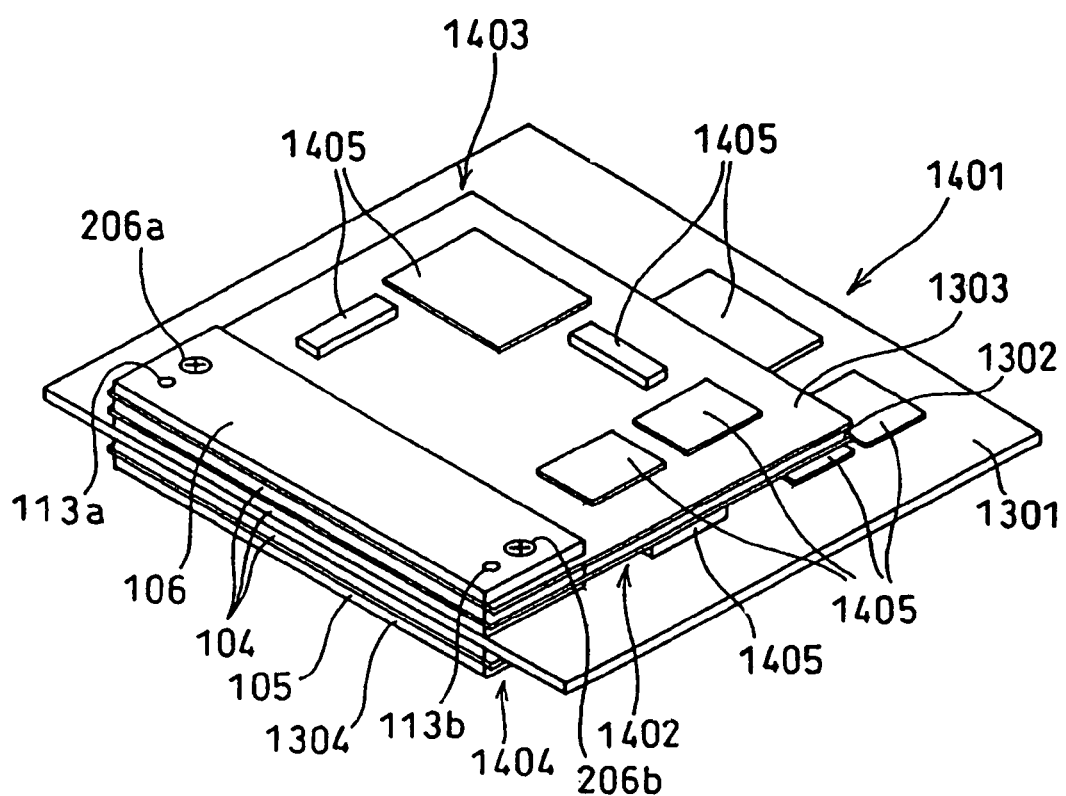
FIG. 36 is a schematic perspective view showing the circuit board module device according to the eighth embodiment.
Figure 37:
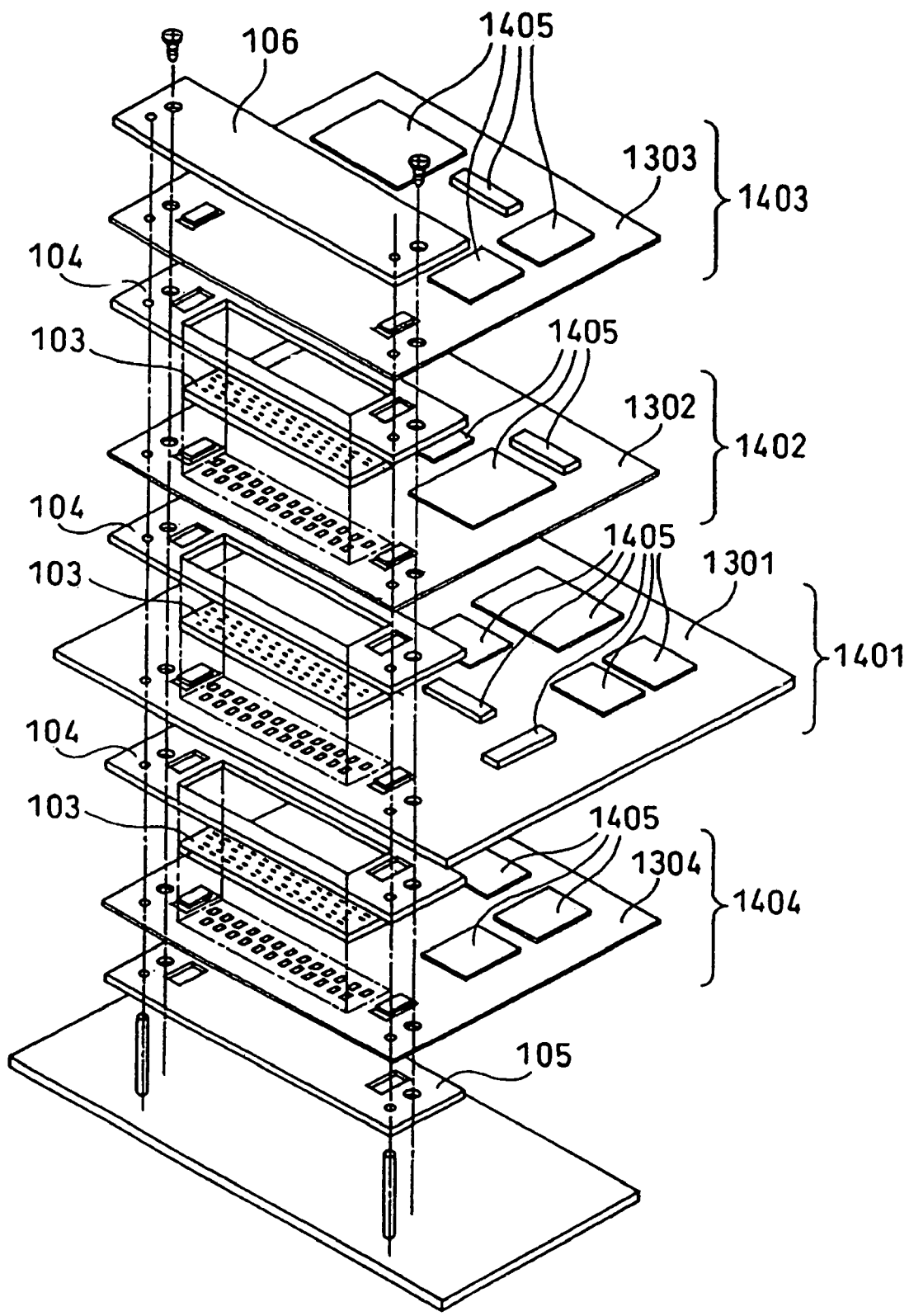
FIG. 37 is an exploded perspective view showing the configuration of the circuit board module device and the wiring board interconnection method according to the eighth embodiment.

Explanation next regards the eighth embodiment of the present invention. FIG. 36 is a schematic perspective view showing the circuit board module device according to the present embodiment, and FIG. 37 is an exploded perspective view showing the configuration and wiring board interconnection method of the circuit board module device according to the present embodiment. In FIG. 36 and FIG. 37, constituent elements that are identical to elements in FIGS. 7 to 35 are given the same reference numbers, and detailed explanation of these elements is omitted.

In the circuit board module device according to the present embodiment, each individual functional module board 1401, 1402, 1403, and 1404, on which at least one package part 1405 such as LSI (Large Scale Integration) is mounted in advance on the surfaces of first wiring board 1301, second wiring board 1302, third wiring board 1303, and fourth wiring board 1304 in the circuit board device described in the above-described seventh embodiment, are stacked with functional blocks 104 in which anisotropic conductive members 103 are inserted interposed between individual functional module boards. These components are then secured by screws 206a and 206b in a state in which pressure is applied that compresses anisotropic conductive members 103 to the thickness of functional blocks 104 and functional blocks 104 as well as holding blocks 105 and 106 are connected to GND, whereby each of these parts acts as the common GND of each individual functional module board.

The circuit board module device according to the present embodiment is of a connection configuration in which anisotropic conductive members 103, which are inserted in through-windows 123 provided in functional blocks 104 that take a metal having high conductivity as their base material, are used as the electrical connection medium between individual functional module boards 1401, 1402, 1403, and 1404 having separate functions by having at least one package part 1405 such as LSI is surface-mounted on each wiring board in advance; whereby these components are clamped, compressed and secured by holding blocks 105 and 106, and in which functional blocks 104 as well as holding blocks 105 and 106 are used as common GND. As a result, the electrical connections of this connection configuration are enclosed in directions parallel to the front and back surfaces of each individual functional module board by functional blocks 104 that take a metal material having high conductivity as their base material and thus can be completely shielded against electromagnetic waves, and electromagnetic interference (EMI) that is exerted upon other devices by unnecessary electromagnetic waves that are typically generated can be suppressed, and the electromagnetic susceptibility (EMS) to noise that intrudes from the outside can be improved in the electrical connections.

In addition, holding blocks 105 and 106 that take a metal material as their base material are arranged on the outermost surfaces of the circuit board module device in directions perpendicular to the front and back surfaces of the individual functional module boards. The electrical connection of functional block 104 and vias that connect terminals formed on the front and back surfaces of each individual functional module board inside the wiring boards enables complete shielding against electromagnetic waves.

Although explanation has been presented in the present embodiment based on the premises of the configuration in the seventh embodiment, the present invention is not limited to this form, and the same effects can be obtained when a configuration described in any of the second to sixth embodiments is selected. According to the present invention, when functional blocks and holding blocks are used as the common GND of a circuit board device, functional blocks that take a metal material as a base material are arranged to enclose electrical connections that connect a plurality of wiring boards by means of anisotropic conductive members, whereby complete shielding against electromagnetic waves is realized in directions parallel to the front and back surfaces of the wiring boards. As a result, the occurrence of electromagnetic interference that is exerted upon other devices by unnecessary electromagnetic waves that are typically generated can be suppressed, and the electromagnetic susceptibility to noise that intrudes from the outside can be improved in the electrical connections. In addition, the arrangement of a pair of holding blocks that take a metal material as their base material on the outermost surfaces of the circuit board device in directions perpendicular to the front and back surfaces of the wiring boards and the electrical connection of terminals that are formed on the front and back surfaces of a plurality of wiring boards and the vias that connect these terminals, functional blocks, and holding blocks enables complete shielding against electromagnetic waves.

When the functional blocks are used as the power-supply wiring of a plurality of wiring boards, the use of functional blocks having an extremely large cross-sectional area as the power-supply lines enables a decrease of the amount of current per unit cross-sectional area. As a result, the generation of heat of the electrical connection can be suppressed and the need to distribute the power-supply line among a plurality of lines to decrease the amount of current per connection terminal can be eliminated. A circuit board device can therefore be realized that allows miniaturization that facilitates a slimmer and more compact electronic apparatus. In addition, mounting package elements on the wiring boards of this circuit board device enables the production of a circuit board module device.

Although the invention of the present application has been described with reference to embodiments, the invention of the present application is not limited to the above-described embodiments. The configuration and details of the invention of the present application is open to various modifications within the scope of the present invention that are easily understood by any person ordinarily skilled in the art.

What is claimed is:

1. A circuit board device comprising:
    a plurality of wiring boards in which terminals are provided on at least a surface facing a surface of another of said plurality of wiring boards;
    an anisotropic conductive member arranged between said plurality of wiring boards, which are facing each other, for connecting electrodes of one wiring board of said plurality of wiring boards to electrodes of another wiring board of said plurality of wirings boards;
    a functional block, composed of a metal material, arranged between said plurality of wiring boards to enclose said anisotropic conductive member; and
    a pair of holding blocks composed of metal material, arranged to sandwich said plurality of wiring boards,
    wherein said plurality of wiring boards, being clamped between said pair of holding blocks, are connected to each other by said anisotropic conductive member, and said terminals provided on each of said plurality of wiring boards, said functional block, and said pair of holding blocks are electrically connected.

2. The circuit board device according to claim 1, wherein said functional block and said pair of holding blocks are connected to a ground (GND) and comprise a common GND wiring of said plurality of wiring boards.

3. The circuit board device according to claim 2, wherein a plurality of said terminals and a plurality of vias are on said plurality of wiring boards.

4. The circuit board device according to claim 2, wherein a conductive material selected from the group composed of
    a conductive paste in which metal particles or metal-plated particles obtained by subjecting resin particles to metal plating are scattered in a resin, tin-lead solder, lead-free solder, ACF (Anisotropic Conductive Film), and ACP (Anisotropic Conductive Paste), is provided on at least a surface of said terminals.

5. The circuit board device according to claim 1, wherein said functional block and said pair of holding blocks are connected to a power supply and comprise a power-supply wiring of said plurality of wiring boards.

6. The circuit board device according to claim 5, wherein a plurality of said terminals and a plurality of vias are on said plurality of wiring boards.

7. The circuit board device according to claim 5, wherein a conductive material selected from the group composed of:
   a conductive paste in which metal particles or metal-plated particles obtained by subjecting resin particles to metal plating are scattered in a resin, tin-lead solder, lead-free solder, ACF (Anisotropic Conductive Film), and ACP (Anisotropic Conductive Paste), is provided on at least a surface of said terminals.

8. The circuit board device according to claim 1, wherein said functional block is divided between one or a plurality of first blocks and one or a plurality of second blocks, said first block being connected to a ground (GND) and serving as a common GND wiring of said plurality of wiring boards, and said second block being connected to a power supply and serving as a power-supply wiring of said plurality of wiring boards.

9. The circuit board device according to claim 8, wherein said first and second blocks of said the functional block are isolated and separated by an insulating resin.

10. The circuit board device according to claim 9, wherein a plurality of said terminals and a plurality of vias are on said plurality of wiring boards.

11. The circuit board device according to claim 8, wherein a plurality of said terminals and a plurality of vias are on said plurality of wiring boards.

12. The circuit board device according to claim 1, wherein said functional block is divided between one or a plurality of first blocks and one or a plurality of second blocks, said first block being connected to a ground (GND) and serving as an analog-system common GND wiring of said plurality of wiring boards, and said second block similarly being connected to GND and serving as a digital-system common GND wiring of said plurality of wiring boards.

13. The circuit board device according to claim 12, wherein said first and second blocks of said the functional block are isolated and separated by an insulating resin.

14. The circuit board device according to claim 12, wherein a plurality of said terminals and a plurality of vias are on said plurality of wiring boards.

15. The circuit board device according to claim 1, wherein a plurality of said terminals are provided.

16. The circuit board device according to claim 1, wherein a conductive material selected from the group composed of:
   a conductive paste in which metal particles or metal-plated particles obtained by subjecting resin particles to metal plating are scattered in a resin, tin-lead solder, lead-free solder, ACF (Anisotropic Conductive Film), and ACP (Anisotropic Conductive Paste), is provided on at least a surface of said terminals.

17. The circuit board device according to claim 1, wherein said plurality of wiring boards are selected from a group composed of:
   multilayered flexible printed wiring boards, multilayered rigid printed wiring boards, double-sided flexible printed wiring boards, double-sided rigid printed wiring boards, single-sided flexible printed wiring boards, and single-sided rigid printed wiring boards.

18. The circuit board device according claim 1, wherein the anisotropic conductive member comprises:
   a conductive material comprising metal fine lines selected from the group composed of:
      gold lines, copper lines, brass lines, phosphor bronze lines, nickel lines, and stainless steel lines, or conductive particles selected from the group composed of:
         metal particles, gold-plated particles, silver-plated particles, and copper-plated particles; and
   an insulating portion comprising an insulating elastic resin material.

19. A circuit board module device wherein at least one package part is mounted on the wiring board of the circuit board device according to claim 1.

20. A wiring board interconnection method comprising:
   arranging on a first holding block, composed of a metal material, a first wiring board on which terminals are provided on at least a surface facing a surface of a second wiring board;
   arranging an anisotropic conductive member and a functional block, composed of a metal material, on said first wiring board;
   arranging on said anisotropic conductive member and said functional block said second wiring board on which terminals are provided on at least a surface facing a surface of said first wiring board;
   similarly arranging any number of wiring boards, which are facing each other, with anisotropic conductive members and functional blocks interposed;
   arranging a second holding block on the uppermost wiring board; and
   clamping the plurality of wiring boards, anisotropic conductive members, and functional blocks between said first holding block and said second holding block,
   whereby electrodes of said plurality of wiring boards are connected to each other, and said terminals provided on each of said wiring boards, said functional blocks, and said holding blocks are electrically connected.

* * * * *